United States Patent
Aoki

(10) Patent No.: US 10,725,389 B2
(45) Date of Patent: Jul. 28, 2020

(54) EXPOSURE APPARATUS, MOVABLE BODY APPARATUS, FLAT-PANEL DISPLAY MANUFACTURING METHOD, AND DEVICE MANUFACTURING METHOD

(71) Applicant: NIKON CORPORATION, Tokyo (JP)

(72) Inventor: Yasuo Aoki, Zushi (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/540,629

(22) Filed: Aug. 14, 2019

(65) Prior Publication Data

US 2019/0369507 A1    Dec. 5, 2019

Related U.S. Application Data

(60) Division of application No. 15/887,650, filed on Feb. 2, 2018, now Pat. No. 10,409,176, which is a
(Continued)

(30) Foreign Application Priority Data

Sep. 7, 2010    (JP) ................. 2010-199854

(51) Int. Cl.
*G03F 7/20*    (2006.01)
*H02K 41/03*    (2006.01)
(Continued)

(52) U.S. Cl.
CPC ........ *G03F 7/70775* (2013.01); *F16C 29/008* (2013.01); *F16C 39/04* (2013.01);
(Continued)

(58) Field of Classification Search
CPC ............. G03F 7/70716; G03F 7/70775; G03F 7/70816
(Continued)

(56) References Cited

U.S. PATENT DOCUMENTS 6,445,440 B1    9/2002    Bisschops et al.
6,552,775 B1    4/2003    Yanagihara et al.
(Continued)

FOREIGN PATENT DOCUMENTS

EP    1 052 550 A2    11/2000
EP    1 811 526 A1    7/2007
(Continued)

OTHER PUBLICATIONS

Nov. 7, 2014 Notice of Allowance issued in U.S. Appl. No. 13/221,568.
(Continued)

*Primary Examiner* — Hung Nguyen
(74) *Attorney, Agent, or Firm* — Oliff PLC

(57)    ABSTRACT

In a substrate stage, when a Y coarse movement stage moves in the Y-axis direction, an X coarse movement stage, a weight cancellation device, and an X guide move integrally in the Y-axis direction with the Y coarse movement stage, and when the X coarse movement stage moves in the X-axis direction on the Y coarse movement stage, the weight cancellation device move on the X guide in the X-axis direction integrally with the X coarse movement stage. Because the X guide is provided extending in the X-axis direction while covering the movement range of the weight cancellation device in the X-axis direction, the weight cancellation device is constantly supported by the X guide, regardless of its position. Accordingly, a substrate can be guided along the XY plane with good accuracy.

19 Claims, 28 Drawing Sheets

Related U.S. Application Data continuation of application No. 14/981,630, filed on Dec. 28, 2015, now Pat. No. 9,921,496, which is a continuation of application No. 14/617,352, filed on Feb. 9, 2015, now Pat. No. 9,250,543, which is a division of application No. 13/221,568, filed on Aug. 30, 2011, now Pat. No. 8,988,655.

(60) Provisional application No. 61/380,394, filed on Sep. 7, 2010, provisional application No. 61/380,397, filed on Sep. 7, 2010.

(51) Int. Cl.
*F16C 39/04* (2006.01)
*F16C 39/06* (2006.01)
*F16C 29/00* (2006.01)
*H02K 7/09* (2006.01)
*H02K 16/00* (2006.01)

(52) U.S. Cl.
CPC .............. *F16C 39/06* (2013.01); *G03F 7/709* (2013.01); *G03F 7/70716* (2013.01); *G03F 7/70816* (2013.01); *H02K 41/031* (2013.01); *H02K 7/09* (2013.01); *H02K 16/00* (2013.01); *H02K 2201/18* (2013.01)

(58) Field of Classification Search
USPC ................................................ 355/52, 72–76
See application file for complete search history.

(56) References Cited

U.S. PATENT DOCUMENTS

| | | | |
|---|---|---|---|
| 6,778,257 B2 | 8/2004 | Bleeker et al. | |
| 7,607,647 B2 | 10/2009 | Zhao et al. | |
| 8,988,655 B2* | 3/2015 | Aoki | G03F 7/70716 355/72 |
| 9,250,543 B2 | 2/2016 | Aoki | |
| 2003/0098964 A1 | 5/2003 | Lee et al. | |
| 2003/0098965 A1 | 5/2003 | Binnard et al. | |
| 2006/0284434 A1 | 12/2006 | Yang | |
| 2008/0013060 A1 | 1/2008 | Ichinose et al. | |
| 2008/0229811 A1 | 9/2008 | Zhao et al. | |
| 2010/0018950 A1 | 1/2010 | Aoki et al. | |
| 2010/0266961 A1 | 10/2010 | Kawamura et al. | |
| 2012/0056105 A1 | 3/2012 | Aoki | |
| 2012/0064460 A1 | 3/2012 | Aoki | |

FOREIGN PATENT DOCUMENTS

| | | |
|---|---|---|
| JP | H10-22203 A | 1/1998 |
| JP | 2003-303753 A | 10/2003 |
| JP | 2006-086442 A | 3/2006 |
| TW | I233535 B | 6/2005 |

OTHER PUBLICATIONS

Feb. 3, 2012 International Search Report and Written Opinion issued in International Application No. PCT/JP2011/070666.
Feb. 3, 2012 International Search Report and Written Opinion issued in International Application No. PCT/JP2011/070667.
Sep. 6, 2012 Office Action issued in U.S. Appl. No. 13/221,420.
Oct. 10, 2014 Office Action issued in Chinese Patent Application No. 201180043135.0.
Aug. 15, 2014 Office Action issued in U.S. Appl. No. 13/221,568.
U.S. Appl. No. 13/221,568, filed Aug. 30, 2011 in the name of AOKI.
May 28, 2015 Office Action issued in Japanese Application No. 2013-510159.
Sep. 25, 2015 Notice of Allowance issued in U.S. Appl. No. 14/617,352.
Feb. 7, 2012 International Search Report and Written Opinion issued in International Application No. PCT/JP2011/070664.
Aug. 5, 2016 Office Action Issued in U.S. Appl. No. 14/981,630.
Apr. 18, 2017 Office Action issued in U.S. Appl. No. 14/981,630.
Nov. 2, 2017 Notice of Allowance issued in U.S. Appl. No. 14/981,630.
Sep. 20, 2018 Office Action issued in U.S. Appl. No. 15/887,650.
Apr. 26, 2019 Notice of Allowance issued in U.S. Appl. No. 15/887,650.

* cited by examiner

EXPOSURE APPARATUS, MOVABLE BODY APPARATUS, FLAT-PANEL DISPLAY MANUFACTURING METHOD, AND DEVICE MANUFACTURING METHOD

CROSS-REFERENCE TO RELATED APPLICATIONS

This is a divisional of U.S. Ser. No. 15/887,650 filed on Feb. 2, 2018 (now U.S. Pat. No. 10,409,176 issued Sep. 10, 2019), which is a Continuation Application of application Ser. No. 14/981,630 filed Dec. 28, 2015 (now U.S. Pat. No. 9,921,496 issued Mar. 20, 2018), which is a continuation of application Ser. No. 14/617,352 filed Feb. 9, 2015 (now U.S. Pat. No. 9,250,543 issued Feb. 2, 2016) which is a division of Non-Provisional application Ser. No. 13/221,568 filed Aug. 30, 2011 (now U.S. Pat. No. 8,988,655 issued Mar. 24, 2015) which claims the benefit of Provisional Application No. 61/380,394 filed Sep. 7, 2010 and Provisional Application No. 61/380,397 filed Sep. 7, 2010, and which claims the benefit of priority from Japanese Patent Application No. 2010-199854 filed Sep. 7, 2010, the disclosures of which are hereby incorporated herein by reference in their entirety.

BACKGROUND OF THE INVENTION

Field of the Invention

The present invention relates to exposure apparatuses, movable body apparatuses, flat-panel display manufacturing methods, and device manufacturing methods, and more particularly, to an exposure apparatus used in a lithography process when semiconductor devices, liquid crystal display devices and the like are produced, a movable body apparatus that is suitable as a device which moves holding an object subject to exposure of the exposure apparatus, a flat-panel display manufacturing method which uses the exposure apparatus, and a device manufacturing method which uses the exposure apparatus.

Description of the Background Art

Conventionally, in a lithography process for manufacturing electron devices (microdevices) such as liquid crystal display devices and semiconductor devices (such as integrated circuits), apparatuses are used such as an exposure apparatus based on a step-and-scan method (a so-called scanning stepper (also referred to as a scanner)) which while synchronously moving a mask or a reticle (hereinafter generally referred to as a "mask") and a glass plate or a wafer (hereinafter generally referred to as a "substrate") in a predetermined scanning direction, transfers a pattern formed on a mask onto a substrate using an energy beam.

In this type of exposure apparatus, an apparatus is known that has a stacking type (gantry type) stage device which has a Y coarse movement stage movable in the cross-scan direction (a direction orthogonal to the scanning direction) installed on an X coarse movement stage movable in long strokes in the scanning direction, and as the stage device, for example, a stage device is known that has a configuration in which a weight cancelling device moves along a horizontal surface on a surface plate formed of a stone material (e.g., refer to U.S. Patent Application Publication No. 2010/0018950).

However, with the exposure apparatus according to U.S. Patent Application Publication No. 2010/0018950 described above, because the weight cancelling device moves within a wide range corresponding to the step-and-scan movement, the degree of flatness of the upper surface (movement guide plane of the weight cancelling device) of the surface plate has to be finished highly in a wide range. However, in recent years, substrates subject to exposure of exposure apparatuses tend to increase in size, and with it, the size of surface plates tend to increase, which may decrease transportability of the exposure apparatus, workability at the time of assembly and the like, in addition to an increase in cost.

However, in the exposure apparatus according to U.S. Patent Application Publication No. 2010/0018950 described above, a wide space was necessary in the height direction in order to put actuators and the like to finely drive the XY two-axis stage and the fine movement stage in between the surface plate (stage base) and the fine movement stage. Therefore, the weight cancellation device had to be large (tall), and a large drive force was necessary to drive the weight cancellation device along the horizontal plane.

Conventionally, when driving a large mass substrate stage, a cored linear motor which generates a large drive force (thrust) was employed. In this cored linear motor, a magnetic attractive force (attraction) which is several times the thrust is generated between a magnet unit included in a mover (or a stator) and a coil unit that has a core (an iron core) included in a stator (or a mover). Specifically, a suction force of 10000 to 20000N is generated with respect to a thrust of 4000N.

Accordingly, in the case of a conventional substrate stage device structured in the manner described above, a large weight load (and an inertia force which occurs with the movement of an X coarse movement stage) such as of a substrate, a Y coarse movement stage, the X coarse movement stage and the like acts on a pair of single axis drive units placed between X coarse movement stage and a stage base, as well as a large attraction generated especially from the cored linear motor configuring the pair of single axis drive units described above. Therefore, the single axis drive unit, especially the linear motor and a guide device that configure a part of the single axis drive unit need to have a large load capacity (capacity), and a movable member and a fixed member also have to be configured strongly to be able to stand the attraction from the linear motor.

Meanwhile, because a large frictional resistance acts between a linear guide (rail) and a slider that configure a guide device (a single axis guide), which increases drive resistance, a linear motor which generates a larger drive force will be needed. Further, additional problems such as an increase in size of the substrate stage device, generation of frictional heat in the guide device and generation of Joule's heat in the linear motor, mechanical damage by adsorbates will become evident.

SUMMARY OF THE INVENTION

According to a first aspect of the present invention, there is provided a first exposure apparatus of a scanning type which moves an object subject to exposure in a first direction parallel to a horizontal plane with a predetermined first stroke with respect to an energy beam for exposure at the time of exposure processing, the apparatus comprising: a first movable body which is movable by the predetermined first stroke at least in the first direction; a second movable body which guides movement of the first movable body in the first direction and is movable by a second stroke along with the first movable body in a second direction orthogonal to the first direction within the horizontal plane; an object holding member which holds the object and is movable in a direction at least parallel to the horizontal plane with the first movable body; a weight cancellation device which supports the object holding member from below and cancels weight of the object holding member; and a support member which extends in the first direction, and supports the weight cancellation device from below, and also is movable in the second direction by the second stroke in a state supporting the weight cancellation device from below.

According to this apparatus, at the time of exposure processing to an object, an object holding member holding the object with the first movable body is driven in a direction parallel to the first direction (scanning direction). Further, the object moves in the second direction, by the second movable body being driven in the second direction orthogonal to the first direction. Accordingly, the object can be moved two-dimensionally along a plane parallel to a horizontal plane. Now, in order to move the object in the first direction, only the first movable body (and the object holding member) has to be driven, therefore, mass of the movable body (only the first movable body, the object holding member, and the weight cancellation device) which is driven at the time of scanning exposure is small when compared to the case when another movable body that moves in the second direction is mounted on the movable body that moves in the first direction. Accordingly, the size of actuators used to move an object can be reduced. Further, because the support member supporting the weight cancellation device from below consists of a member extending in the first direction, and is also movable in the second direction in a state supporting the weight cancellation device from below, the weight cancellation devices is constantly supported from below by the support member, regardless of its position within the horizontal plane. Accordingly, the weight and size of the entire device can be reduced when compared to the case when a large member having a guide surface large enough to cover the movement range of the weight cancellation device is provided.

According to a second aspect of the present invention, there is provided a movable body apparatus, comprising: a movable body which moves at least in a first direction parallel to a first axis within a plane parallel to a horizontal plane; a base which supports the movable body; and a drive device which includes a first mover and a second mover provided in the movable body in a first predetermined direction and a second predetermined direction intersecting the first predetermined direction, and a first stator and a second stator facing the first mover and the second mover on the base each provided extending in the first direction, and drives the movable body in the first direction with respect to the base using a drive force in the first direction that is generated between the first mover and the first stator, and the second mover and the second stator, respectively, wherein at least one of the first predetermined direction and the second predetermined direction is a direction intersecting a second axis orthogonal to the first axis within the horizontal plane and a third axis orthogonal to the horizontal plane, and at least at the time when the movable body is driven in the first direction, forces in the first predetermined direction and the second predetermined direction act between the first mover and the first stator, and the second mover and the second stator, respectively.

In this case, the force in the first predetermined direction (opposing direction) acting between the first mover and the first stator, and the force in the second predetermined direction (opposing direction) acting between the second mover and the second stator, is either the suction force or a repulsive force in the opposing direction, and for example, a magnetic force can be representatively given, however, the force is not limited to this, and can also be a vacuum suction force, pressure by the static pressure of a gas and the like.

According to this apparatus, the load including the self-weight of the movable body applied to the base is reduced utilizing the force in the first predetermined direction acting between the first mover and the first stator and the force in the second predetermined direction acting between the second mover and the second stator at the time when the movable body is driven in the first direction, and the movable body can be driven with high precision without hindering drive performance.

According to a third aspect of the present invention, there is provided a second exposure apparatus that irradiates an energy beam and forms a pattern on an object, the apparatus comprising: the movable body apparatus of the present invention in which the object is held on the another movable body.

According to this apparatus, because the movable body holding the object can be driven with high accuracy, this allows an exposure with high precision to the object.

According to a fourth aspect of the present invention, there is provided a third exposure apparatus, the apparatus comprising: a movable body which holds an object and moves at least in a first direction parallel to a first axis within a plane parallel to a horizontal plane; a base which supports the movable body; a drive device which includes a first mover and a second mover provided in the movable body in a first predetermined direction and a second predetermined direction intersecting the first predetermined direction, and a first stator and a second stator facing the first mover and the second mover on the base provided extending in the first direction, and drives the movable body in the first direction with respect to the base, and on the drive, utilizes a force in the first predetermined direction and a force in the second predetermined direction acting between the first mover and the first stator, and the second mover and the second stator, respectively, as a levitation force of the movable body; and a pattern generation device which irradiates an energy beam on the object and generates a pattern on the object.

According to this apparatus, because the drive device utilizes the force in the first predetermined direction acting between the first mover and the first stator and the force in the second predetermined direction acting between the second mover and the second stator at the time when the movable body is driven as a levitation force of the movable body, the load including the self-weight of the movable body applied to the base is reduced, and the movable body can be driven with high precision without hindering drive performance.

According to a fifth aspect of the present invention, there is provided a flat-panel display manufacturing method, comprising: exposing the substrate using one of the first to third exposure apparatuses of the present invention; and developing the substrate that has been exposed.

According to a sixth aspect of the present invention, there is provided a device manufacturing method, including exposing the object using one of the first to third exposure apparatuses of the present invention; and developing the object that has been exposed.

BRIEF DESCRIPTION OF THE DRAWINGS

In the accompanying drawings.

DESCRIPTION OF THE EMBODIMENTS

First Embodiment

A first embodiment will be described below, with reference to FIGS. 1 to 7.

Figure 1:
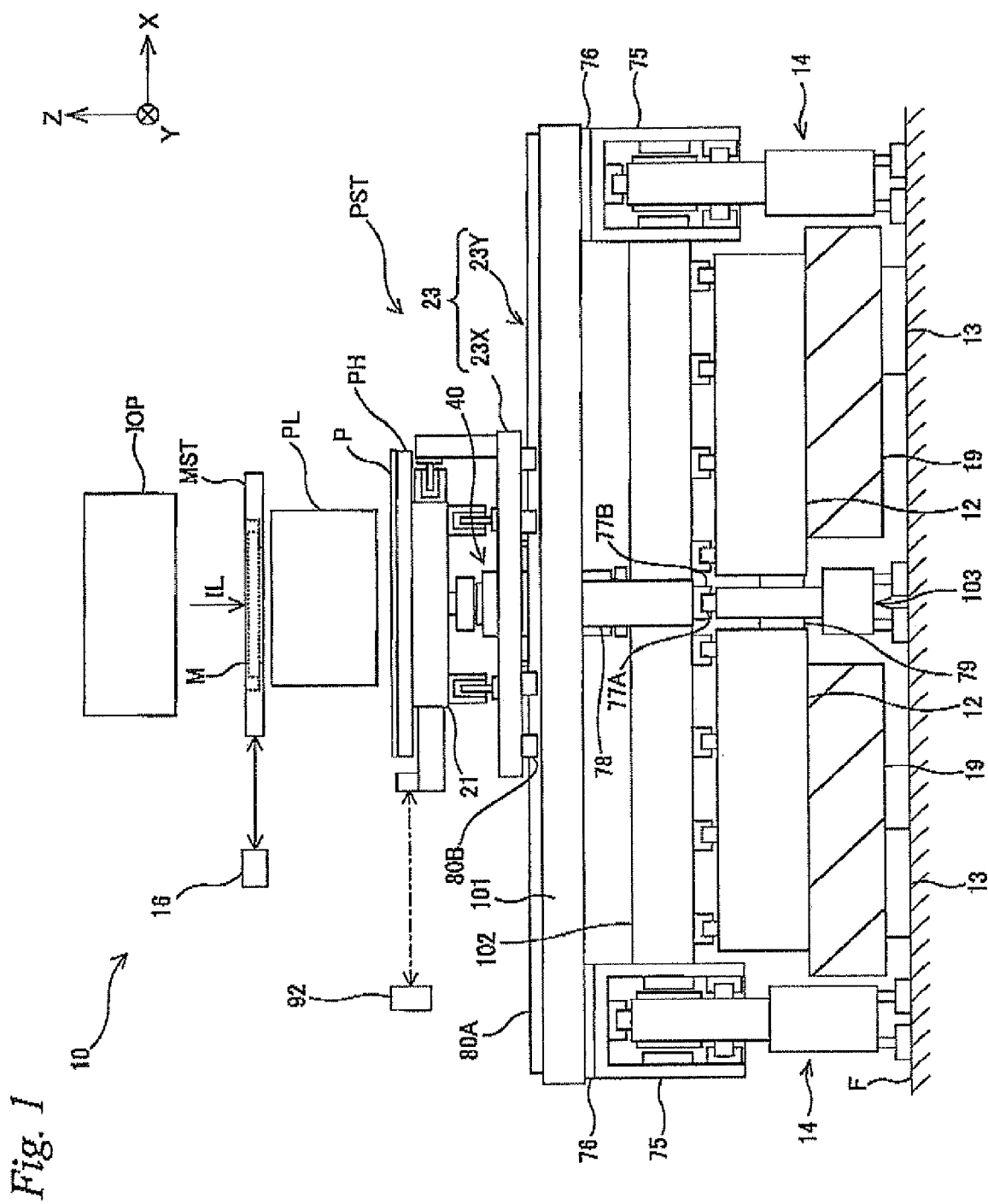
FIG. 1 is a view that schematically shows a configuration of an exposure apparatus related to a first embodiment.

FIG. 1 schematically shows a configuration of an exposure apparatus 10 related to the first embodiment. Exposure apparatus 10 is a projection exposure apparatus by a step-and-scan method, or a so-called scanner in which a rectangular glass substrate P (hereinafter, simply referred to as a substrate P) that is used in a liquid crystal display device (flat panel display) serves as an exposure subject.

As shown in FIG. 1, exposure apparatus 10 is equipped with an illumination system IOP, a mask stage MST holding a mask M, a projection optical system PL, a pair of substrate stage mountings 19, a substrate stage PST holding a substrate P movable along a horizontal plane, and a control system and the like thereof. In the description below, the explanation is given assuming that a direction within a horizontal plane in which mask M and substrate P are scanned relative to projection optical system PL, respectively, during exposure is an X-axis direction, a direction orthogonal to the X-axis direction within a horizontal plane is a Y-axis direction, and a direction orthogonal to the X-axis and Y-axis directions is a Z-axis direction, and rotational (tilt) directions around the X-axis, Y-axis and Z-axis are θx, θy and θz directions, respectively.

Illumination system IOP is configured similar to the illumination system that is disclosed in, for example, U.S. Pat. No. 6,552,775 and the like.

More specifically, illumination system IOP has a plurality of, e.g., five, illumination systems which illuminate a plurality of, e.g., five, illumination areas that are placed in a zigzag shape on mask M, irradiates mask M with a light emitted from a light source that is not illustrated (e.g. a mercury lamp), as an illumination light for exposure (illumination light) IL, via a reflection mirror, a dichroic mirror, a shutter, a wavelength selecting filter, various types of lenses and the like, which are not illustrated. As illumination light IL, for example, a light such as an i-line (with a wavelength of 365 nm), a g-line (with a wavelength of 436 nm) or an h-line (with a wavelength of 405 nm) (or a synthetic light of the i-line, the g-line and the h-line described above) is used. Further, the wavelength of illumination light IL can be appropriately switched by the wavelength selecting filter, for example, according to the required resolution.

On mask stage MST, mask M having a pattern surface (the lower surface in FIG. 1) on which a circuit pattern and the like are formed is fixed by, for example, vacuum suction. Mask stage MST is mounted on a guide member which is not illustrated in a non-contact state, and is driven, for example, in predetermined strokes in a scanning direction (the X-axis direction) by a mask stage drive system MSD (not illustrated in FIG. 1, refer to FIG. 7) including a linear motor, as well as being finely driven appropriately in the Y-axis direction and the θz direction.

Positional information of mask stage MST within the XY plane is constantly measured by a laser interferometer (hereinafter referred to as a "mask interferometer") 16, which projects a laser beam (measurement beam) on a reflection surface arranged (or formed) on mask M, at a resolution of, for example, around 0.5 to 1 nm. The measurement results are supplied to main controller 50 (refer to FIG. 7).

Main controller 50 drives and controls mask stage MST via mask stage drive system MSD (not illustrated in FIG. 1, refer to FIG. 4), based on the measurement results obtained by mask interferometer 16. Incidentally, instead of mask interferometer 16, or along with mask interferometer 16, an encoder (or an encoder system which is configured of a plurality of encoders) can be used.

Projection optical system PL is placed below mask stage MST in FIG. 1. Projection optical system PL has a configuration similar to the projection optical system disclosed in, for example, U.S. Pat. No. 6,552,775. More specifically, projection optical system PL includes a plurality of, e.g., five, projection optical systems (multi-lens projection optical systems) whose projection areas of a pattern image of mask M are placed in a zigzag shape that corresponding to the plurality of illumination areas, and functions equivalently to a projection optical system that has a single image field with a rectangular shape whose longitudinal direction is in the Y-axis direction. In the embodiment, as each of the plurality of projection optical systems, for example, a both-side telecentric equal-magnification system that forms an erected normal image is used, configured of a two-stage in mirror lens optical system which is equipped with two sets each of a prism placed along an optic axis, a group of optical elements (a lens group), and a reflection mirror.

Therefore, when an illumination area on mask M is illuminated with illumination light IL from illumination system IOP, by illumination light IL that has passed through mask M whose pattern surface is placed substantially coincident with the first plane (object plane) of projection optical system PL, a projected image (partial erected image) of a circuit pattern of mask M within the illumination area is formed on an irradiation area (exposure area) of illumination light IL, which is conjugate to the illumination area, on substrate P which is placed on the second plane (image plane) side of projection optical system PL and whose surface is coated with a resist (sensitive agent), via projection optical system PL. Then, by moving mask M relative to the illumination area (illumination light IL) in the scanning direction (X-axis direction) and also moving substrate P relative to an exposure area (illumination light IL) in the scanning direction (X-axis direction) by a synchronous drive of mask stage MST and a fine movement stage 21 whose configuration will be described later on that configures a part of substrate stage PST, scanning exposure of one shot area (divided area) on substrate P is performed, and a pattern of mask M (mask pattern) is transferred onto the shot area. More specifically, in the embodiment, a pattern of mask M is generated on substrate P by illumination system IOP and projection optical system PL, and the pattern is formed on substrate P by exposure of a sensitive layer (resist layer) on substrate P with illumination light IL.

The pair of substrate stage mountings 19 each consist of a member which extends in the Y-axis direction (refer to FIG. 5), and are supported from below by vibration isolators 13 placed on floor (floor surface) F on both ends in the longitudinal direction. The pair of substrate stage mountings 19 are placed at a predetermined distance parallel to the X-axis direction. The pair of substrate stage mountings 19 configure the main section (body) of exposure apparatus 10, and projection optical system PL, mask stage MST and the like are installed in the main section.

Substrate stage PST, as shown in FIG. 1, is equipped with a pair of beds 12, a pair of base frames 14, a coarse movement stage 23, a fine movement stage 21, a weight cancellation device 40, an X guide 102 which supports weight cancellation device 40 from below and the like.

The pair of beds 12 each consist of a rectangular box shaped member (a rectangular parallelepiped member) whose longitudinal direction is in the Y-axis direction in a planar view (when viewed from the +Z side). The pair of beds 12 are placed at a predetermined distance parallel to the X-axis direction. As shown in FIG. 1, bed 12 on the +X side is mounted on substrate stage mounting 19 on the +X side, and bed 12 on the −X side is mounted on substrate stage mounting 19 on the −X side. The position (hereinafter referred to as a Z position) in the Z-axis direction of the upper surface of the pair of beds 12, respectively, is adjusted to be substantially the same.

Figure 2:
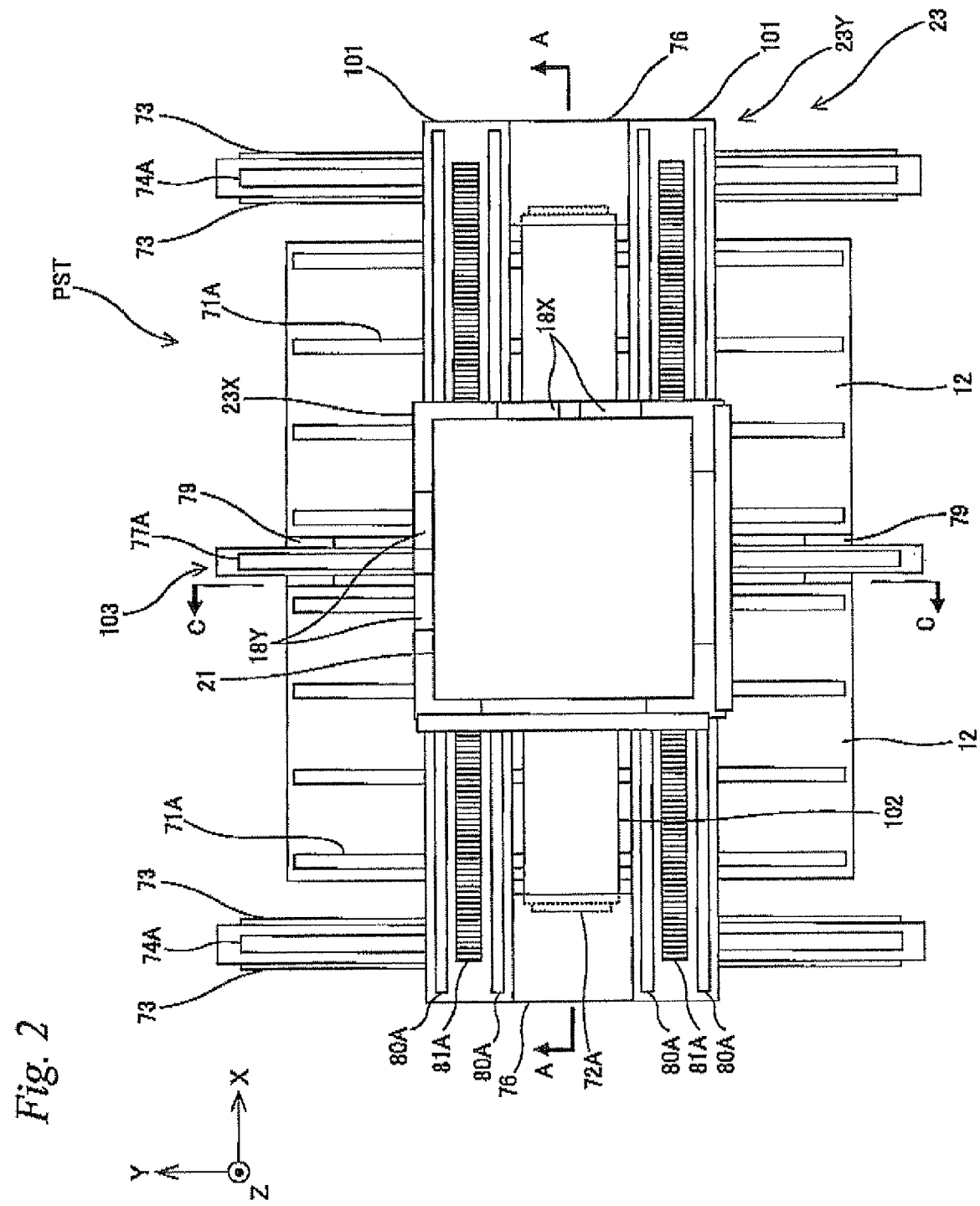
FIG. 2 is a planar view of a substrate stage which the exposure apparatus in FIG. 1 has.
Figure 3A:
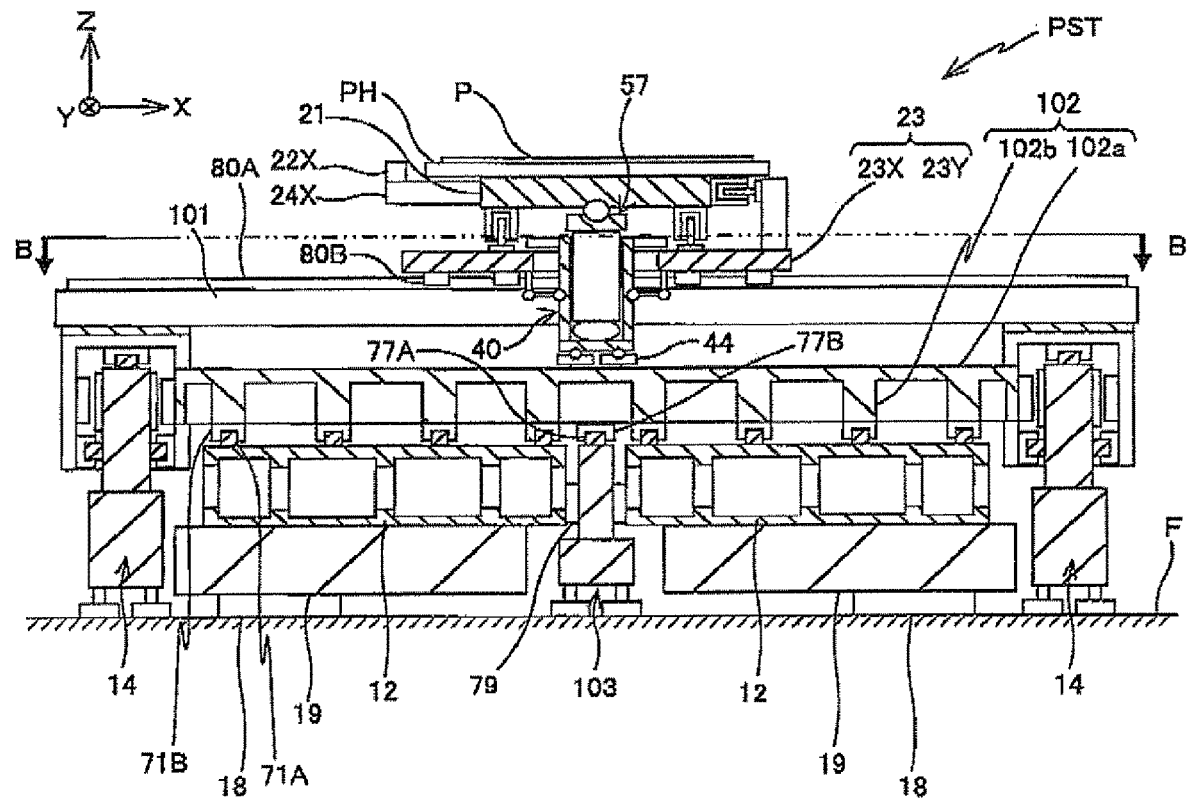
FIG. 3A is a side view (a sectional view of line A-A in FIG. 2) of the substrate stage in FIG. 2 when viewed from the −Y direction.

The vicinity of both ends in the longitudinal direction of the pair of beds 12 are mechanically connected by two interlinking members 79, as it can be seen from FIGS. 1 and 2. As shown in FIG. 3A, the pair of beds 12 each consist a member which is hollow, and in between the upper surface section and the lower surface section of bed 12, a rib that consists of a plate shaped member parallel to the YZ plane is provided in plurals in the X-axis direction at a predetermined distance, so as to secure rigidity and strength. Further, although it is not illustrated, in between the upper surface section and the lower surface section of bed 12, a rib that consists of a plate shaped member parallel to the XZ plane is provided in plurals also in the Y-axis direction at a predetermined distance. In the center of each of the plurality of ribs and the side surface of bed 12, a circular hole is formed (refer to FIG. 5) for reducing weight and molding. Incidentally, in the case, for example, when a sufficient exposure accuracy can be secured without interlinking member 79 being provided, interlinking member 79 does not have to be provided.

On each upper surface of the pair of beds 12, as shown in FIG. 2, a plurality of Y linear guides 71A (e. g. four per one bed in the embodiment) which are elements of a mechanical single axis guide are fixed parallel to each other at a predetermined distance in the X-axis direction.

As shown in FIGS. 1 and 3A, of the pair of base frames 14, one frame is placed at the +X side of bed 12 which is at the +X side, and the other is placed at the −X side of bed 12 which is at the −X side. Since the pair of base frames 14 have the same structure, base frame 14 at the −X side will be described below. As shown in FIG. 3C, base frame 14 includes a main section 14a consisting of a plate shape member having one surface and the other surface parallel to the YZ plane and extending in the Y axis direction, and a plurality of leg sections 14b (not illustrated in FIGS. 2 and 4) that support main section 14a from below. The length of main section 14a (dimension in the longitudinal direction (the Y-axis direction)) is set longer than the length of each of the pair of beds 12 in the Y-axis direction. As leg sections 14b, for example, three leg sections are provided, in the Y-axis direction at a predetermined distance. At the lower end section of leg sections 14b, a plurality of adjusters 14c are installed so that the Z position of main section 14a can be adjusted.

On both of the side surfaces of main section 14a, a Y stator 73 which is an element of the linear motor is fixed, respectively. Y stator 73 has a magnet unit including a plurality of permanent magnets arranged at a predetermined distance in the Y-axis direction. Further, to the upper surface and both of the side surfaces (the lower part of Y stator 73 described above) of main section 14a, a Y linear guide 74A, which is an element of a mechanical single axis guide, is fixed, respectively.

Referring back to FIG. 1, coarse movement stage 23 includes a Y coarse movement stage 23Y and an X coarse movement stage 23X, which is mounted on Y coarse movement stage 23Y. Coarse movement stage 23 is located above (on the +Z side of) the pair of beds 12.

As shown in FIG. 2, Y coarse movement stage 23Y has a pair of X beams 101. The pair of X beams 101 are each made from a member extending in the X-axis direction whose YZ section is a rectangular shape, and are placed parallel to each other at a predetermined distance in the Y-axis direction. Incidentally, the shape in the YZ section of each X beam 101, for example, can be an I shape because rigidity in the Y-axis direction is not required in comparison with the rigidity in the Z-axis direction (direction of gravitational force).

Figure 6:
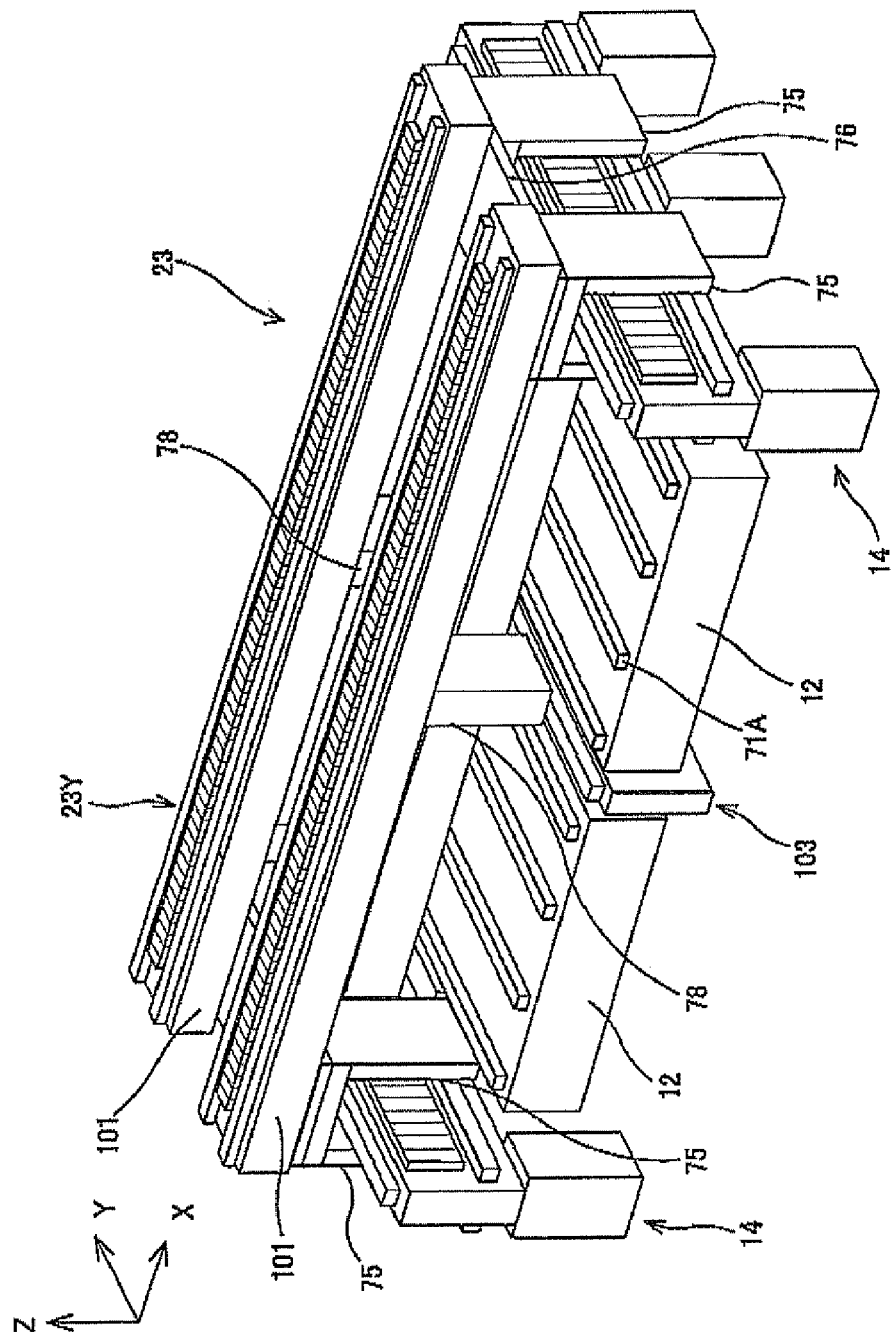
FIG. 6 is a perspective view of the substrate stage in FIG. 2 which is partially omitted.

To the lower surface of each of the pair of X beams 101 in the vicinity of both ends in the longitudinal direction, As shown in FIG. 6, a member referred to as a Y carriage 75 is fixed, via a plate 76. That is to say, to the lower surface of Y coarse movement stage 23Y, for example, a total of four Y carriages 75 are attached. Plate 76 consists of a plate shaped member extending in the Y-axis direction that is parallel to the XY plane, and mechanically connects the pair of X beams 101 to each other. Since, for example, the total of four Y carriages 75 each have the same structure, in the description below, one Y carriage 75 corresponding to base frame 14 on the −X side will be described.

Y carriage 75, as shown in FIG. 3C, consists of a member whose XZ section is an inverted U-shape, and main section 14a of base frame 14 is inserted in between the pair of opposing surfaces. To each of the pair of opposing surfaces of Y carriage 72, each of a pair of Y movers 72 are fixed facing each of a pair of Y stators 73 via a predetermined clearance (space/gap). Y mover 72 includes a coil unit which is not illustrated, and configures a Y linear motor YDM (refer to FIG. 7) that drives Y coarse movement stage 23Y (refer to FIG. 1) in predetermined strokes along with Y stator 73 in the Y-axis direction. In this embodiment, for example, since a total of four Y carriages 75 are provided as described above, Y coarse movement stage 23Y is driven in the Y-axis direction by a total of eight Y linear motors YDM.

To each of the pair of opposing surfaces and the ceiling surface of Y carriage 75, a slider 74B is fixed which includes a rolling body (e.g., a plurality of balls) and slidably engages with Y linear guide 74A. Incidentally, to each of the pair of opposing surfaces and the ceiling surface of Y carriage 75, for example, two each of sliders 74B are attached (refer to FIG. 5) at a predetermined distance in a direction in the depth of the page surface (the Y-axis direction), although the sliders beneath are hidden in the direction in the depth of the page surface in FIG. 3C. Y coarse movement stage 23Y (refer to FIG. 1) is guided advancing straight in the Y-axis direction by a plurality of Y linear guide devices that include Y linear guides 74A and sliders 74B. Incidentally, although it is not illustrated, a Y scale whose periodic direction is in the Y-axis direction is fixed to main section 14a of base frame 14, and an encoder head configuring a Y linear encoder system EY (refer to FIG. 7) that obtains positional information in the Y-axis direction of Y coarse movement stage 23Y along with the Y scale is fixed to Y carriage 75. The position in the Y-axis direction of Y coarse movement stage 23Y is controlled by a main controller 50 (refer to FIG. 7), based on the output of the encoder head described above.

Now, as shown in FIG. 1, an auxiliary guide frame 103 is placed in between the pair of beds 12. Auxiliary guide frame 103 consists of a member extending in the Y-axis direction, and is installed on floor (floor surface) F via a plurality of adjusters. On the upper end surface (the end surface on the +Z side) of auxiliary guide frame 103, a Y linear guide 77A, which is an element of a mechanical single axis guide extending in the Y-axis direction, is fixed. The Z position of the upper end of auxiliary guide frame 103 is set substantially the same as the upper surface of the pair of beds 12. Further, auxiliary guide frame 103 is vibrationally separated from the pair of beds 12, and the pair of substrate stage mountings 19, respectively. Incidentally, since the pair of beds 12 are mechanically connected by interlinking member 79, a through hole which is not illustrated to pass through interlinking member 79 is formed in auxiliary guide frame 103.

To the lower surface of each of the pair of X beams 101 around the center in the longitudinal direction, auxiliary carriages 78 (refer to FIG. 6) are fixed. Auxiliary carriage 78 consists of a rectangular parallelepiped member, and as shown in FIG. 1, to the lower surface of auxiliary carriage 78, a slider 77B is fixed which includes a rolling body (e.g., a plurality of balls) and slidably engages with Y linear guide 77A. Incidentally, for one auxiliary carriage 78, for example, two each of sliders 77B are attached at a predetermined distance in a direction in the depth of the page surface (the Y-axis direction), although the sliders beneath are hidden in the direction in the depth of the page surface in FIG. 1. As described, Y coarse movement stage 23Y is supported from below around the center in the longitudinal direction by auxiliary guide frame 103 via auxiliary carriage 78, which restrains the bending caused by the self-weight.

Referring back to FIG. 2, on the upper surface of each of the pair of X beams 101, a plurality of (e. g., two per one X beam 101 in the embodiment) X linear guides 80A, which are elements of a mechanical single axis guide extending in the X-axis direction, are fixed parallel to each other at a predetermined distance in the Y-axis direction. Further, on the upper surface of each of the pair of X beams 101 in the area between the pair of X linear guides 80A, an X stator 81A is fixed. X stator 81A has a magnet unit including a plurality of permanent magnets arranged at a predetermined distance in the X-axis direction.

As described above, Y coarse movement stage 23Y is supported from below by the pair of base frames 14 and auxiliary guide frame 103, and is vibrationally separated from the pair of beds 12 and substrate stage mountings 19.

Figure 4:
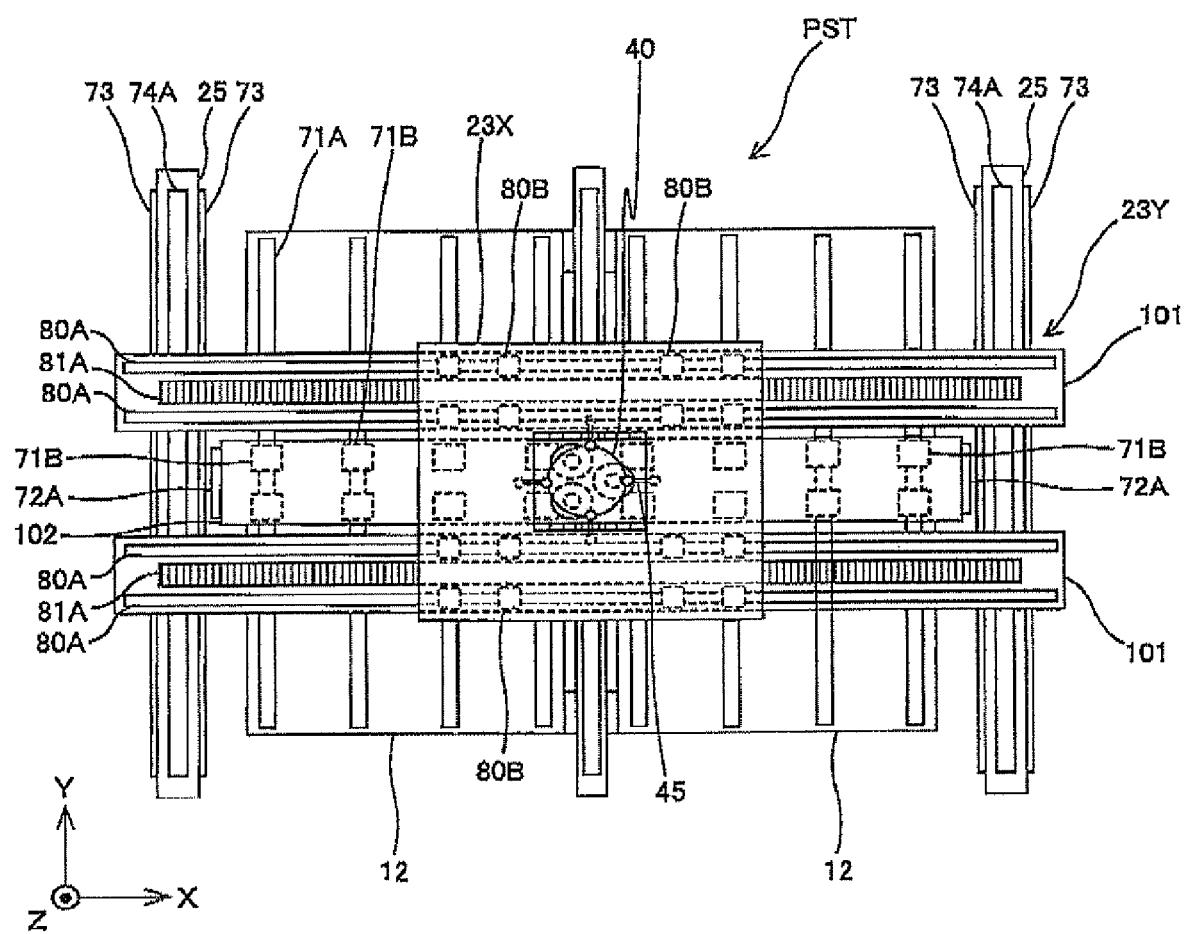
FIG. 4 is a planar view of the substrate stage except for the fine movement stage FIG. 3A (a sectional view of line B-B in FIG. 3)
Figure 5:
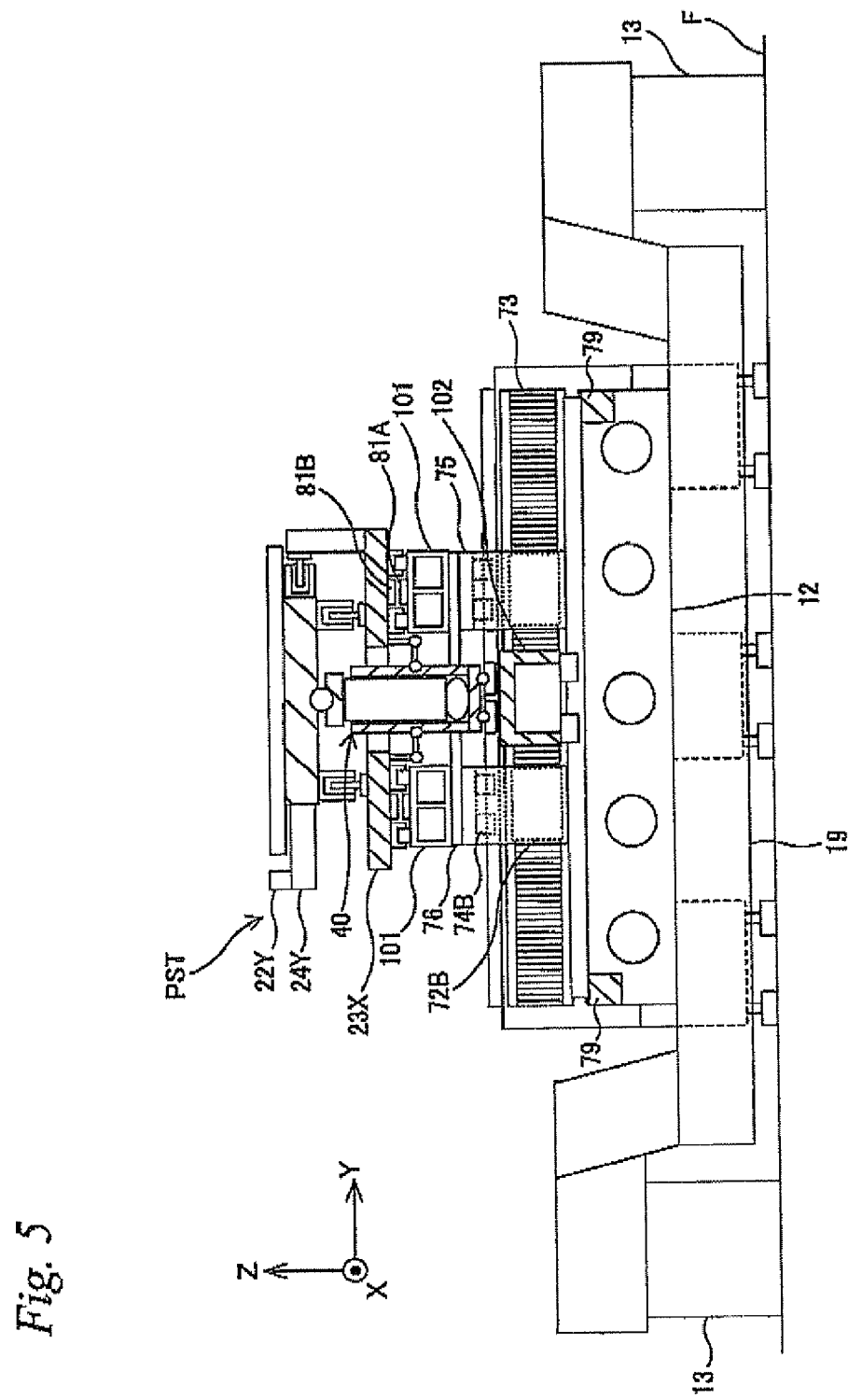
FIG. 5 is a sectional view of line C-C in FIG. 2.

X coarse movement stage 23X is made of a plate shaped member having a rectangular shape in a planar view, and as shown in FIG. 4, an opening is formed in the center portion. On the lower surface of X coarse movement stage 23X, as shown in FIG. 5, a pair of X movers 81B that each face X stator 81A are fixed to each of the pair of X beams 101 via a predetermined clearance (space/gap). Each of the X movers 81B includes a coil unit which is not illustrated, and configures an X linear motor DM (refer to FIG. 7) that drives X coarse movement stage 23X in predetermined strokes along with X stator 81A described above in the X-axis direction. In the embodiment, X coarse movement stage 23X driven in the X-axis direction, for example, by a pair of (two) X linear motors XDM provided corresponding to the pair of beams 101.

Further, to the lower surface of X coarse movement stage 23X, as shown in FIG. 1, a plurality of sliders 80B are fixed which include a rolling body (e.g., a plurality of balls) and slidably engage with X linear guides 80A. For example, four sliders 80B are provided at a predetermined distance in the X-axis direction for one X linear guide 80A, and for example, a total of 16 sliders 80B are fixed to the lower surface of X coarse movement stage 23X. X coarse movement stage 23 is guided advancing straight in the X-axis direction by a plurality of X linear guide devices that include each of the X linear guides 80A and sliders 80B. Further, relative movement of X coarse movement stage 23X in the Y-axis direction with respect to Y coarse movement stage 23Y is restricted by the plurality of sliders 80B, and X coarse movement stage 23X moves in the Y-axis direction integrally with Y coarse movement stage 23Y.

Incidentally, although it is not illustrated, an X scale whose periodic direction is in the X-axis direction is fixed to at least one of the pair of X beams 101, and an encoder head configuring an X linear encoder system EX (refer to FIG. 7) to obtain positional information in the X-axis direction of X coarse movement stage 23X is fixed to X coarse movement stage 23X. The position in the X-axis direction of X coarse movement stage 23X is controlled by main controller 50 (refer to FIG. 7), based on the output of the encoder head described above. In the embodiment, an encoder system 20 (refer to FIG. 7) which detects positional information (including rotation in the θz direction) within the XY plane of the coarse movement stage (X coarse movement stage 23X) is configured including X linear encoder system EX described above and Y linear encoder system EY previously described.

Further, although it is not illustrated, a stopper member which mechanically sets the movable amount of fine movement stage 21 with respect to X coarse movement stage 23X, or a gap sensor which measures the relative movement amount of fine movement stage 21 with respect to X coarse movement stage 23X in the X-axis and Y-axis directions and the like are attached to X coarse movement stage 23X.

As it can be seen from FIGS. 1 and 2, fine movement stage 21 consists of a plate shaped (or a box shaped (a hollow rectangular parallelepiped) member) which is substantially square in a planar view, and holds substrate P via a substrate holder PH on its upper surface by adsorption, such as, for example, by vacuum suction (or electrostatic adsorption).

Fine movement stage 21 is finely driven on X coarse movement stage 23X in directions of three degrees of freedom (the X-axis, the Y-axis, and the θz directions) by a fine movement stage drive system 26 (refer to FIG. 7) which includes a plurality of voice coil motors (or linear motors) configured each including stators fixed to X coarse movement stage 23X and movers fixed to fine movement stage 21. As the plurality of voice coil motors, as shown in FIG. 2, a pair of X voice coil motors 18X which finely drive fine movement stage 21 in the X-axis direction are provided spaced apart in the Y-axis direction, and a pair of Y voice coil motors 18Y which finely drive fine movement stage 21 in the Y-axis direction are provided spaced apart in the X-axis direction. Fine movement stage 21 moves in predetermined strokes in the X-axis direction and/or the Y-axis direction along with X coarse movement stage 23X, by being synchronously driven (driven in the same direction at the same speed with X coarse movement stage 23X) with X coarse movement stage 23X using X voice coil motor 18X and/or Y voice coil motor 18Y described above. Accordingly, fine movement stage 21 can be moved (coarse movement) in long strokes in the X, Y, two axial directions with respect to projection optical system PL (refer to FIG. 1), and also can be finely moved (fine movement) in directions of three degrees of freedom, which are X, Y, and θz directions.

Figure 3B:
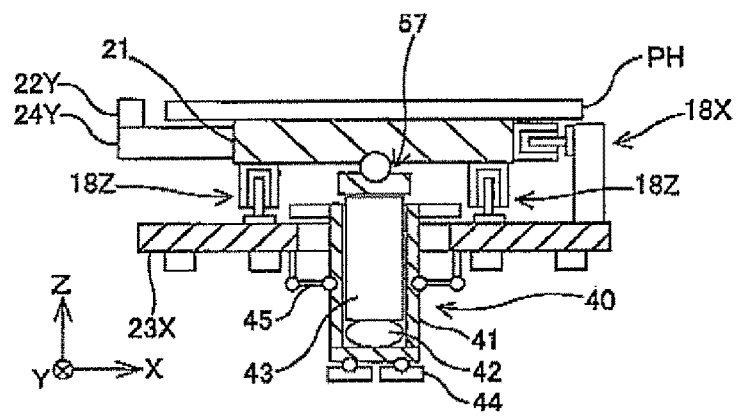
FIG. 3B is an enlarged view of the periphery of the weight cancellation device that the substrate stage has.
Figure 3C:
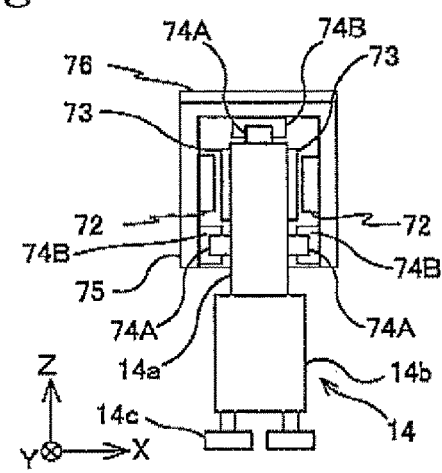
FIG. 3C is an enlarged view of the periphery of the base frame (the −X side)

Further, as shown in FIG. 3B, fine movement stage drive system 26 has a plurality of Z voice coil motors 18Z so as to finely drive fine movement stage 21 in the directions of three degrees of freedom, in the θx, the θy and the Z-axis directions. The plurality of Z voice coil motors 18Z are disposed at places corresponding to the four corners on the bottom surface of fine movement stage 21 (only two out of four Z voice coil motors 18Z are illustrated in FIG. 3B, and the remaining two are omitted). The configuration of the fine movement stage drive system including the plurality of voice coil motors is disclosed in, for example, U.S. Patent Application Publication No. 2010/0018950.

In the embodiment, a substrate stage drive system PSD is configured (refer to FIG. 7) including fine movement stage drive system 26, and a coarse movement stage drive system consisting of the plurality of Y linear motors YDM previously described and the pair of X linear motors XDM.

To the side surface on −X side of fine movement stage 21, as shown in FIG. 3A, an X movable mirror (a bar mirror) 22X having a reflection surface which is orthogonal to the X-axis is fixed, via mirror base 24X. Further, to the side surface on the −Y side of fine movement stage 21 as shown in FIG. 5, a Y movable mirror 22Y having a reflection surface which is orthogonal to the Y-axis is fixed, via a mirror base 24Y. Positional information in the XY plane of fine movement stage 21 is constantly detected at a resolution of around 0.5-1 nm by a laser interferometer system (hereinafter referred to as a substrate interferometer system) 92 using X movable mirror 22X and Y movable mirror 22Y (refer to FIG. 1). Incidentally, while substrate interferometer system 92 is actually equipped with a plurality of X laser interferometers and Y laser interferometers that correspond to X movable mirror 22X and Y movable mirror 22Y, respectively, only the X laser interferometer is representatively illustrated in FIG. 1. The plurality of laser interferometers are each fixed to the main section of the device. Further, positional information of fine movement stage 21 in the θx, θy and the Z-axis directions is obtained by a sensor which is not illustrated fixed to the lower surface of fine movement stage 21, for example, using a target fixed to weight cancellation device 40 that will be described later on. The configuration of a position measuring system of fine movement stage 21 described above is disclosed in, for example, U.S. Patent Application Publication No. 2010/0018950.

Weight cancellation device 40 consists of a columnar member extending in the Z-axis direction as shown in FIG. 3A, and is also referred to as a central column. Weight cancellation device 40 is mounted on an X guide 102 which will be described later on, and supports fine movement stage 21 from below via a leveling device 57 which will be described later on. The upper half of weight cancellation device 40 is inserted into the opening of X coarse movement stage 23X, and the lower half is inserted in between the pair of X beams 101 (refer to FIG. 4).

As shown in FIG. 3B, weight cancellation device 40 has a housing 41, an air spring 42 and a Z slider 43 and the like. Housing 41 consists of a cylinder-like member that has a bottom and whose surface opens on the +Z side. To the lower surface of housing 41, a plurality of air bearings (hereinafter referred to as base pads) 44 whose bearing surfaces face the −Z side are attached. Air spring 42 is housed inside housing 41. To air spring 42, pressurized gas is supplied from the outside. Z slider 43 consists of a cylindrical member extending in the Z-axis direction, and is inserted into housing 41 and mounted on air spring 42. To an edge on the +Z side of Z slider 43, an air bearing which is not illustrated whose bearing surface faces the +Z side is attached.

Leveling device 57 is a device which tiltably (swingable in the θx and θy directions with respect to the XY plane) supports fine movement stage 21, and is supported from below in a noncontact manner by the air bearing described above attached to Z slider 43. Weight cancellation device 40 negates (cancels out) the weight (a force whose direction of gravitational force is downward) of the system including fine movement stage 21 via Z slider 43 and leveling device 57 with a force whose direction of gravitational force is upward generated by air spring 42, which reduces the load of the plurality of Z voice coil motors 18Z described above.

Weight cancellation device 40 is mechanically connected to X coarse movement stage 23X via a plurality of interlinking devices 45. The Z position of the plurality of interlinking devices 45 approximately coincides with the position of the center of gravity in the Z-axis direction of weight cancellation device 40. Interlinking device 45 includes a thin steel plate parallel to the XY plane, and is also referred to as a flexure device. Interlinking device 45 connects (interlinking devices 45 on the +Y side and the −Y side are not illustrated in FIG. 3B, refer to FIG. 4) housing 41 of weight cancellation device 40 and X coarse movement stage 23X on the +X side, the −X side, the +Y side, and the −Y side of weight cancellation device 40. Accordingly, with X coarse movement stage 23X pulling weight cancellation device 40 via any of the plurality of interlinking devices 45, weight cancellation device 40 moves in the X-axis direction or the Y-axis direction integrally with X coarse movement stage 23X. In doing so, because a tractive force acts on weight cancellation device 40 in a plane parallel to the XY plane including the position of the center of gravity in the Z-axis direction, moment (pitching moment) around the axis orthogonal to the movement direction does not act. Incidentally, details on weight cancellation device 40 of the embodiment including leveling device 57 and interlinking device 45 are disclosed in, for example, U.S. Patent Application Publication No. 2010/0018950.

X guide 102, as shown in FIG. 3A, includes a guide main section 102a consisting of a member (refer to FIG. 5) whose YZ section is an inverted U-shape and longitudinal direction is in the X-axis direction, and a plurality of ribs 102b. X guide 102 is placed above (the +Z side) of the pair of beds 12 described above, traversing the pair of beds 12. The length (dimension in the longitudinal direction (the X-axis direction)) of X guide 102 is set somewhat longer than the sum of the X-axis direction dimension of each of the pair of beds 12 placed at a predetermined distance in the X-axis direction and the X-axis direction dimension of the gap in between the pair of beds 12. Therefore, as shown in FIG. 2, the edge on the +X side of X guide 102 protrudes further to the +X side (outside of bed 12) than the edge on the +X side of bed 12 at the +X side, and the edge on the −X side of X guide 102 protrudes further to the −X side (outside of bed 12) than the edge on the −X side of bed 12 at the −X side.

The upper surface (the surface on the +Z side) of guide main section 102a is parallel to the XY plane, and its degree of flatness is extremely high. On the upper surface of guide main section 102a, weight cancellation device 40 is mounted in a non-contact state via a plurality of base pads 44. The upper surface of guide main section 102a is adjusted with good accuracy so that the surface is parallel to a horizontal plane, and functions as a guide surface when weight cancellation device 40 moves. The length (dimension in the longitudinal direction) of guide main section 102a is set somewhat longer than the movable amount of weight cancellation device 40 (in other words, X coarse movement stage 23X) in the X-axis direction. The width (dimension in the Y-axis direction) of guide main section 102 is set (refer to FIG. 4) to a dimension so that guide main section 102 can face the bearing surfaces of all of the plurality of base pads 44. Further, both ends in the longitudinal direction of guide main section 102a are blocked by plate shaped members that are parallel to the YZ plane.

The plurality of ribs 102b each consist of a plate shape member parallel to the YZ plane, and are provided spaced at a predetermined distance in the X-axis direction. The plurality of ribs 102b are each connected to a pair of opposing surfaces and a ceiling surface of guide main section 102a. In this case, while the material and manufacturing method of X guide 102 including the plurality of ribs 102b are not limited in particular, for example, in the case when X guide 102 is formed by casting using iron and the like, when X guide 102 is formed by a stone material (e.g., gabbro), or when X guide 102 is formed by ceramics or a CFRP (Carbon Fiber Reinforced Plastics) material, guide main section 102a and the plurality of ribs 102b are integrally formed. However, guide main section 102a and the plurality of ribs 102b can be separate members, and the plurality of ribs 102b can be connected to guide main section 102a by welding. Incidentally, X guide 102 can be configured of a solid member, or a box shape whose lower surface side is closed.

To the lower end of each of the plurality of ribs 102b, a Y slider 71B including a rolling body (e.g., a plurality of balls) is fixed slidable to Y linear guide 71A fixed to the upper surface of each of the pair of beds 12 described above. Incidentally, as shown in FIG. 4, a plurality of (in the embodiment, e.g., two per one Y linear guide 71A) Y sliders 71B are fixed in the Y axis direction at a predetermined distance. Flatness adjustment of the upper surface of guide main section 102a should be performed by appropriately inserting a shim in between the plurality of ribs 102b and Y sliders 71B.

As shown in FIG. 2, to the plate shaped members described above provided at both ends in the longitudinal direction of X guide 102, Y movers 72A which are elements of Y linear motors 82 (refer to FIG. 7) that drive each of the X guides 102 in the Y-axis direction with predetermined strokes are fixed (refer to FIG. 4. Incidentally, for the sake of clarity, plate 76 is not illustrated in FIG. 4.) facing each of the pair of Y stators 73 (refer to FIG. 3C) described above via a predetermined clearance (space/gap). Each Y mover 72A has a coil unit which is not illustrated. X guide 102 is driven in predetermined strokes in the Y-axis direction by the pair of Y linear motors 82 each including Y stator 73 and Y mover 72A. In other words, in the present embodiment, the pair of Y linear motors 82 which drives X guide 102 in the Y-axis direction and Y linear motor YDM which drives Y coarse movement stage 23Y in the Y-axis direction each use stator 73 in common.

Further, although it is not illustrated, to one of the pair of beds 12 described above, a Y scale whose periodic direction is in the Y-axis direction is fixed, and to X guide 102, an encoder head which configures a Y linear encoder system 104 (refer to FIG. 7) that obtains positional information in the Y-axis direction of X guide 102 along with the Y scale is fixed. X guide 102 and Y coarse movement stage 23Y are synchronously driven (however, the Y position can be controlled individually if necessary) in the Y-axis direction by main controller 50 (refer to FIG. 7), based on the output of the encoder head described above based on the output of the encoder head described above.

Besides the description above, on the upper surface of substrate holder PH, a rectangle tabular shaped mark plate (not illustrated) whose longitudinal direction is in the Y-axis direction is fixed. The height of this mark plate is set so that its surface is substantially flush with the surface of substrate P mounted on substrate holder PH. And, on the surface of the mark plate, a plurality of, in this case, six, reference marks (not illustrated) are formed collaterally in the Y axis direction.

Further, inside of substrate holder PH (fine movement stage 21) below (the −Z side) each of the six reference marks, six mark image detection systems $MD_1$ to $MD_6$ (refer to FIG. 7) are placed including a lens system and an imaging device (such as a CCD). These mark image detection systems MD1 to MD6 simultaneously detect projected images of alignment marks on mask M made by each of five projection optical systems and the lens systems and images of reference marks (not illustrated) formed by the lens system, and measures the position of the images of the alignment marks using the position of the images of the reference marks as a reference. The measurement results are supplied to main controller 50, and are used on alignment (mask alignment) and the like of mask M.

Furthermore, in exposure apparatus 10, six alignment detection systems AL1 to AL6 (refer to FIG. 7) of the off-axis method are provided to detect the six reference marks and the alignment marks on substrate P. The six alignment detection systems are placed sequentially along the Y-axis, on the +X side of projection optical system PL.

As each alignment detection system, an image-processing type sensor of the FIA (Field Image Alignment) system is used. The FIA system sensor, for example, irradiates a broadband detection light that does not photosensitize the resist on substrate P on a target mark, and captures an image of an index (not illustrated) and an image of the target mark formed on a light receiving surface by the light reflected from the target mark, using the imaging capturing device (CCD) and the like. Detection results of alignment detection systems $AL_1$ to $AL_6$ are sent to main controller 50 via an alignment signal processing system (not illustrated).

Incidentally, other than the FIA system, an alignment sensor, which irradiates a coherent detection light to a subject mark and detects a scattered light or a diffracted light generated from the subject mark or makes two diffracted lights (e.g., the same order) generated from the subject mark interfere and detects an interference light, can be used alone or in combination as needed.

Figure 7:
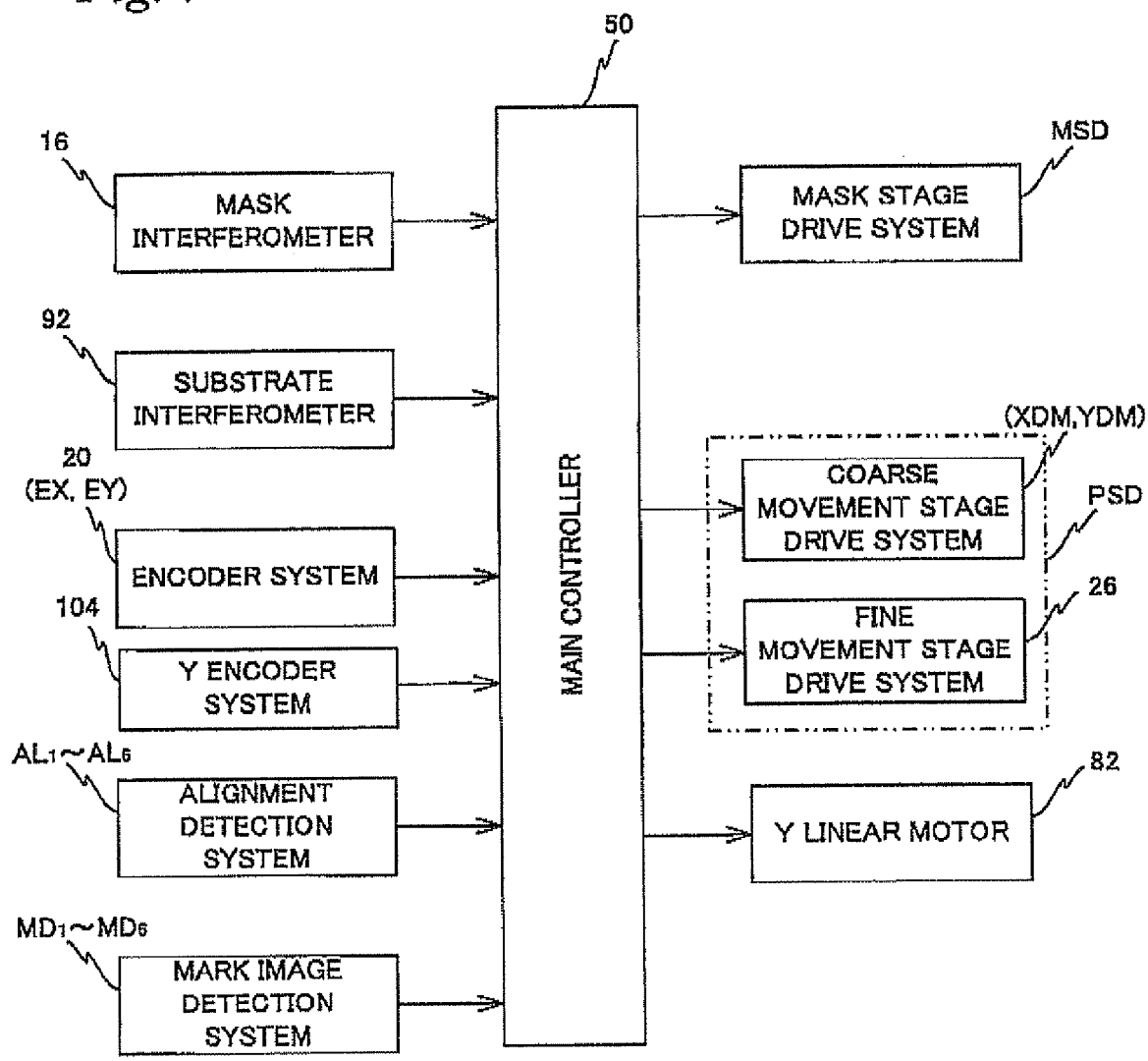
FIG. 7 is a block diagram that shows an input/output relation of a main controller, which centrally configures a control system of an exposure apparatus related to a first embodiment.

FIG. 7 shows a block diagram that shows input/output relations of main controller 50 that is configured of a control system of exposure apparatus 10 as the central component and performs overall control of the respective components. Main controller 50 includes a workstation (or a microcomputer) and the like, and has overall control over each part of exposure apparatus 10.

Next, lot processing of substrate P in exposure apparatus 10 will be briefly described.

When a lot subject to processing consisting of a plurality of (e.g., 50 pieces or 100 pieces) substrates P is carried into a coater developer (hereinafter referred to as a "C/D") (not illustrated) that is connected in-line to exposure apparatus 10, the substrates in the lot is coated sequentially with a resist, and is carried to exposure apparatus 10 by a carrier system (not illustrated). Further, under the control of main controller 50, mask M is loaded onto mask stage MST by a mask carrier device (mask loader) that is not illustrated, and then mask alignment previously described is performed.

Then, when substrate P to which resist has been applied is loaded on substrate holder PH, main controller 50 uses alignment detection systems $AL_1$ to $AL_6$ to detect the reference marks on substrate holder PH, and performs base line measurement.

And then, main controller 50 detects a plurality of alignment marks transferred and formed along with a pattern on substrate P on exposure of the previous layer and the layers before, using alignment detection systems $AL_1$ to $AL_6$, and performs alignment of substrate P.

After the alignment of substrate P has been completed, main controller 50 performs exposure operation by the step-and-scan method to sequentially transfer a pattern of mask M onto a plurality of shot areas on substrate P by the scanning exposure previously described. Because this exposure operation is similar to the conventional exposure operation by the step-and-scan method, the explanation thereabout shall be omitted.

Now, in the exposure operation by the step-and-scan method described above, exposure processing is sequentially performed to a plurality of shot areas provided on substrate P. Substrate P is driven at a constant speed (hereinafter referred to as an X scan operation) in predetermined strokes in the X-axis direction at the time of a scan operation, and is appropriately driven in the X-axis direction and/or the Y-axis direction at the time of a step operation (hereinafter referred to as an X step operation and a Y step operation, respectively).

When substrate P is moved in the X-axis direction at the time of the X scan operation and the X step operation, at substrate stage PST, X coarse movement stage 23X is driven in the X-axis direction on Y coarse movement stage 23Y according to instructions based on measurement values of X linear encoder system EX from main controller 50, and fine movement stage 21 is synchronously driven with respect to X coarse movement stage 23X by a plurality of X voice coil motors 18X according to instructions based on measurement values of substrate interferometer system 92 from main controller 50. Further, when X coarse movement stage 23X moves in the X-axis direction, X coarse movement stage 23X pulls weight cancellation device 40, moving weight cancellation device 40 in the X-axis direction along with X coarse movement stage 23X. In doing so, weight cancellation device 40 moves on X guide 102. Incidentally, at the time of the X scan operation and the X step operation described above, while there may be a case when fine movement stage 21 is finely driven in the Y-axis direction and/or the θz direction with respect to X coarse movement stage 23X, because the Y position of weight cancellation device 40 does not change, weight cancellation device 40 always moves only on X guide 102.

To the contrary, at the time of the Y step operation, at substrate stage PST, Y coarse movement stage 23Y is driven in predetermined strokes in the Y-axis direction on the pair of base frames 14 by the plurality of Y linear motors YDM according to instructions based on measurement values of Y linear encoder system EY from main controller 50, and X coarse movement stage 23X moves in predetermined strokes in the Y-axis direction integrally with this Y coarse movement stage 23Y. Further, weight cancellation device 40 moves in predetermined strokes in the Y-axis direction integrally with X coarse movement stage 23X. In doing so, X guide 102 which supports weight cancellation device 40 from below is synchronously driven with Y coarse movement stage 23Y. Accordingly, weight cancellation device 40 is constantly supported from below by X guide 102.

As described so far, according to exposure apparatus 10 of the present embodiment, weight cancellation device 40 is constantly supported from below by X guide 102, regardless of its position in the XY plane. Because X guide 102 consists of a plate shaped member which has a narrow width and extends in the scanning direction, the weight of substrate stage device PST can be reduced when compared with the case, for example, when a guide member (a surface plate formed, for example, by a stone material) that has a wide guide surface which covers the entire movement range of weight cancellation device 40 is used. Further, while processing and carriage of the guide member that has a wide guide surface become difficult in the case the substrate becomes large, processing and carriage is easy for X guide 102 of the present embodiment since X guide 102 consists of a plate shaped member of a narrow width that has a band shaped guide surface extending in the X-axis direction.

Further, because X guide 102 which is a member extending in the X-axis direction is supported from below at a plurality of points by the pair of beds 12, this restrains the bending caused by the self-weight of X guide 102 or the load of weight cancellation device 40. Further, since two beds 12 are used, the size and the weight of each of the beds 12 can be reduced when compared with the case when one bed 12 is used. Accordingly, processing and carriage of bed 12 become easy, and workability at the time of assembly of substrate stage device PST also improves.

Further, because X guide 102 and the pair of beds 12 which guide X guide 102 in the Y axis direction are to have a rib structure, X guide 102 and the pair of beds 12 are light and the rigidity in the Z-axis direction can also be easily secured. Accordingly, workability of the operation to assemble substrate stage device PST is better than in the case when a guide member having a wide guide surface is used.

Further, because weight cancellation device 40 is supported in a non-contact manner on X guide 102, vibration which occurs when moving weight cancellation device 40 does not travel to X guide 102. Accordingly, vibration does not travel, for example, to projection optical system PL via X guide 102, the pair of substrate stages 12, substrate stage mountings 19 and the like, which allows the exposure operation to be performed with high precision. Further, because X guide 102 is driven near the center of gravity in the Z-axis direction by the pair of Y linear motors 82 including Y stator 73 fixed to the pair of base frames 14, moment (pitching moment) around the X-axis is not generated, and the drive reaction force does not travel to substrate stage mountings 19. Accordingly, the exposure operation can be performed with high precision.

Further, because the movement in the Y-axis direction of X guide 102 is performed at the time of the Y step operation described above where positioning accuracy with high precision is not necessary, even if frictional resistance of the linear guide device or moment by the drive acts on weight cancellation device 40 or X guide 102, vibration which is generated due to the moment described above can be converged by the time of the X scan operation after the Y step operation. Further, the yawing movement (moment around the Z-axis) by the drive of X guide 102 in the Y-direction can be strictly controlled and suppressed by the drive force difference of the pair of Y linear motors 82 used to drive X guide 102.

Furthermore, because coarse movement stage 23 (XY stage device) of the present embodiment is configured with X coarse stage 32X being mounted on Y coarse movement stage 23Y, inertial mass of X coarse stage 23X which moves in long strokes in the X-axis direction serving as the scanning direction is smaller than the conventional XY stage device that has a configuration, for example, in which the Y coarse stage is mounted on the X coarse stage. Accordingly, the drive reaction force that floor (floor surface) F receives via coarse movement stage 23 at the time of the X scan operation becomes smaller. As a result, at the time of the X scan operation, floor vibration influencing the overall system can be suppressed. To the contrary, while the drive mass and the drive reaction force when Y coarse movement stage 23Y moves in the Y-axis direction become larger than the conventional XY stage device described above, because the movement is a Y step operation that does not require positioning accuracy with high precision, the exposure operation is less affected by the floor vibration.

Further, in coarse movement stage 23, the middle part in the X direction of each of the pair of X beams 101 that Y coarse movement stage 23Y has is supported by auxiliary guide frame 103 placed in between the pair of beds 12, which restrains the bending caused by the self-weight or the load of X coarse movement stage 23X. Accordingly, straightness accuracy of X linear guides 80A fixed on the pair of X beams 101 can be improved, which allows X coarse movement stage 23X to be guided advancing straight in the X-axis direction with high precision. Further, each of the pair of X beams 101 does not require a firm structure (preferably a delicate member) to secure the rigidity to bending when compared with the case when only both of the ends are supported.

Second Embodiment

Next, a second embodiment of the present invention will be described, with reference to FIGS. 8 to 13. Herein, the same or similar reference signs are used for the components that are the same as or similar to those in the first embodiment described previously, and the description thereabout is simplified or omitted.

Figure 8:
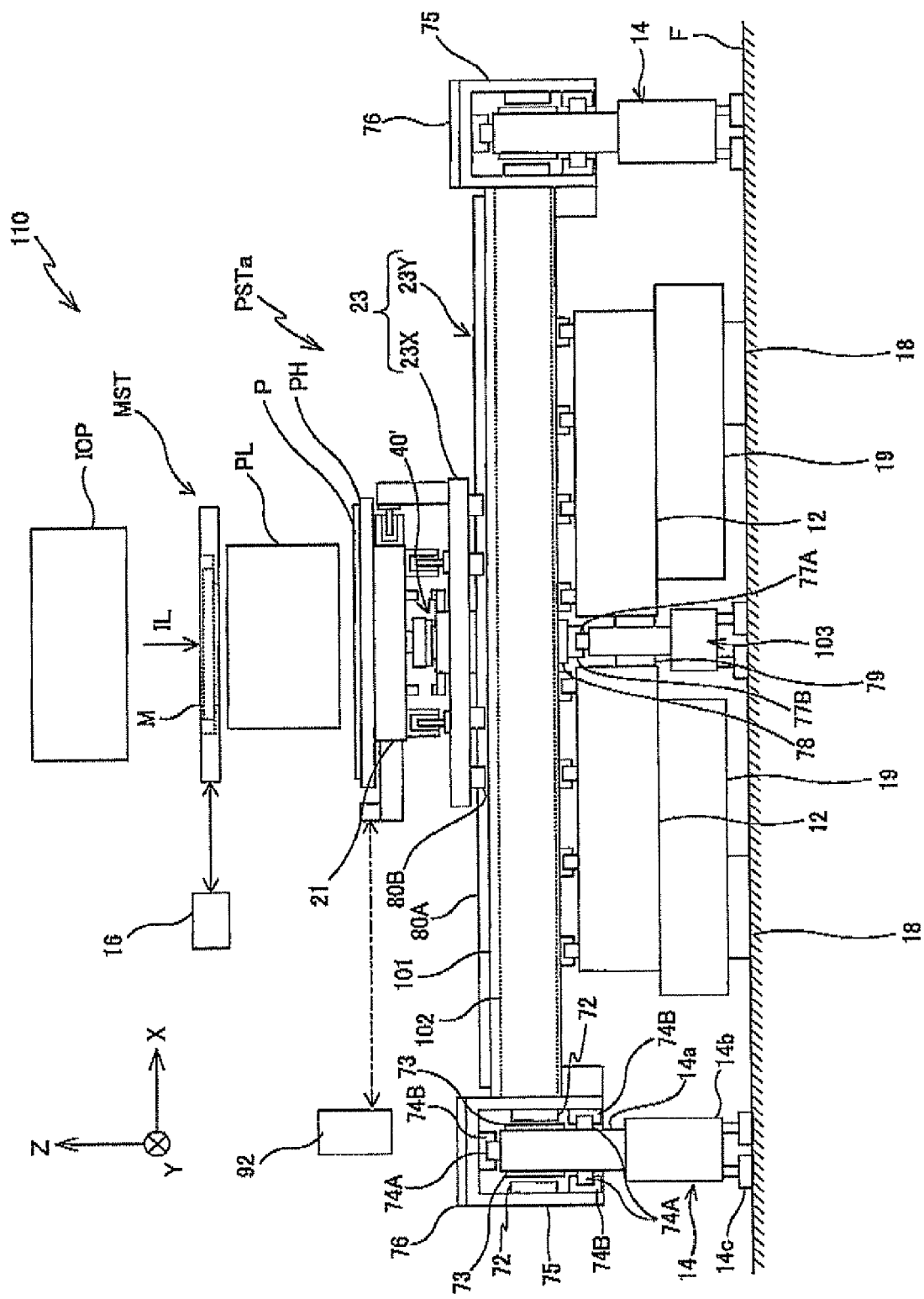
FIG. 8 is a view that schematically shows a configuration of an exposure apparatus related to a second embodiment.

FIG. 8 schematically shows a configuration of an exposure apparatus 110 related to the second embodiment. Exposure apparatus 110 is a projection exposure apparatus by a step-and-scan method, or a so-called scanner in which a substrate P that is used in a liquid crystal display device (flat panel display) serves as an exposure subject.

Figure 9:
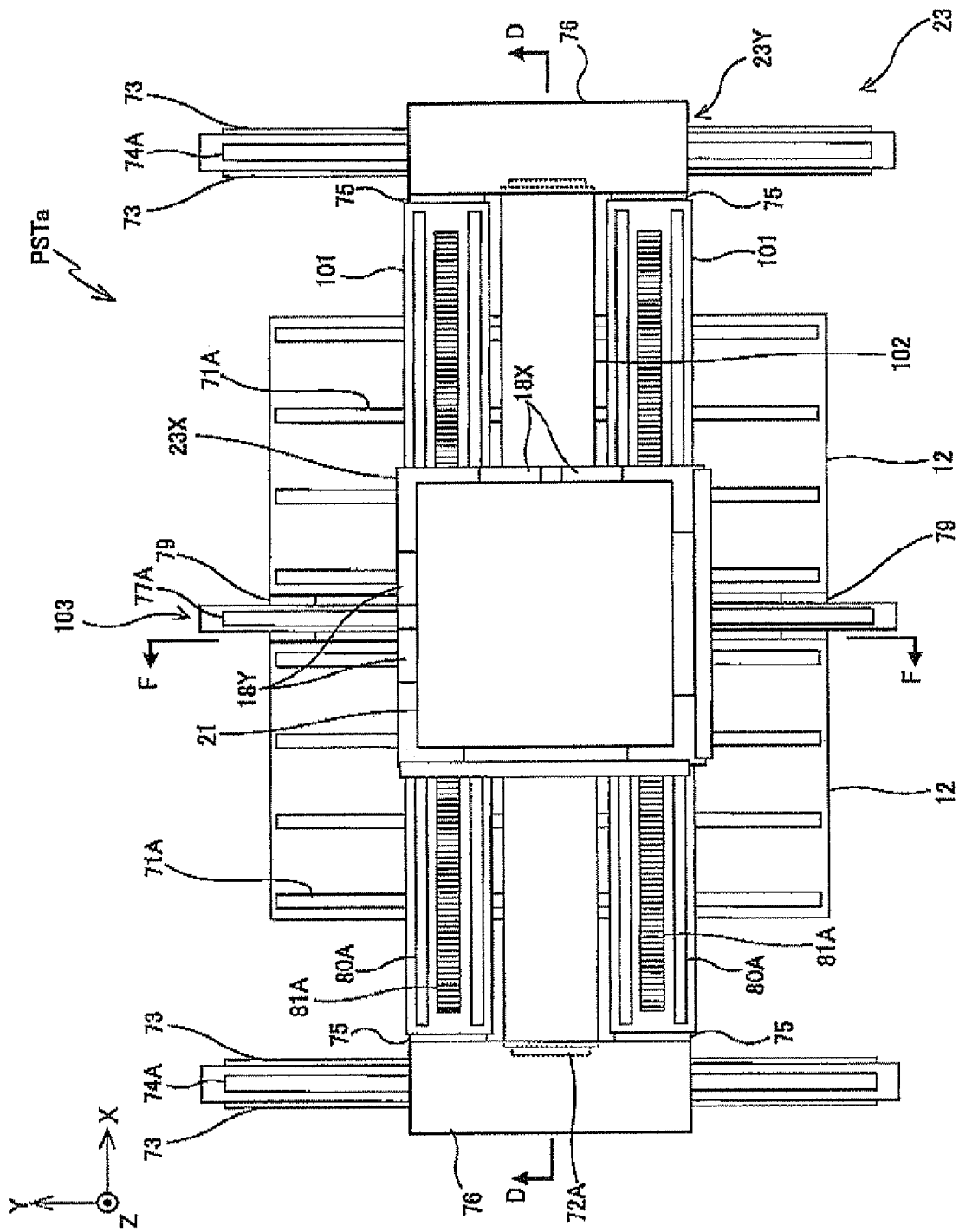
FIG. 9 is a planar view of a substrate stage which the exposure apparatus in FIG. 8 has.
Figure 10:
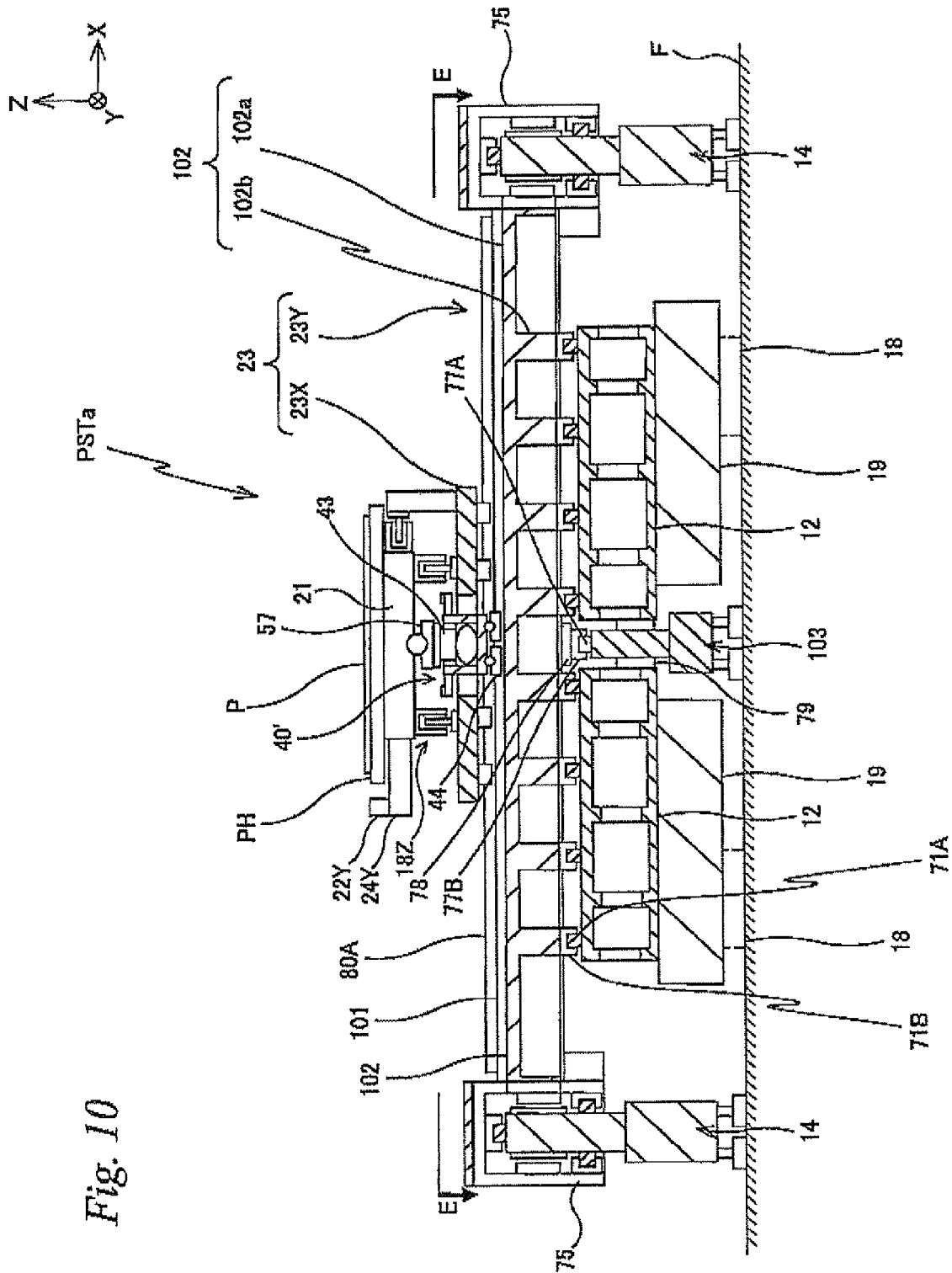
FIG. 10 is a sectional view of line D-D in FIG. 9.
Figure 11:
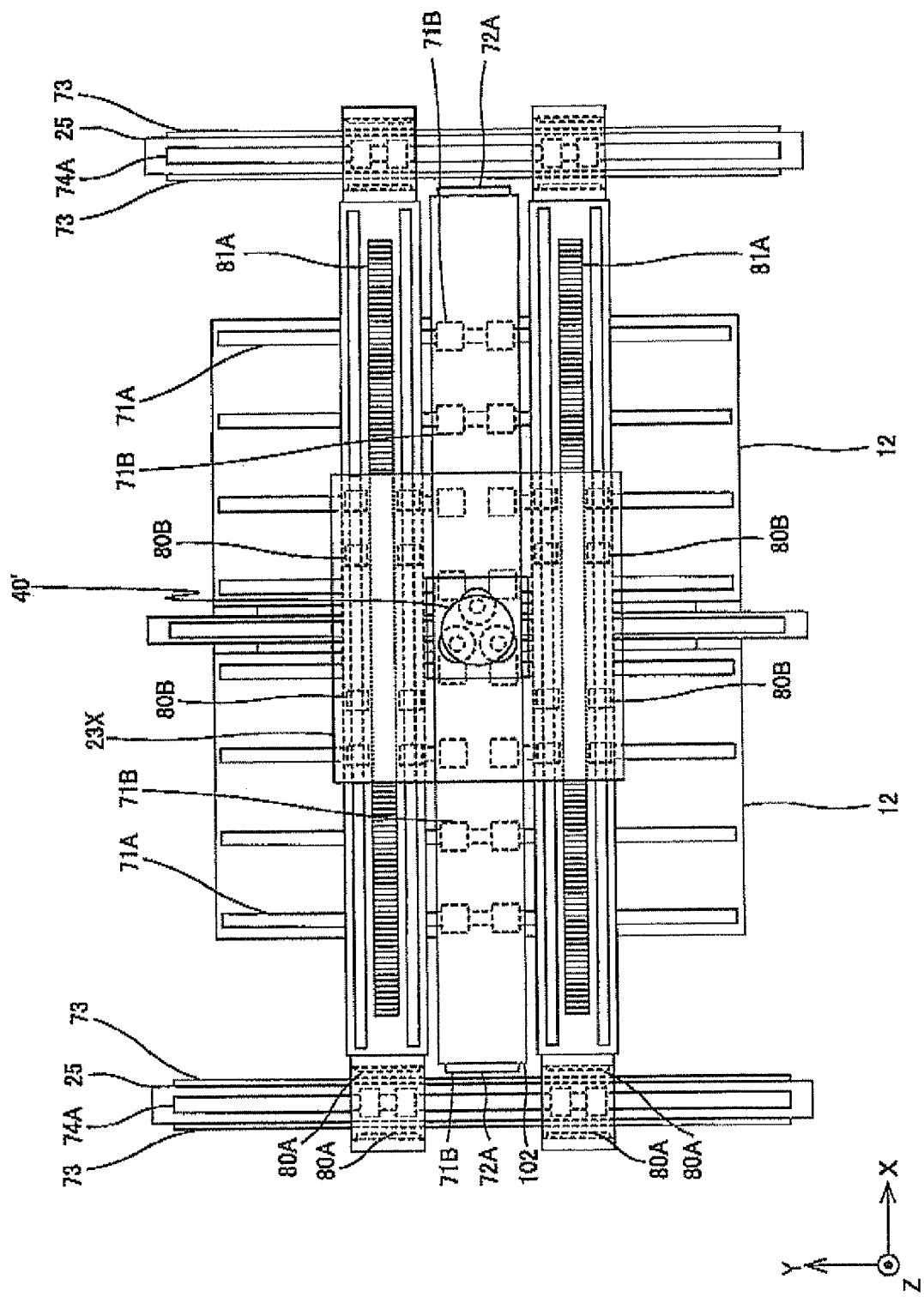
FIG. 11 is a planar view of the substrate stage except for the fine movement stage (a sectional view of line E-E in FIG. 10)
Figure 12:
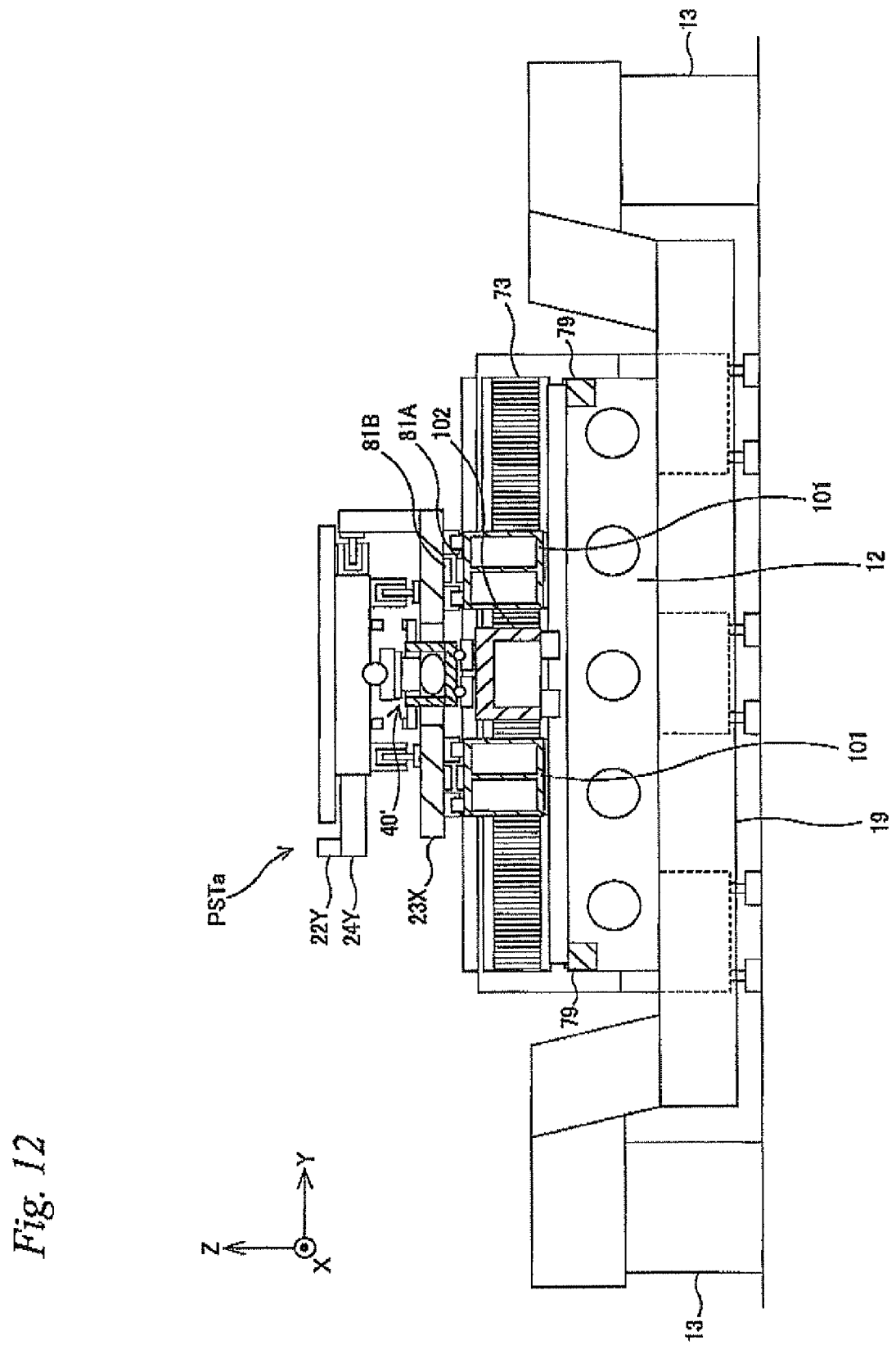
FIG. 12 is a sectional view of line F-F in FIG. 9.
Figure 13:
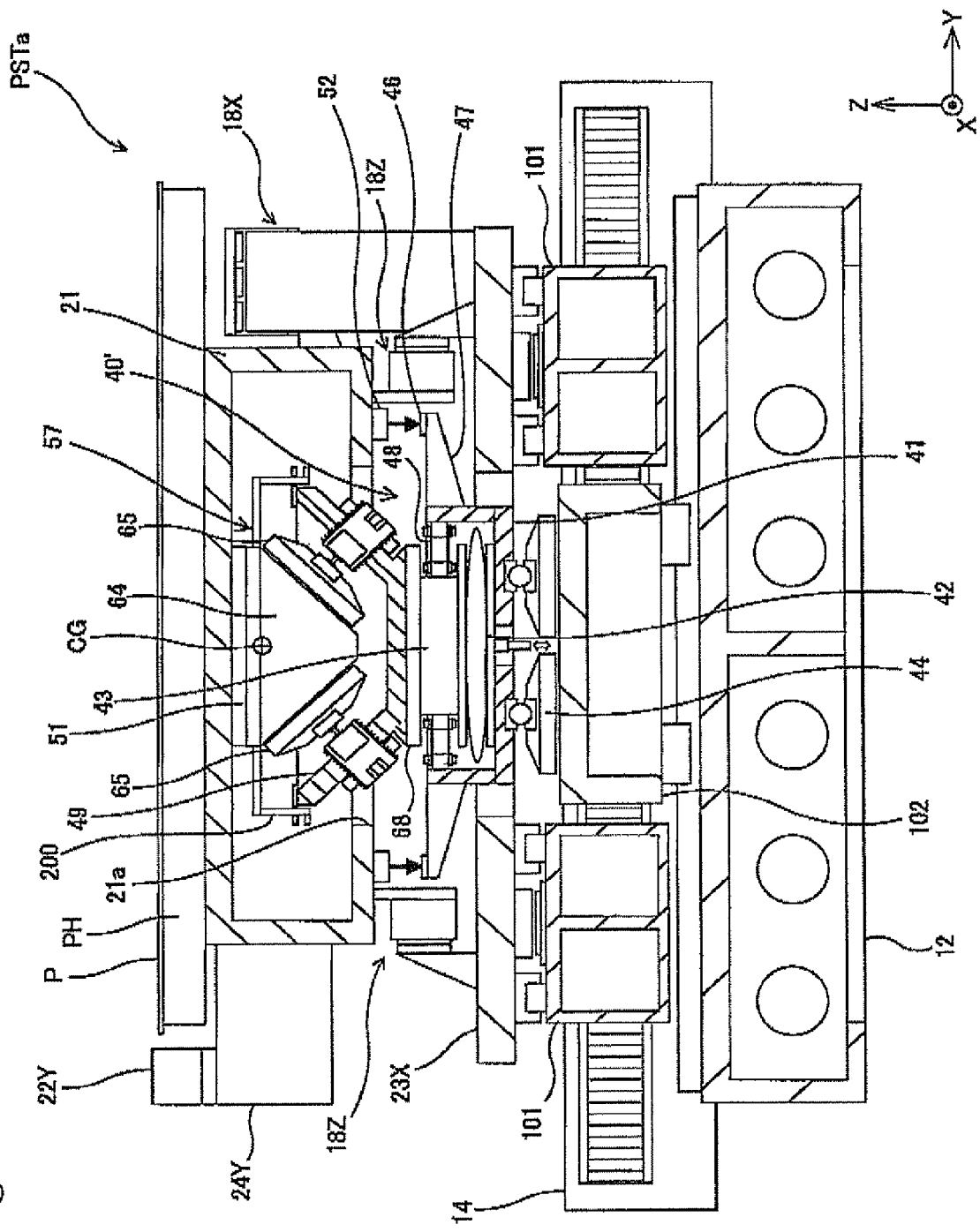
FIG. 13 is a sectional view of the weight cancellation device which the substrate stage device in FIG. 9 has.

FIG. 9 shows a planar view of a substrate stage device PSTa which exposure apparatus 110 of FIG. 8 has, and FIG. 10 shows a sectional view of line D-D in FIG. 9. Further, FIG. 11 shows a planar view (a sectional view of line E-E in FIG. 10) of the substrate stage device except for the fine movement stage, and FIG. 12 shows a sectional view of line F-F in FIG. 9. Further, FIG. 13 shows a sectional view of the weight cancellation device which substrate stage device PSTa has.

As it can be seen when comparing FIGS. 8 to 13 and FIGS. 1 to 6 related to the first embodiment previously described, in exposure apparatus 110 related to the second embodiment, the point where substrate stage device PSTa is provided instead of substrate stage device PST differs from exposure apparatus 10.

While the overall configuration of substrate stage device PSTa is similar to substrate stage device PST, some points differ from substrate stage device PST, such as weight cancellation device 40' being provided instead of weight cancellation device 40, a part of the configuration of the drive system of X guide 102 being different from substrate stage device PST and the like. The description below will focus mainly on the difference.

In substrate stage device PSTa, as it can be seen from FIGS. 8 and 10, a position (height position) in the Z-axis direction (vertical direction) of Y coarse movement stage 23Y and X guide 102 a position (a height position) partly overlaps each other.

To be concrete, in substrate stage device PSTa, as is shown in FIGS. 8 and 10, to both side surfaces (not to the lower surface near both ends) in the longitudinal direction of each of the pair of X beams 101, Y carriage 75 previously described is fixed. That is to say, Y coarse movement stage 23Y has, for example, a total of four Y carriages 75. Further, the upper surface of two Y carriages 75 on the +X side is mechanically connected by a plate 76, and the upper surface of two Y carriages 75 on the −X side is mechanically connected similarly by a plate 76. Incidentally, for the sake of clarity, plate 76 is not illustrated in FIG. 11.

Further, as weight cancellation device 40', for example, as shown in FIG. 10, a type of device in which Z slider 43 and leveling device 57 are integrally fixed is used. Weight cancellation device 40' is mounted on X guide 102, and its lower half is inserted into the opening of X coarse movement stage 23X. Further, from the viewpoint of avoiding intricacy of the drawings, in FIGS. 8, and 10 to 12, weight cancellation device 40', leveling device 57 which will be described later and the like are typically shown (refer to FIG. 13 for a detailed configuration).

As shown in FIG. 13, weight cancellation device 40' has a housing 41, an air spring 42, a Z slider 43 and the like. Housing 41 consists of a cylinder-like member that has a bottom and whose surface opens on the +Z side. To the lower surface of housing 41, a plurality of base pads 44 whose bearing surfaces face the −Z side are attached. To an outer wall surface of housing 41, a plurality of arm members 47 are fixed to support a target 46 of a plurality of Z sensors 52 fixed to the lower surface of fine movement stage 21. Air spring 42 is housed inside housing 41. To air spring 42, pressurized gas is supplied from the outside. Z slider 43 consists of a cylindrical member extending in the Z-axis direction whose height is lower (shorter) than the Z slider used in the first embodiment previously described. Z slider 43 is inserted into housing 41, and is mounted on air spring 42. Z slider 43 is connected to an inner wall surface of housing 41 by a parallel plate spring device 48 which includes a pair of flat springs parallel to the XY plane placed apart in the Z-axis direction. A plurality of (e.g., three or four) parallel plate spring devices 48 are provided, for example, around the outer periphery (the θz direction) of Z slider 43 spaced approximately equally. Z slider 43 moves along the XY plane integrally with housing 41 by rigidity (tensile rigidity) in a direction parallel to the horizontal surface of the plurality of plate springs. On the contrary, due to the flexibility (flexibleness) of the plate springs, Z slider 43 is finely movable in the Z-axis direction with respect to housing 41. Because the pair of flat springs which parallel plate spring device 48 has are distanced apart in the Z-axis direction, slant (rotation in the θx or θy direction) of Z slider 43 is suppressed, and Z slider 43 is substantially movable only in the Z-axis direction with fine strokes with respect to housing 41.

Leveling device 57 is a device which tiltably (swingable in the θx and θy directions with respect to the XY plane) supports fine movement stage 21, and the upper half is inserted into fine movement stage 21 via an opening 21*a* formed in the lower surface of fine movement stage 21. Weight cancellation device 40' negates (cancels out) the weight (a force whose direction of gravitational force is downward) of the system including fine movement stage 21 via Z slider 43 and leveling device 57 with a force whose direction of gravitational force is upward generated by air spring 42, which reduces the load of the plurality of Z voice coil motors 18Z.

Leveling device 57 includes a leveling cup 49 consisting of a cup shaped member whose surface on the +Z side opens, a polyhedron member 64 which is to be inserted into the inner diameter side, and a plurality of air bearings 65 attached to the inner wall surface of leveling cup 49. The lower surface of leveling cup 49 is integrally fixed to the upper surface of Z slider 43 via a plate 68. Incidentally, to the ceiling surface of fine movement stage 21, a plurality of omission preventing devices 200 are attached to keep leveling cup 49 from dropping. Polyhedron member 64 consists of a triangular pyramid shaped member, and the tip is inserted into leveling cup 49. The bottom surface (the surface facing the +Z side) of polyhedron member 64 is fixed to the ceiling surface of fine movement stage 21 via a spacer 51. For example, three air bearings 65 are provided in the inner wall surface of leveling cup 49 spaced approximately equally around θz. Leveling device 57 supports fine movement stage 21 tiltable via an extremely small clearance (space/gap) in a non-contact manner with the center of gravity CG serving as a center of rotation of a system including fine movement stage 21, by blowing out pressurized gas to the side surface of polyhedron member 64 from the plurality of air bearings 65. Incidentally, in FIG. 13, for the sake of clarity, for example, a sectional view is shown (in other words, as for leveling device 57, FIG. 13 is not a sectional view of a cross section parallel to the YZ plane) of two out of the three air bearings 65.

Now, when fine movement stage 21 moves in a direction parallel to the XY plane, polyhedron member 64 moves integrally with fine movement stage 21 in the direction parallel to the XY plane. In doing so, air bearing 65 is pushed by polyhedron member 64 by the rigidity (static pressure) of a gaseous film formed between the bearing surface of air bearing 65 and polyhedron member 64, which integrally makes fine movement stage 21 and leveling cup 49 move in the same direction as fine movement stage 21. And, because leveling cup 49 and Z slider 43 are fixed via plate 68, fine movement stage 21 and Z slider 43 move integrally in a direction parallel to the horizontal plane. Further, because Z slider 43 and housing 41 are connected by the plurality of parallel plate spring devices 48 as it has been described above, fine movement stage 21 and housing 41 move in a direction parallel to the horizontal plane. As described above, fine movement stage 21 and weight cancellation device 40' constantly move integrally in the direction parallel to the XY plane, including the case when fine movement stage 21 and weight cancellation device 40' are finely driven by the plurality of voice coil motors 18X and 18Y. Therefore, in the second embodiment, interlinking device 45 previously described is not provided between weight cancellation device 40' and X coarse movement stage 23X.

Further, in the second embodiment, the size of guide main section 102*a* in the Z-axis direction is set the same as the size of X beam 101 in the Z-axis direction. And, as can be seen from FIGS. 9, 10 and 12, guide main section 102*a* is inserted in between the pair of X beams 101. In other words, the Z position (a position in the vertical direction) of X guide 102 and the Z position of Y coarse movement stage 23Y partly overlap each other.

The configuration of other parts of substrate stage device PSTa is similar to substrate stage device PST previously described.

In exposure apparatus 110 configured in the manner described above, when substrate P is moved in the X-axis direction at the time of the X scan operation and the X step operation, at substrate stage PSTa, drive of X coarse movement stage 23X on Y coarse movement stage 23Y, and synchronous drive of fine movement stage 21 with respect to X coarse movement stage 23X are basically performed as in the first embodiment, according to instructions from main controller 50. However, in substrate stage device PSTa, weight cancellation device 40' is not pulled by X coarse movement stage 23X, and weight cancellation device 40' moves in the X-axis direction along with fine movement stage 21. Incidentally, at the time of the X scan operation and the X step operation described above, while there may be a case when fine movement stage 21 is finely driven in the Y-axis direction and the Y position of weight cancellation device 40' changes minutely, the dimension of the width direction of X guide 102 is set so that base pads 44 do not fall off from above X guide 102 even if weight cancellation device 40' is finely driven in the Y-axis direction.

Further, in substrate stage device PSTa, at the time of Y step operation, drive of Y coarse movement stage 23Y and X coarse movement stage 23X in the Y-axis direction, and synchronous drive of fine movement stage 21 with respect to X coarse movement stage 23X are basically performed as in the first embodiment, according to instructions from main controller 50. However, in substrate stage device PSTa, weight cancellation device 40' moves in the Y-axis direction along with fine movement stage 21. In doing so, X guide 102 which supports weight cancellation device 40' from below is synchronously driven with Y coarse movement stage 23Y. Accordingly, weight cancellation device 40' is constantly supported from below by X guide 102.

According to exposure apparatus 110 of the second embodiment described so far, an equivalent effect can be obtained as in exposure apparatus 10 related to the first embodiment previously described. In addition, according to exposure apparatus 110, because the Z position (a position in the vertical direction) of X guide 102 and the Z position of Y coarse movement stage 23Y partly overlap each other, the dimension in the Z-axis direction of weight cancellation device 40' can be made shorted when compared with the case when weight cancellation device 40' is mounted on a guide member that has a wide guide surface. In this case, because the dimension in the Z-axis direction of housing 41 and Z slider 43 can be shortened, the weight of weight cancellation device 40' can be reduced. Further, when the weight of weight cancellation device 40' is reduced, the size of actuators (a plurality of linear motors and a plurality of voice coil motors) used to drive fine movement stage 21 can also be reduced.

Further, because weight cancellation device 40' is vibrationally separated from coarse movement stage 23, vibration travelling from coarse movement stage 23 can be totally eliminated, which improves control performance. Further, by integrating weight cancellation device 40' and fine movement stage 21, the structure becomes simple, which can further reduce the weight of the device as well as cut the production cost, and also reduce the probability of a breakdown. Further, because center of gravity CG of fine movement stage 21 becomes lower due to integrating weight cancellation device 40' and fine movement stage 21, it becomes possible prevent the center of gravity from rising even if the size of substrate holder PH increases.

Further, according to exposure apparatus 110, because X guide 102 which is a member extending in the X-axis direction is supported from below at a plurality of points by the pair of beds 12, this restrains the bending caused by the self-weight of X guide 102 or the load of weight cancellation device 40.

Further, because weight cancellation device 40' is separated from coarse movement stage 23, vibration which occurs when moving weight cancellation device 40 does not travel to X guide 102. Accordingly, vibration does not travel, for example, to the projection optical system via X guide 102, the pair of substrate stages 12, substrate stage mountings 19 and the like, which allows the exposure operation to be performed with high precision.

Third Embodiment

Next, a third embodiment will be described, with reference to FIGS. 14 to 16. Because substrate stage PSTb related to the third embodiment has a configuration that is almost the same as substrate stage PSTa (refer to FIG. 9 and the like) of the second embodiment described above except for the point that the driving method of X guide 102 is different, the same or similar reference numerals will be used for the same or similar sections as in the second embodiment, and a description thereabout will be simplified or omitted.

Figure 15:
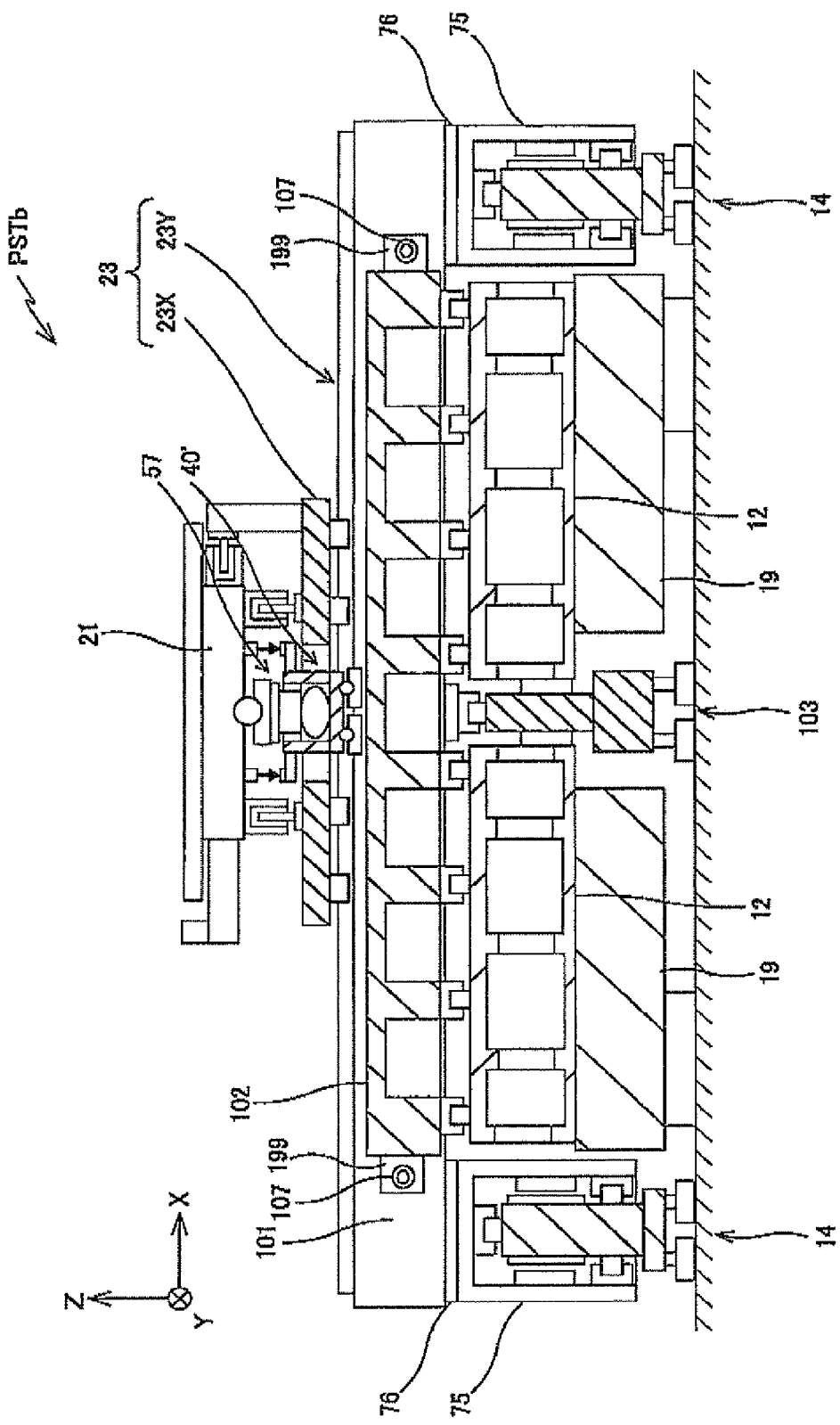
FIG. 15 is a sectional view of line G-G in FIG. 14.
Figure 16:
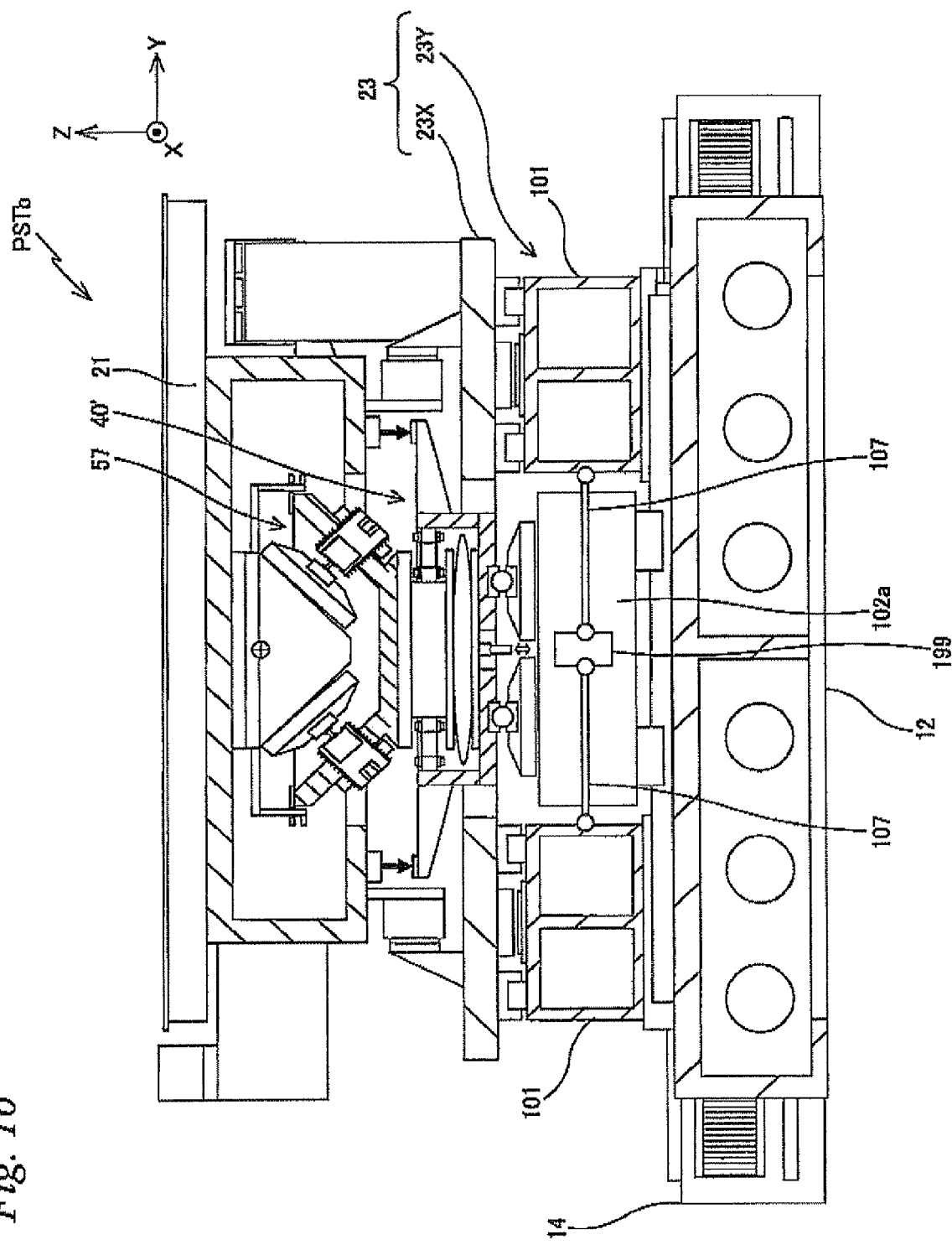
FIG. 16 is a sectional view of the weight cancellation device which the substrate stage device in FIG. 14 has.

While Y carriage 75 was fixed to both side surfaces of X beam 101 in the second embodiment described above, in the third embodiment, Y carriage 75 is fixed to the lower surface of X beam 101 similar to exposure apparatus 10 previously described, as shown in FIG. 15. Therefore, the height of base frame 14 (the same reference code is used for the sake of convenience) is lower when compared with the second embodiment. This allows substrate stage PSTb to be compactly arranged.

Figure 14:
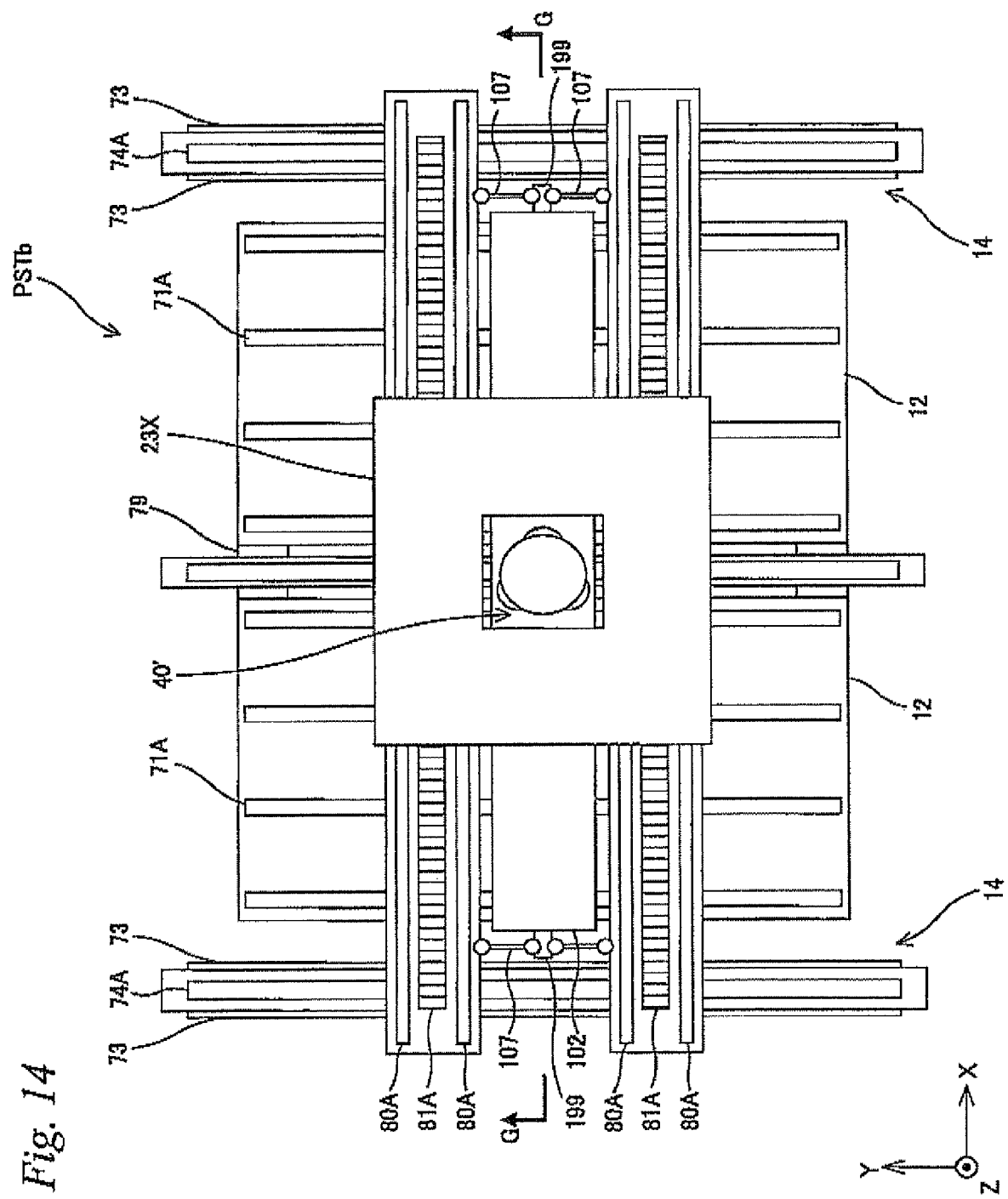
FIG. 14 is a planar view of a substrate stage related to a third embodiment.

Further, while X guide 102 was driven electromagnetically by the pair of Y linear motors 82 in the first and second embodiments described above, in the third embodiment, X guide 102 is connected to X beam 101 mechanically by a device referred to as a pair of flexure devices 107 via a connecting member 199 in the vicinity of both ends in the longitudinal direction as shown in FIG. 14. Incidentally, for the sake of clarity, a pair of plates 76 (refer to FIG. 9) connecting a pair of X beams 101, and fine movement stage 21 (refer to FIG. 8) are not illustrated in FIG. 14.

Each flexure device 107 includes a thin steel sheet (e.g., a flat spring) extending in the Y-axis direction placed parallel to the XY plane, and is built between X beam 101 and X guide 102 via a frictionless joint device such as ball joints. Flexure device 107 connects X beam 101 and X guide 102 in the Y-axis direction with high rigidity by the rigidity of the steel sheet in the Y-axis direction. Accordingly, X guide 102 moves in the Y-axis direction integrally with Y coarse movement stage 23Y, by being pulled by either of the pair of X beams 101 via flexure device 107. On the contrary, because each flexure device 107 does not restrict X guide 102 to X beam 101 in directions of five degree of freedom excluding the Y-axis direction due to the flexibility (or flexibleness) of the steel plate and the operation of the frictionless joint device, vibration hardly travels to X guide 102 via X beam 101. Further, the plurality of flexure device 107 connect the pair of X beams 101 and X guide 102 within a plane of X guide 102 that includes the position of the center of gravity and is parallel to the XY plane. Accordingly, when X guide 102 is pulled, moment in the θx direction does not act on X guide 102.

In substrate stage PSTb in the third embodiment, because a configuration of X beam 101 pulling X guide 102 via flexure device 107 was employed in addition to the effect that can be obtained with substrate stage PSTa in the second embodiment, the cost is lower than in the case, for example, when an actuator is provided to drive X guide 102. Further, measurement systems (e.g., a linear encoder and the like) to obtain positional information of X guide 102 will not be necessary. Further, because the dimension in the X-axis direction of X guide 102 can be shorter when compared with the second embodiment, the cost can be reduced. Furthermore, because the pair of base frames 14 are placed inside on both sides in the X-direction when compared with the second embodiment, the device becomes compact.

Further, because flexure device 107 has a structure (shape and material) whose rigidity is extremely low except for the Y-direction, vibration caused by a force travelling in directions other than the Y direction hardly travels to X guide 102, which makes fine movement stage 21 have good controllability. Even if vibration in the Y-direction intrudes X guide 102, because connection of a force in the horizontal direction is cut off between X guide 102 and weight cancellation device 40' by base pads 44 which are static gas bearing members installed on the lower surface of weight cancellation device 40', the vibration does not affect fine movement stage 21. Further, because connection of a force in the Y direction between X guide 102 and bed 12 is suppressed (the force in the Y direction is released) by a Y linear guide 71A, the force does not affect bed 12 (the main section of the device). Similarly, it is a matter of course that the pair of X beams 101 of substrate stage device PST and X guide 102 related to the first embodiment previously described can be connected, using a pair of flexure devices 107.

Fourth Embodiment

Next, a fourth embodiment will be described, with reference to FIG. 17. Because substrate stage PSTc related to the fourth embodiment has a configuration that is almost the same as substrate stage PSTa (refer to FIG. 9 and the like) of the second embodiment described above except for the point that the driving method of X guide 102 is different, the same or similar reference numerals will be used for the same or similar sections as in the second embodiment, and a description thereabout will be simplified or omitted.

Figure 17:
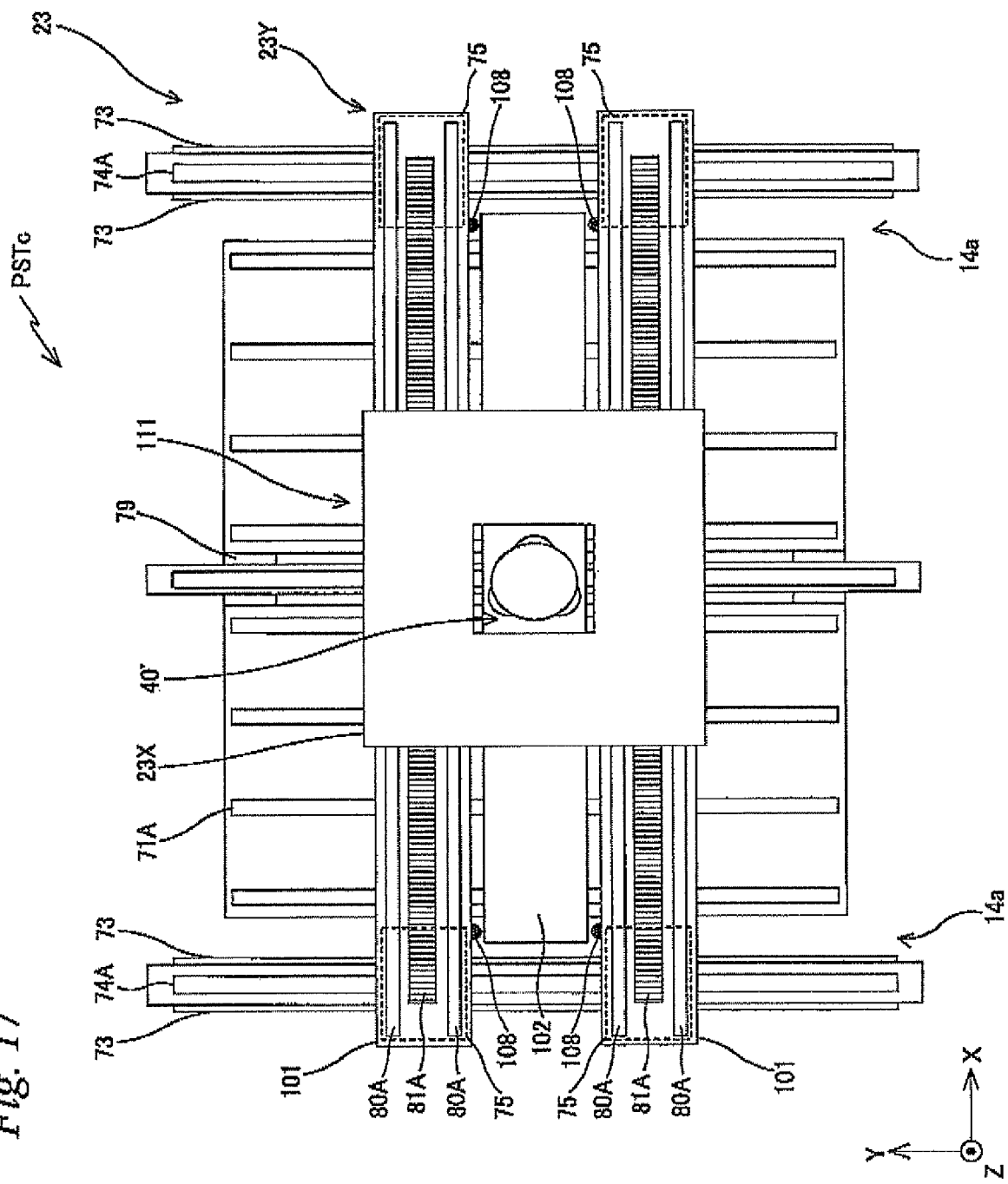
FIG. 17 is a planar view of a substrate stage related to a fourth embodiment.

As shown in FIG. 17, in substrate stage PSTc, each of a pair of X beams 101 has two pusher devices 108 that are spaced apart in the X-axis direction on an opposing surface that face each other. In other words, a total of four pusher devices 108 are provided. Each pusher device 108 has a steel ball which faces the side surface on the +Y side of X guide 102, or the side surface on the −Y side. While the steel ball is normally spaced apart from X guide 102, in substrate stage PSTc, when Y coarse movement stage 23Y is driven in the Y-axis direction, pusher device 108 is pushed, which pushes X guide 102, and this makes Y coarse movement stage 23Y integrally move with X guide 102 in the Y-axis direction. Incidentally, each pusher device 108 does not necessarily have to be provided in X beam 101, and for example, can be installed on the X-axis direction inner side and the Y-axis direction inner side of Y carriage 75 so as to push X guide 102.

Further, in substrate stage PSTc, after Y coarse movement stage 23Y performs a Y step movement of X guide 102 to a predetermined position, Y coarse movement stage 23Y is driven in a direction away from X guide 102 to keep vibration from travelling, and this vibrationally separates the Y coarse movement stage 23Y and X guide 102. As a method of vibrationally separating Y coarse movement stage 23Y and X guide 102, for example, X beam 101 can be finely driven appropriately, or actuators such as air cylinders which are not illustrated that finely drive the steel balls in the Y-axis direction can be provided in pusher device 108. Further, as the pusher device, instead of the steel balls, a spheroid which is rotatable by 90 degrees around the Z-axis or the X-axis can be provided, and by rotating the spheroid appropriately, a gap in the Y-axis direction between X guide 102 and Y coarse movement stage 23Y can be changed (switch between a contact state and a non-contact state according to the rotational amount of the spheroid).

In the fourth embodiment, at the time of exposure operation except for the time when X guide 102 moves in the cross-scan direction, a mechanical connection between X beam 101 and X guide 102 is eliminated, which can completely prevent disturbance from entering X guide 102. Similarly, it is a matter of course that pusher device 108 can be provided in one of the pair of X beams 101 and X guide 102 in substrate stage device PST related to the first embodiment previously described.

Incidentally, the configuration of the substrate stage device equipped in the exposure apparatus of the first to fourth embodiments described above are mere examples, and the configuration is not limited to these. Modified examples of the weight cancellation device and the leveling device which the substrate stage device has will be described below. Incidentally, in the description below, for the sake of simplicity in the description and convenience in illustration, only the leveling device and the weight cancellation device will be described, and for sections having a similar configuration as in the second embodiment described above, the same reference numerals will be used as in the second embodiment described above and a description thereabout will be omitted.

First Modified Example

Figure 18:
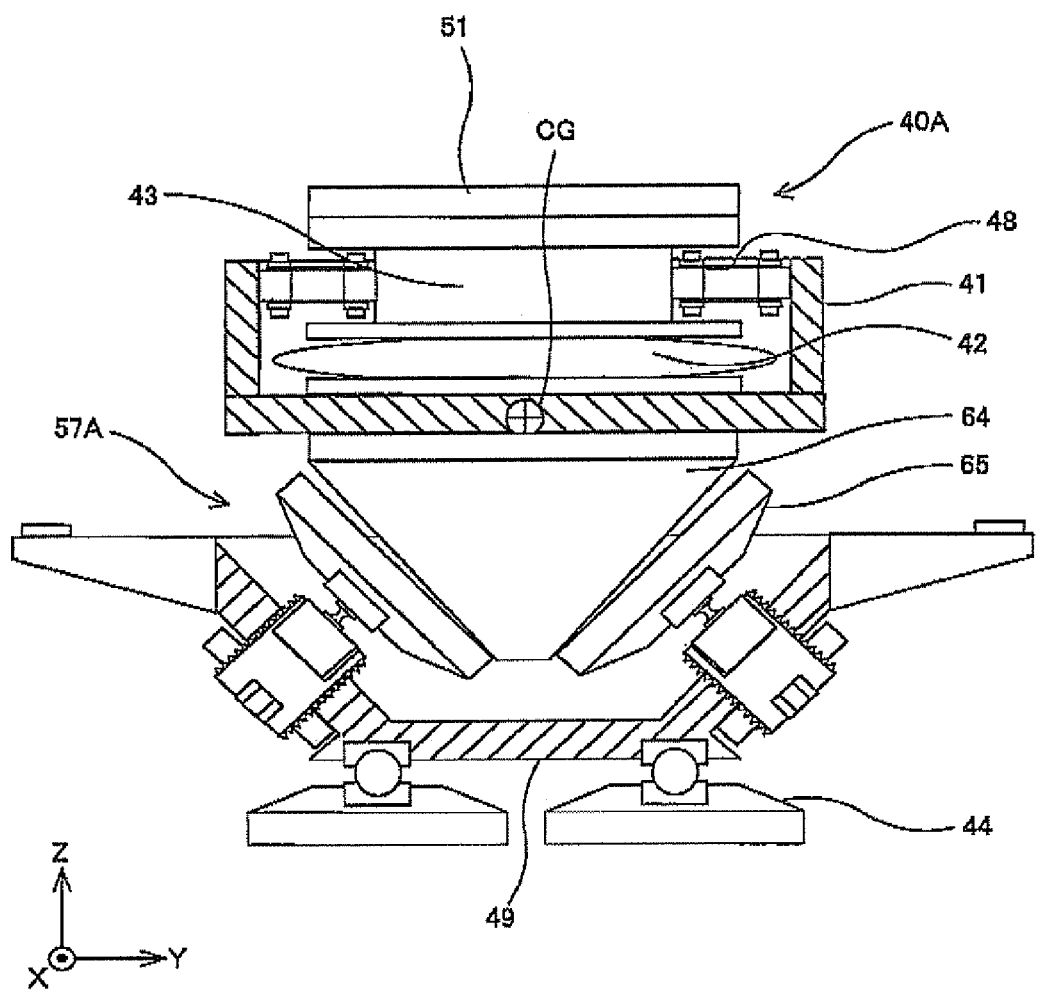
FIG. 18 is a sectional view of a weight cancellation device and a leveling device that the substrate stage device related to a first modified example has.

FIG. 18 shows a weight cancellation device 40A and a leveling device 57A that the substrate stage device related to a first modified example has. In the first modified example, while leveling device 57A and weight cancellation device 40A have a configuration similar to the second embodiment, leveling device 57A is placed so as to support weight cancellation device 40A from below (in other words, the placement of leveling device 57 and weight cancellation device 40' of the second embodiment takes a form of being vertically switched). To be concrete, the lower surface of housing 41 is connected to the upper surface of polyhedron member 64. Further, although it is omitted in FIG. 18, the upper surface of Z slider 43 of weight cancellation device 40A is fixed to fine movement stage 21 via spacer 51.

In the substrate stage device related to the first modified example, the controllability is improved compared with each of the embodiments described above, by providing weight cancellation device 40A above of leveling device 57A so that components between polyhedron member 64 and base pad 44 are reduced, the weight is reduced, and the inertial mass lower than polyhedron member 64 (from polyhedron member 64 to base pad 44) decreases at the time of horizontal movement such as at the time of scanning, and since the position of the center of gravity nears the driving point (a point where polyhedron member 64 and air bearing 65 come into contact), rigidity in the θx and θy directions increases (becomes stronger to vibration).

Second Modified Example

Figure 19:
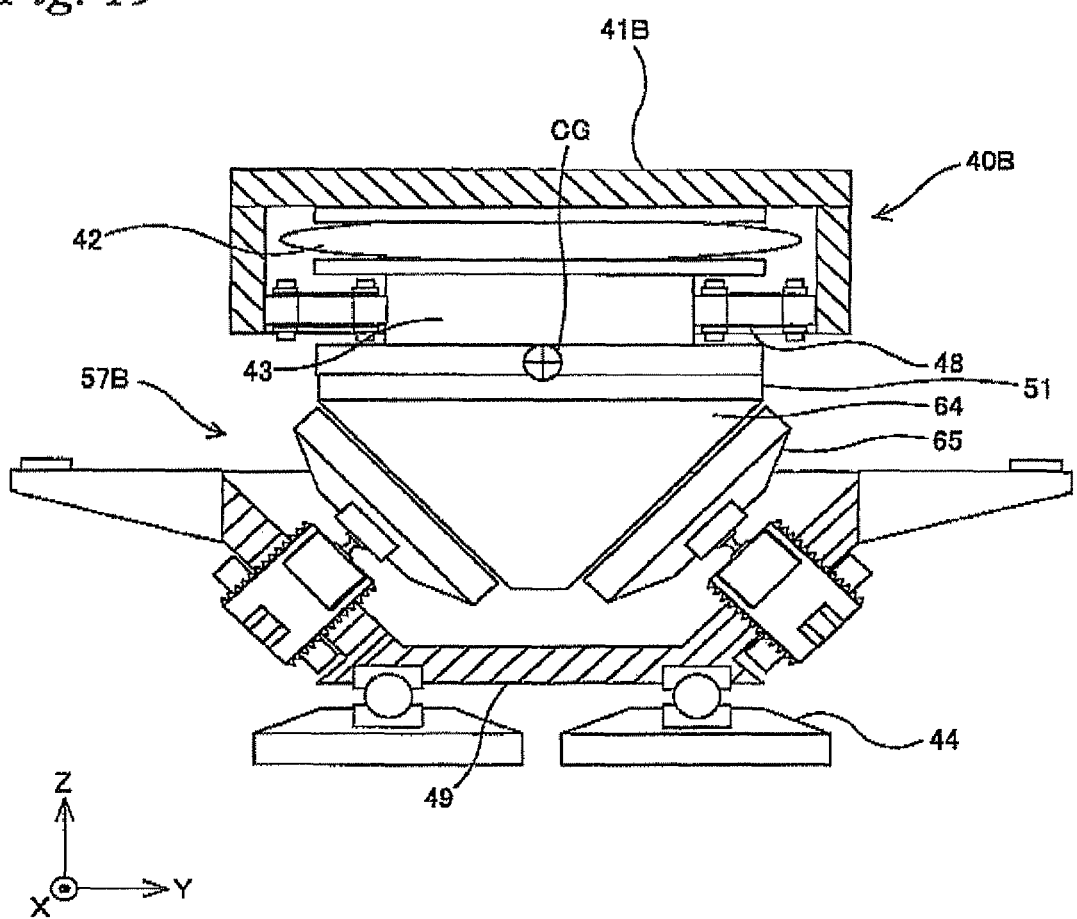
FIG. 19 is a sectional view of a weight cancellation device and a leveling device that the substrate stage device related to a second modified example has.

FIG. 19 shows a weight cancellation device 40B and a leveling device 57B that the substrate stage device related to a second modified example has. The second modified example is configured similar to the first modified example (refer to FIG. 18), except for vertically switching the position of air spring 42 and Z slider 43 (with parallel plate spring device 48). In weight cancellation device 40B, housing 41B consists of a cylinder-like member whose lower surface is open and has a bottom, and the upper surface of housing 41B is integrally fixed to fine movement stage 21 (not illustrated in FIG. 19).

In the substrate stage device related to the second modified example, in addition to the effect obtained in the first modified example, because the position of parallel plate spring device 48 becomes lower and is arranged at a position closer to the center of gravity of weight cancellation device 40B, the stability of the exposure operation improves.

Third Modified Example

Figure 20:
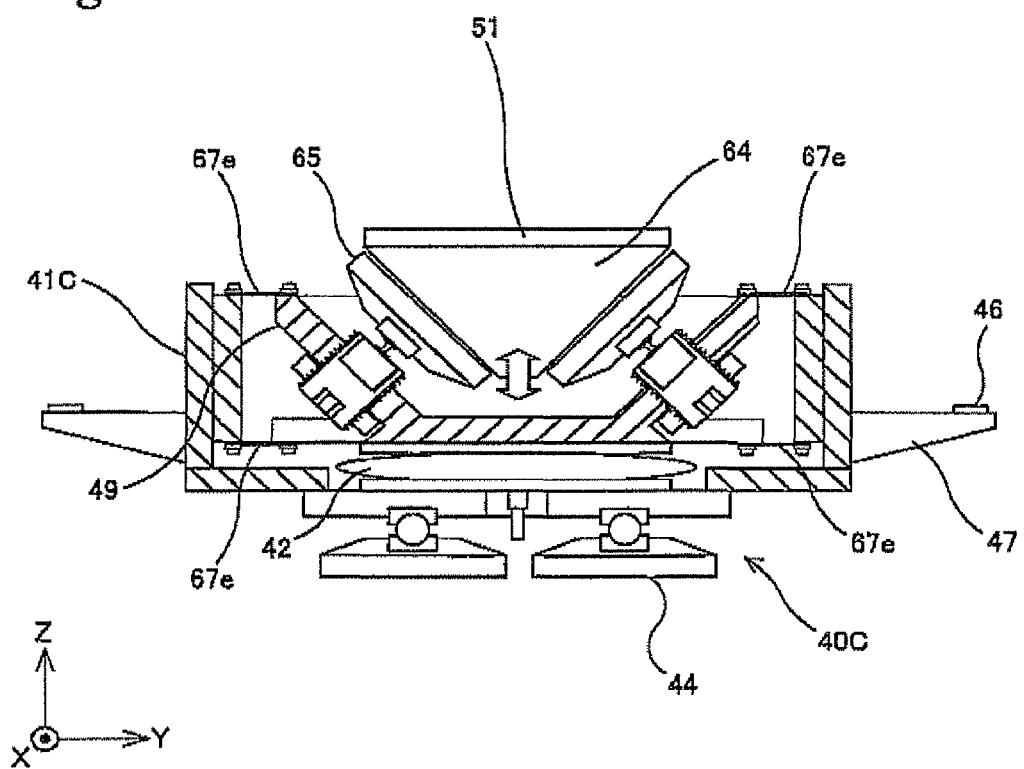
FIG. 20 is a sectional view of a weight cancellation device and a leveling device that the substrate stage device related to a third modified example has.

FIG. 20 shows a weight cancellation device 40C that the substrate stage device related to a third modified example has. Weight cancellation device 40C is configured of a body 41C which is a cylinder-like member whose upper surface is open and has a bottom, an air spring 42 housed inside body 41C, a leveling cup 49 connected to the upper surface of air spring 42, a plurality of air bearings 64, a polyhedron member 64 which is fixed to a fine movement stage 21 that is not illustrated and the like. In the third modified example, the Z slider is removed, and a configuration in which the lower surface of leveling cup 49 is pushed in the Z-axis direction directly by air spring 42 is employed. To the outer wall surface of body 41C, a plurality of arm members 47 are fixed to support a target 46.

Adding to the roles similar to the ones described in the second embodiment described above, leveling cup 49 also plays the role of Z slider 43 (refer to FIG. 13) in the second embodiment and the like described above. Therefore, on the upper end surface and lower end surface of the outer periphery of leveling cup 49, a plurality of (e.g., four each on the upper end surface, the lower end surface, and evenly in the circumferential direction) parallel plate springs 67e are connected (however, parallel plate spring 67e placed on the ±X side is not illustrated so as to avoid intricacy of the drawings). This restricts relative movement of leveling cup 49 in the horizontal direction with respect to body 41C, and only a vertical slide becomes possible.

In the substrate stage device related to the third modified example, because the Z slider will not be necessary, the configuration of weight cancellation device 40C becomes more simple, which allows the substrate stage device to be lighter and to be manufactured at a lower cost when compared with each of the embodiments described above.

Further, because the proximity of the upper and lower end surfaces of leveling cup 49, which is relatively large in size and the dimension in the Z-axis direction is large among the components installed below polyhedron member 64 and are oscillated (vibrated) at the time of operation, is connected by parallel plate springs 67e so that leveling cup 49 cannot move relatively in the horizontal direction with respect to body 41C, the rigidity of the lower section in the θx and θy directions of polyhedron member 64 becomes higher, which suppresses the oscillation of the components installed below polyhedron member 64 caused by the inertia at the time of horizontal movement, and improves the controllability.

Further, because leveling cup 49 moves only in the Z direction while maintaining high straightness with respect to body 41C by the operation of parallel plate spring 67e, the bottom surface of leveling cup 49 does not have to be fixed to the upper surface (metal plate) of air spring 42, which makes the assembling and disassembling easy, improving the workability.

Further, because the Z-axis direction drive by air spring 42 and the leveling drive (θx, θy) by polyhedron member 64 can be controlled independently (do not interfere), controllability is good.

Incidentally, weight cancellation device 40A to 40C related to each of the modified examples described above is not limited to an XY two-axis stage, and can also be applied to an X-axis (or a Y-axis) single axis stage, or a conventional XY two-axis stage in which a Y coarse movement stage is mounted on an X coarse movement stage.

Further, in the second to fourth embodiments described above (and each of the modified examples described above), while Z slider 43 or leveling cup 49 of the weight cancellation device were movable only in the Z-axis direction by placing a plurality of parallel plate spring devices 48, beside this, for example, air bearings or rolling guides can also be used.

Further, in the second to fourth embodiments (and each of the modified examples described above) described above, while the configuration was employed in which X coarse movement stage 23X was mounted on Y coarse movement stage 23Y, as well as this, when focusing only on reducing the size of weight cancellation device 40 and integrating weight cancellation device 40 with fine movement stage 21, coarse movement stage 23Y can be mounted on X coarse movement stage 23X as in the conventional device. In this case, weight cancellation device 40 performs a step movement in the Y-axis direction on a member (tentatively called a Y-guide) which is X guide 102 used in the embodiment but is placed so that the longitudinal direction is in the Y-axis direction, and further in the X-axis direction which is the scanning direction, the whole Y guide moves.

Figure 22:
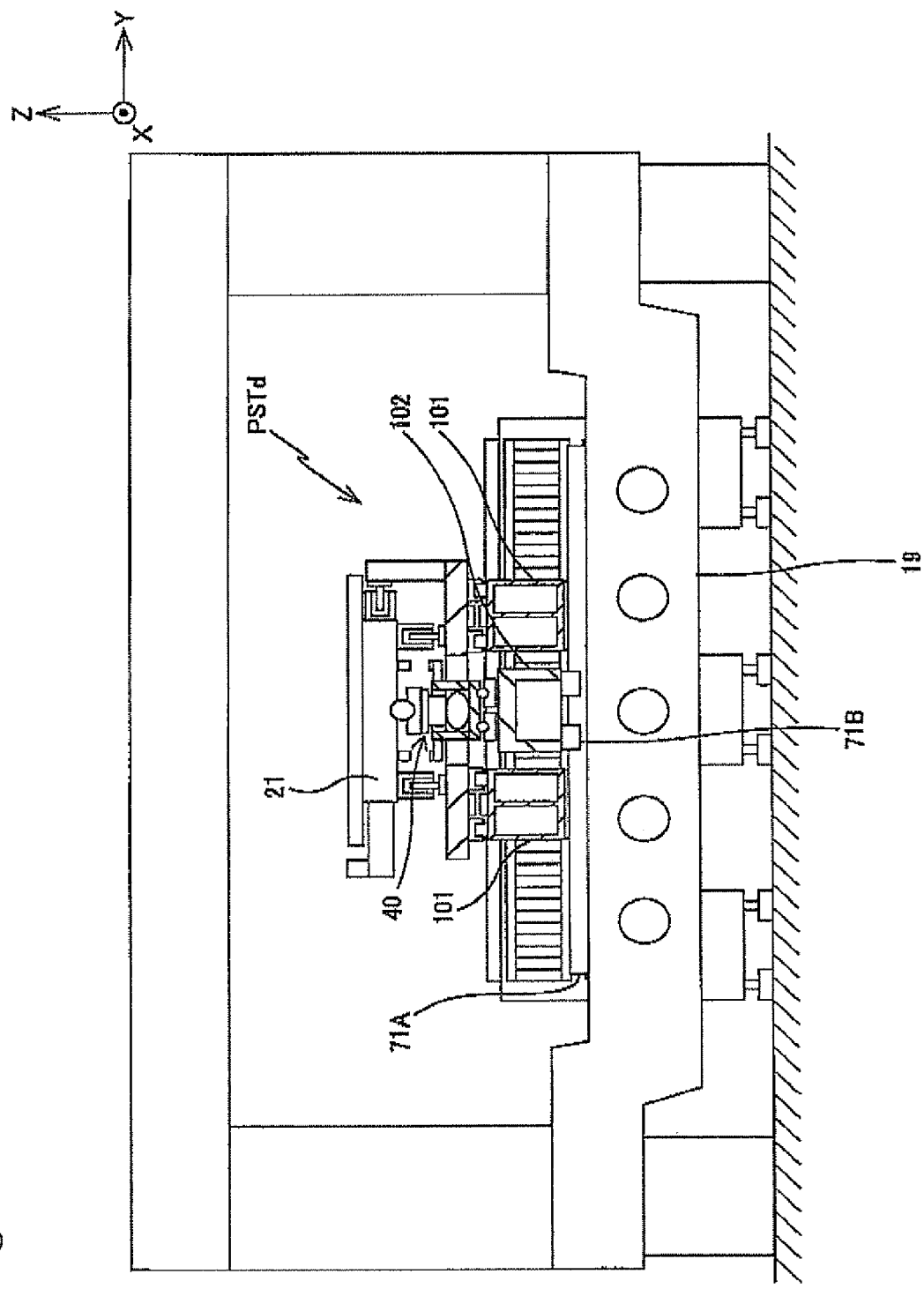
FIG. 22 is a view that shows other modified examples of the substrate stage.

Further, in the second to fourth embodiments (and each of the modified examples described above) described above, while X guide 102 is installed on substrate stage mountings 19 which are apart of the main section (body) of the apparatus via the pair of beds 12, as well as this, a plurality of Y linear guides 71A can be fixed directly on substrate stage mountings 19 as in substrate stage PSTd shown in FIG. 22. This allows bed 12 (refer to FIG. 8) to be omitted, which further reduces the weight of the whole exposure apparatus, and furthermore decreases the overall height (dimension in the Z-axis direction). The same applies to the first embodiment described above.

Further, in each of the first embodiment or the fourth embodiment described above (and each of the modified examples described above), while X guide 102 was supported from below by two beds 12, as well as this, the number of beds 12 can be three or more. In this case, auxiliary guide frame 103 arranged in between adjacent beds 12 can be increased. Further, in the case the movement amount in the X-axis direction of substrate P is small (or when substrate P itself is small), the number of beds 12, can be one. Further, as for the shape of bed 12, length of the Y-axis direction was set than the length of the X-axis direction for a long time, but length of the X-direction may be longer without being limited to this. Furthermore, the plurality of beds can be placed apart in the X-axis and/or the Y-axis direction.

Further, in the case the bending of X guide 102 is small enough to be ignored, auxiliary guide frame 103 does not have to be installed.

Further, in the embodiment described above, while the configuration in which the plurality of Y linear guides 71A are fixed on the pair of beds 12 and X guide 102 moves thereon in the Y-direction along Y linear guides 71A is employed, as well as this, for example, a plurality of static gas bearings or rollers can be provided on the lower surface of X guide 102 so that X guide 102 can move over beds 12 with low friction. However, to maintain the distance constant between Y mover 72A and Y stator 73, it is desirable to have some kind of a device that limits the movement of X guide 102 in the X-axis direction with respect to the pair of beds 12. As the device to limit the movement of X guide 102 in the X-axis direction, for example, a static gas bearing or a mechanical single axis guide can be used. By this arrangement, the position adjustment operation to place the plurality of Y linear guides 71A parallel to each other will not be required, which makes assembly of the substrate stage device easy.

Further, a device (clearance device) which makes X guide 102 and Y slider 71B relatively movable in the X-axis direction by a minimal distance can be provided, for example, in between X guide 102 and Y slider 71B. In this case, even if the plurality of Y linear guides 71A are not placed parallel to each other, X guide 102 can advance smoothly straight in the Y-axis direction on a plurality of Y linear guides 71A. As the device which makes X guide 102 and Y slider 71B relatively movable in the X-direction, for example, a hinge device can be used. A similar clearance device can also be provided in other linear guides devices. Further, in a similar manner, a device which makes the pair of X beams 101 and Y carriage 75 relatively movable by a minimal distance in the X-axis direction can be provided. In this case, even if the pair of base frames 14 are not placed collimated, the pair of X beams 101 can advance smoothly straight in the Y-axis direction.

Figure 21A:
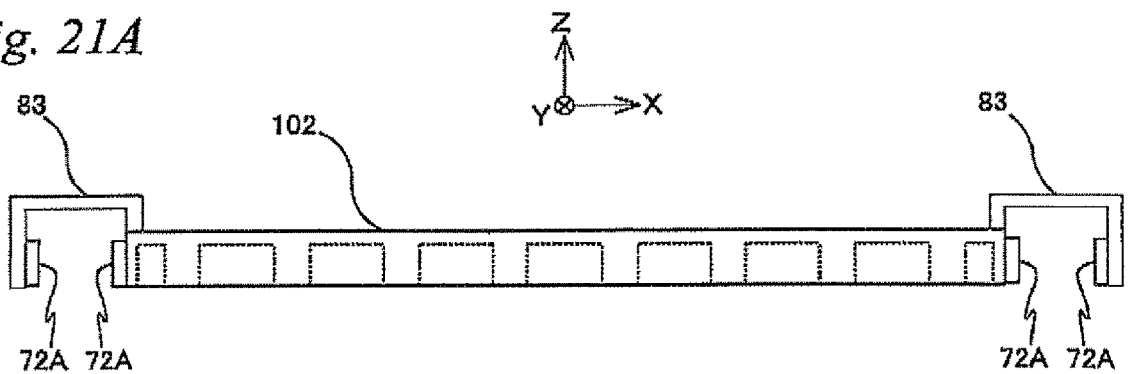
FIG. 21A shows a modified example of an X guide.

Further, as shown in FIG. 21A, in the first and second embodiments described above, a pair of Y carriage 83 which has a J shape and a reversed J-shape in the XZ section, respectively, can be attached to both of the ends of X guide 102, and Y mover 72A can further be fixed to each of the Y carriages 83. In this case, a magnetic attractive force between the magnet unit that Y stator 73 (refer to FIGS. 1 and 8) has and the coil unit that Y mover 72A has acts equally on base frame 14, which prevents a slant of base frame 14. Further, thrust to drive X guide 102 also improves. Incidentally, in the first and second embodiments described above, while the plurality of linear motors are all motors using a moving coil method, as well as this, motors that use a moving magnet method can also be used. Further, in the embodiments other than the second embodiment described above, the drive device used to drive Y carriage 75 in the Y-axis direction is not limited to a linear motor, and a ball screw type drive device, a belt type drive device, or a rack and pinion type drive device can also be used.

Further, in the first and second embodiments above, while Y stator 73 (refer to FIGS. 1 and 8) fixed to base frame 14 was used in common by the Y linear motor used to drive X guide 102 and the Y linear motor used to drive Y coarse movement stage 23Y, each of the Y linear motors can be configured separately. Further, the Y stator of the Y linear motor used to drive Y coarse movement stage 23Y can be fixed to auxiliary guide frame 103, and the Y mover can be attached to auxiliary carriage 78.

Further, in the first and second embodiments described above, while both of the ends in the X-direction of the pair of X beams 101 were mechanically connected, for example, by plate 76, as well as this, for example, the ends can be connected also by a member that has a cross sectional area about the same as X beam 101. Further, the Z-axis dimension of X guide 102 (guide main section 102a) can be larger than the Z-axis dimension of each of the pair of X beams 101. In this case, the Z-axis dimension of weight cancellation device 40 can be made shorter.

Further, in the first and second embodiments described above, for example, while two (a total of 4) Y carriages 75 were provided on the +X side and the −X side of Y coarse movement stage 23Y, respectively, as well as this, for example, one Y carriage 75 can be provided, on the +X side and the −X side of Y coarse movement stage 23Y, respectively. In this case, if the length of Y carriage 75 is equal to plate 76, plate 76 will not be necessary. Incidentally, in the Y carriage in this case, a notch into which Y mover 72A attached to both ends in the X-axis direction of X guide 102 is inserted is formed.

Further, in each of the embodiments described above, while the pair of X beams 101 were mechanically connected, as well as this, the pair of X beams 101 can be mechanically separated. In this case as well, each of the pair of X beams 101 can be synchronously controlled.

Figure 21B:
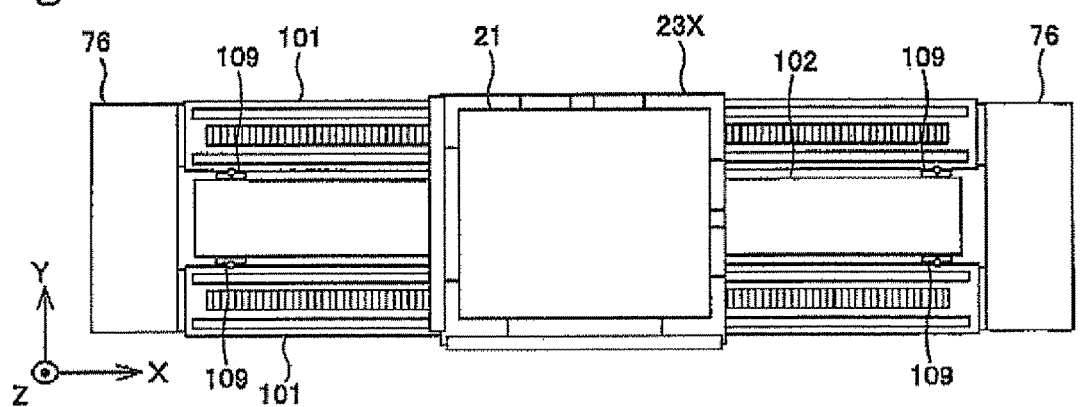
FIGS. 21B and 21C show a substrate stage device related to other modifications.
Figure 21C:
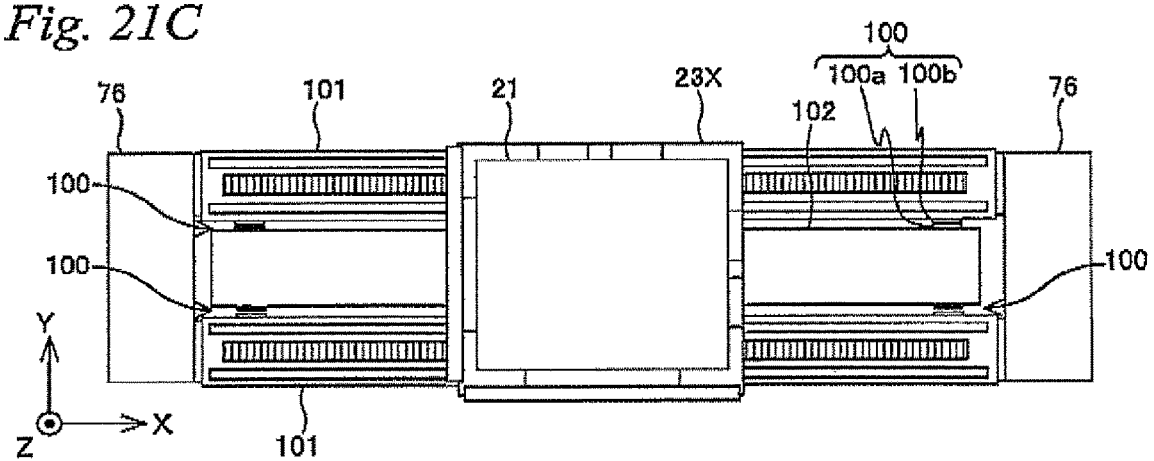

Further, in the fourth embodiment described above, while X guide 102 was pushed in a contact state to X beam 101 via pusher device 108, as well as this, a configuration where X guide 102 is pushed to X beam 101 in a non-contact state can be employed. For example, as shown in FIG. 21B, a thrust type air bearing 109 (an air pad) should be attached to X beam 101 (or X guide 102), and X guide 102 should be pushed in a non-contact manner by the static pressure of the gas blowing out from the bearing surface. Or, as shown in FIG. 21C, permanent magnets 100a and 100b (a pair of permanent magnets 100) can be attached to X beam 101 and X guide 102, respectively, so that the magnetic pole of the part opposing each other becomes the same, and X guide 102 can be pushed in a non-contact manner by a repulsive force (repulsion) that occurs between the opposing magnets. In the case of using such a pair of permanent magnets 100, the configuration of the device becomes simple because pressurized gas, electricity and the like do not have to be supplied. A plurality of (e.g., two) both the thrust type air bearings 109 and the pair of permanent magnets 100 described above should be provided distanced apart in the X-axis direction, each in between X beam 101 and X guide 102 on the +Y side and X beam 101 and X guide 102 on the −Y side.

Fifth Embodiment

Next, a fifth embodiment will be described, referring to FIGS. 23 to 28.

Except for the point that a substrate stage device PSTe is provided instead of substrate stage device PST in the exposure apparatus related to the fifth embodiment, the exposure apparatus is configured similar to exposure apparatus 10 of the first embodiment.

The description below will be focusing mainly on substrate stage device PSTe. Herein, the same or similar reference signs are used for the components that are the same as or similar to those in exposure apparatus 10 related to the first embodiment previously described, and the description thereabout is simplified or omitted.

Figure 23:
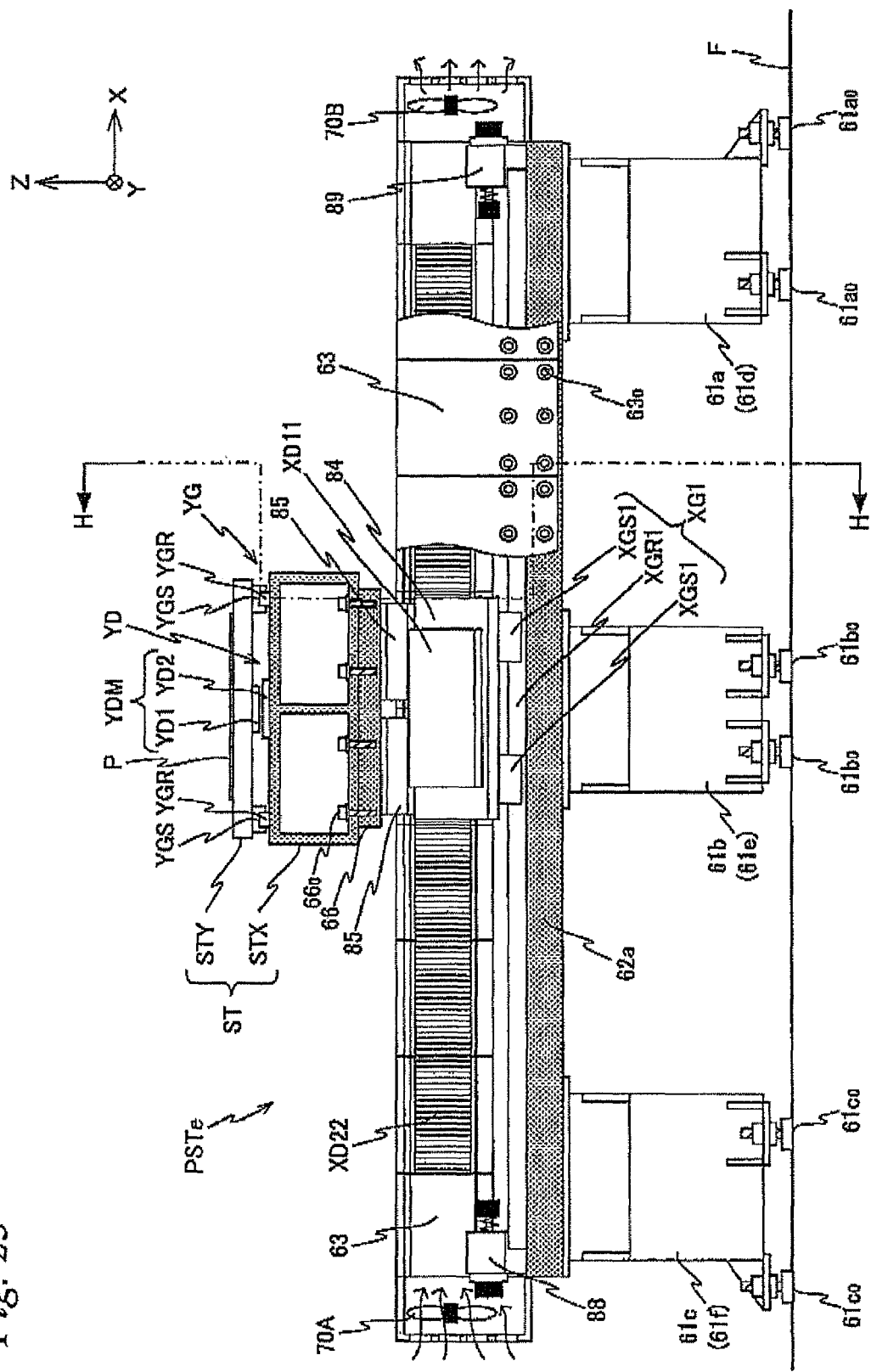
FIG. 23 is a side view showing a schematic configuration of a stage device equipped in an exposure apparatus related to the fifth embodiment.
Figure 24:
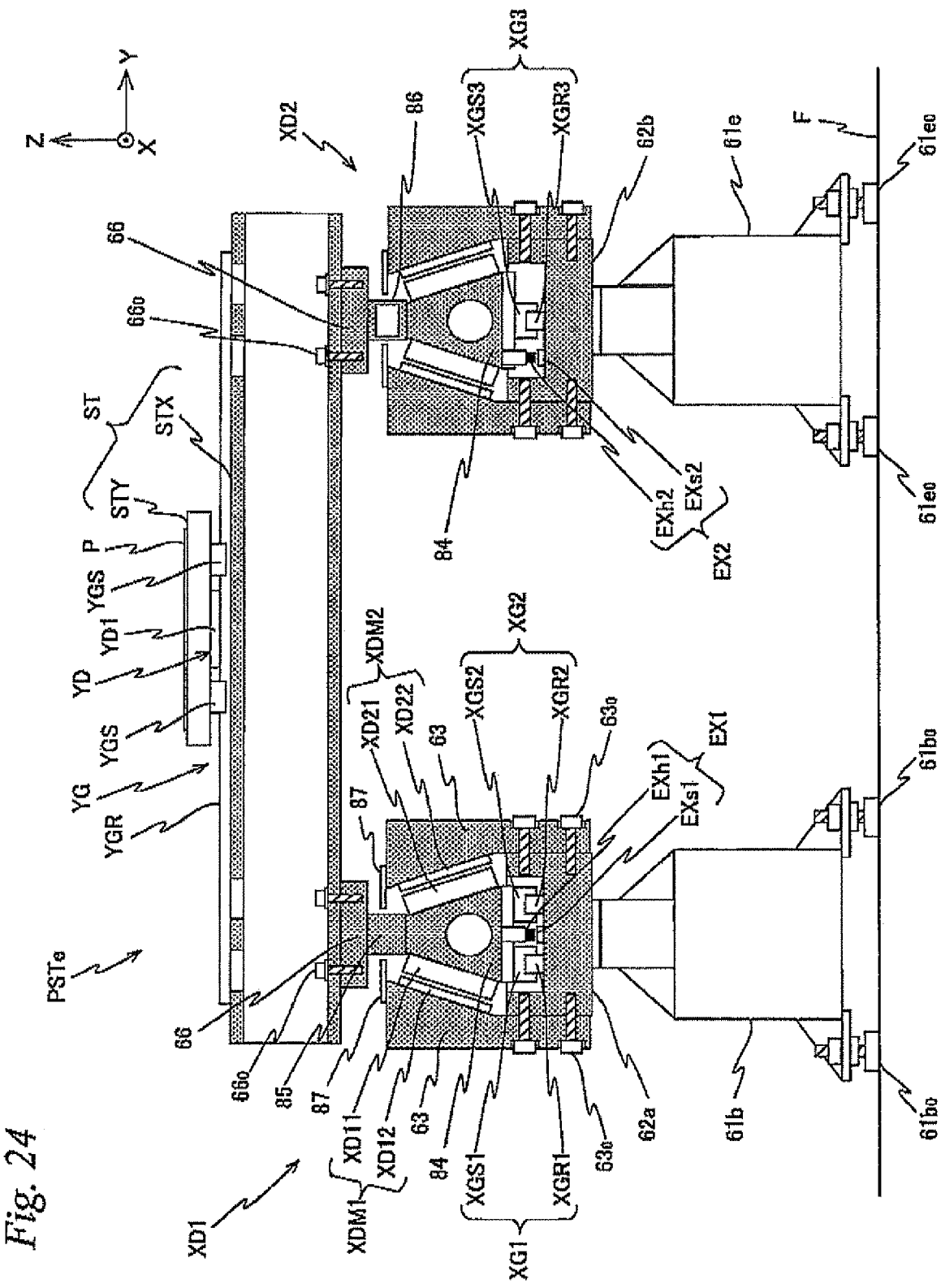
FIG. 24 is a sectional view of line H-H in FIG. 23.

In the exposure apparatus related to the fifth embodiment, instead of the substrate stage having a coarse/fine movement configuration previously described, as is shown in FIGS. 23 and 24, a substrate stage device PSTe is used, which is equipped with a so-called gantry type two-axis stage (substrate stage) ST that has a joist (beam) shaped X stage STX which moves in the X-axis direction whose longitudinal direction is in the Y-axis direction and a Y stage STY that holds substrate (plate) P on X stage STX and moves in the Y-axis direction. Although it is not illustrated, substrate stage device PSTe is placed below (on the −Z side) projection optical system PL (not illustrated in FIGS. 23 and 24, refer to FIG. 1) as in substrate stage device PST previously described.

Figure 25:
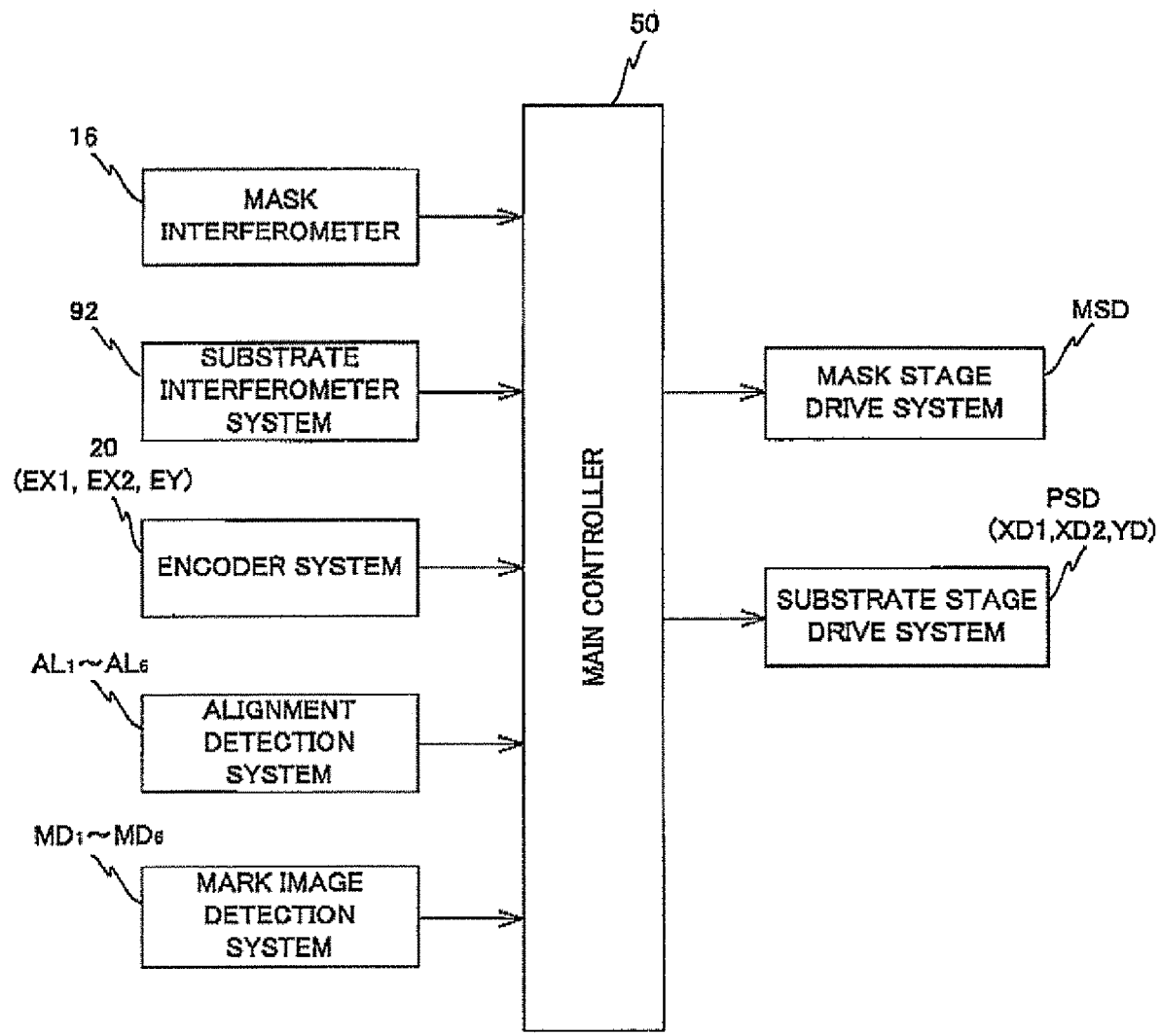
FIG. 25 is a block diagram used to explain an input/output relation of a main controller equipped in the exposure apparatus of the fifth embodiment.

Substrate stage device PSTe is equipped with a substrate stage ST and a substrate stage drive system PSD (not illustrated in FIGS. 23 and 24, refer to FIG. 25) which drives substrate stage ST. As shown in FIGS. 24 and 25, substrate stage drive system PSD is equipped with a pair of X-axis drive units XD1 and XD2 that drive X stage STX in the X-axis direction, and a Y-axis drive unit YD which drives Y stage STY on X stage STX in the Y-axis direction. Y stage STY holding substrate P is driven in predetermined strokes in an X-axis direction and the Y-axis direction by substrate stage drive system PSD.

Specifically, as shown in FIGS. 23 and 24, substrate stage device PSTe is equipped with a total of six leg sections $61a$ to $61f$ installed alongside in the XY two-dimensional direction on floor surface F in the clean room where the exposure apparatus is installed, two base blocks $62a$ and $62b$ supported by three each of the leg sections $61a$ to $61c$, and $61d$ to $61f$, the pair of (two) X-axis drive units XD1 and XD2 provided in the two base blocks $62a$ and $62b$, respectively, X stage STX driven in the X-axis direction by the two X-axis drive units XD1 and XD2, Y-axis drive unit YD provided on X stage STX, and Y stage STY driven in the Y-axis direction by Y-axis drive unit YD and the like.

As shown in FIG. 23, leg sections $61a$ to $61c$ are placed at a predetermined distance in the X-axis direction. Similarly, leg sections $61d$ to $61f$ are each placed at a predetermined distance in the X-axis direction, on the +Y side (in the depth of the page surface in FIG. 23) of each of the leg sections $61a$ to $61c$. To each of the bottom sections of leg sections $61a$ to $61f$, four each of adjustment tools $61a_0$ to $61f_0$ are provided. As it can be seen from FIGS. 23 and 24, for example, in leg sections $61b$, two each of adjustment tools $61b_0$ are provided in the bottom section on the ±Y side surface.

Leg sections $61a$ to $61c$ and $61d$ to $61f$ support base blocks $62a$ and $62b$ that are placed parallel to each other by a predetermined distance in the Y-axis direction, respectively, with the X-axis direction serving as the longitudinal direction. Base blocks $62a$ and $62b$ are supported parallel to a plane orthogonal to the earth's axis (direction of gravitational force), also at the same height from floor surface F, for example, by being appropriately adjusted by adjustment tools $61a_0$ to $61f_0$ provided in each of the leg sections $61a$ to $61f$ using a level.

As shown in FIG. 24, X-axis drive units XD1 and XD2 are provided in base blocks $62a$ and $62b$, respectively. X-axis drive units XD1 and XD2 support the −Y end and the +Y end of X stage STX from below, respectively, and drives X stage STX in the X-axis direction.

As is shown in FIGS. 23 and 24, one of the X-axis drive unit XD1 (on the −Y side) includes a plurality of fixed members 63 and one movable member 84, a pair of linear motors XDM1 and XDM2 which generate a drive force in the X-axis direction, a pair of guide devices XG1 and XG2 that limit the movement of X stage STX in directions other than the X-axis direction, a linear encoder EX1 (refer to FIG. 25) which measures the position of the movable member (X stage STX) in the X-axis direction with respect to fixed member 63 (base block $62a$).

Figure 26:
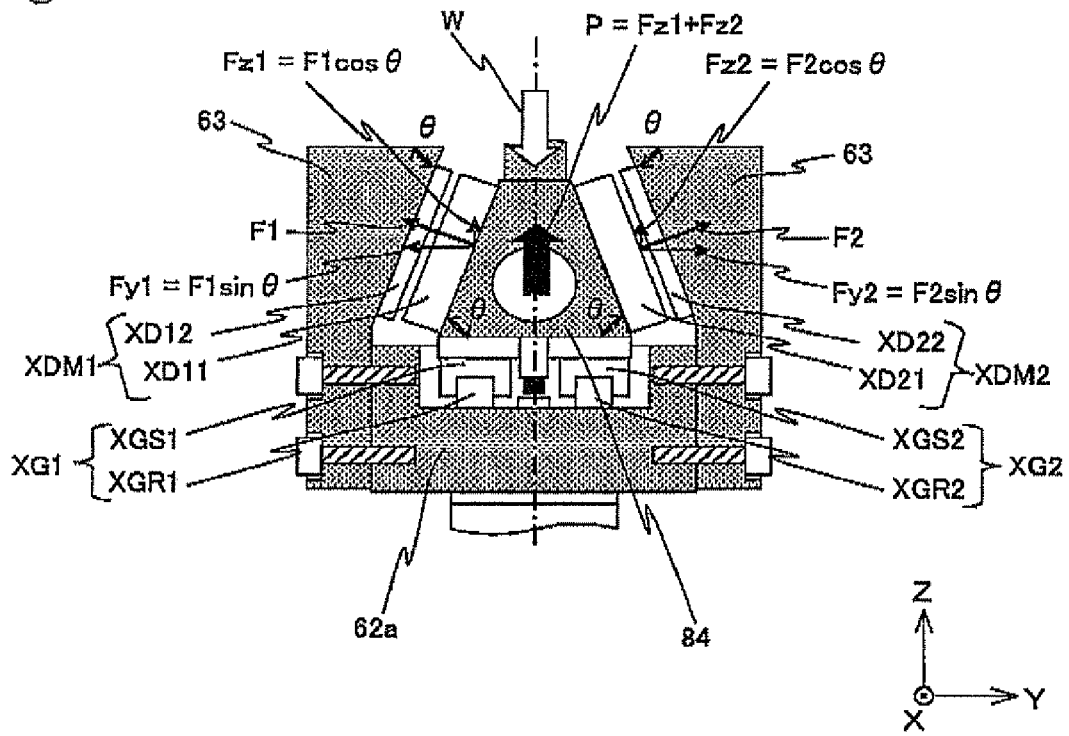
FIG. 26 is a sectional view showing a schematic configuration of a single axis drive unit which configures a stage drive system.

As shown in FIGS. 23 and 24, at the edge on the ±Y sides of base block $62a$, a plurality of (10 each in the present embodiment) fixed members 63 are each fixed alongside in the X-axis direction. Incidentally, for the sake of clarity, in FIG. 23, a part of the plurality of fixed members 63 (including a stator XD12 which will be described later on) on the −Y side is not illustrated, or is shown in a partially broken view. Each fixed member 63 is fixed to a side surface of base block $62a$ using a fixture (bolt) $63_0$ whose −Z edge is a fastener. In this case, the inner side surface of each fixed member 63 is tilted (forms an angle θ with respect to the XY plane) inward by an angle π/2−θ with respect to the XZ plane, as shown in FIG. 26. As a result, the YZ sectional shape of a member which is a combination of base block $62a$ and fixed member 63 is a rough U shape (however, the distance between a pair of opposing surfaces is smaller on the +Z side (opening side) than the −Z side).

As shown in FIG. 24, movable member 84 consists of a prismatic member having a YZ section of a isosceles trapezoidal shape, and is placed so that its upper surface and lower surface is horizontal (parallel to the XY plane) and the longitudinal direction is in the movable direction (the X-axis direction). Movable member 84 is attached to a stationary plate 66 fixed by fixture (bolt) $66_0$ to the lower surface (the −Z surface) of X stage STX in the vicinity of the −Y edge, via a riser (rising) block 85 that has a rectangular YZ section and is fixed on the upper surface of movable member 84.

Movable member 84 is placed in a space formed by base block $62a$ and fixed member 63. In this case, the ±Y side surface of movable member 84 is tilted (forms an angle θ with respect to the XY plane) by an angle π/2−θ with respect to the XZ plane. In other words, the surface on the +Y side of movable member 84 is parallel to and faces the surface on the −Y side of fixed member 63 on the +Y side by a predetermined distance, and the surface on the −Y side of movable member 84 is parallel to and faces the surface on the +Y side of fixed member 63 on the −Y side by a predetermined distance. Movable member 84 has a hollow structure so as to reduce its weight. Incidentally, the ±X ends of movable member 84 do not necessarily have to be parallel. Further, the YZ section does not necessarily have to be a trapezoidal shape. Further, if the surface where movers XD11 and XD21 which will be described later are fixed to is shaped tilted by an angle π/2−θ with respect to the XZ plane (the Z-axis), corners of movable member 84 can be chamfered.

As shown in FIG. 24, linear motor XDM1 is configured of a mover XD11 and a stator XD12, and linear motor XDM2 is configured of mover XD21 and stator XD22.

As shown in FIG. 24, the pair of stators XD12 and XD22 described above are fixed to the inner side surface of fixed members 63 on the ±Y side, respectively, and are provided extending (stator XD12 is not illustrated in FIG. 23) in the X-axis direction as shown in FIG. 23. Incidentally, as shown in FIG. 23, stators XD12 and XD22 (stator XD12 is not illustrated in FIG. 23) are not fixed to fixed members 63 located outermost on the +X side and −X side. The pair of movers XD11 and XD21 described above are fixed to both side surfaces on the ±Y side of movable member 84, respectively, and movers XD11 and XD21 face stators XD12 and XD22 which are fixed to fixed members 63 where both side surfaces faces and the Z-axis (XZ plane), with a slight gap in a direction where an angle θ is made.

Further, although it is not illustrated, inside each of the movers XD11 and XD21, a plurality of coil units (including a plurality of coils that are each wrapped around a core (iron core)) are arranged in the X-axis direction. Inside each of the stators XD12 and XD22, a plurality of magnet units (each including a plurality of permanent magnets) are arranged in the X-axis direction. In the fifth embodiment, mover XD11 and stator XD12 configure a moving coil type linear motor XDM1, and mover XD21 and stator XD22 configure a moving coil type linear motor XDM2.

Guide device XG1 includes an X-axis linear guide (rail) XGR1 and two sliders XGS1 as shown in FIGS. 23 and 24. Similarly, guide device XG2 includes an X-axis linear guide (rail) XGR2 and two sliders XGS2.

Specifically, a groove of a predetermined depth is provided extending in the X-axis direction on the upper surface of base block 62a, and from the center in the Y-axis direction of the inner bottom surface of the groove section at a position spaced apart at substantially the same distance on the ±Y sides, X-axis linear guides XGR1 and XGR2 that extend in the X-axis direction are fixed parallel to each other. Two each of sliders XGS1 and XGS2 are fixed to the lower surface of movable member 84, at positions facing X-axis linear guides XGR1 and XGR2, respectively. In this case, sliders XGS1 and XGS2 have an inverted U-shaped section, while the two sliders XGS1 on the −Y side engages with X-axis linear guide XGR1, the two sliders XGS2 on the +Y side engages with X-axis linear guides XGR2. In the vicinity of the ±X ends of each of the X-axis linear guides XGR1 and XGR2, as shown in FIG. 23, stopping devices 88 and 89 are provided to prevent an overrun of X stage STX.

As shown in FIG. 24, linear encoder EX1 includes a head EXh1 and a scale EXs1. On the surface of scale EXs1, a reflection diffraction grating is formed whose periodic direction is in the X-axis direction, and is provided extending in parallel with X-axis linear guides XGR1 and XGR2 in the center in the Y-axis direction of the inner bottom surface of the groove of base block 62a. Head EXh1 is provided on the lower surface (or the side surface on the +X side (or the −X side)) of movable member 84. Head EXh1 faces scale EXs1 within the movement strokes of movable member 84 (X stage STX) in the X-axis direction, irradiates a measurement light on scale EXs1, and by receiving the reflection diffraction lights from scale EXs1, measures positional information in the X-axis direction of movable member 84 (the −Y end of X stage STX) with respect to base block 62a. The measurement results are transmitted to main controller 50 (refer to FIG. 25).

The other (on the +Y side) X-axis drive unit XD2 is configured almost the same as X-axis drive unit XD1 described above. However, movable member 84 included in X-axis drive unit XD2 is attached to stationary plate 66 using fixture 66₀ on the lower surface (the −Z side) in the vicinity of the +Y end of X stage STX, via a parallel plate spring 86 which is provided instead of riser (rising) block 85. Parallel plate spring 86 is configured by a pair of plate springs which are placed a predetermined distance apart in the Y-axis direction whose longitudinal direction is in the X-axis direction that is parallel to the XZ plane. Parallel plate spring 86 allows relative movement of stationary plate 66 and movable member 84 in fine strokes in the Y-axis direction. Therefore, even if parallelism decreases between base block 62a and base block 62b, load to guide device XG3 (configured by slider XGS3 and X-axis linear guide (rail) XGR3) which will be described later is reduced by the operation of parallel plate spring 86.

Further, to the upper surface of fixed member 63, a cover 87 is attached which allows distortion of parallel plate spring 86 that occurs on relative movement of stationary plate 66 and movable member 84 in fine strokes in the Y axis=direction as described above, and covers the opening of the upper surface. Similarly, to the upper surface of fixed member 63 on the X-axis drive unit XD1 side previously described, a cover 87 is attached which allows the movement of riser block 85 in the Y-axis direction that occurs due to distortion of parallel plate spring 86, and also covers the opening of the upper surface. By these covers 87, diffusion of heat generated by the coil units inside the pair of movers XD11 and XD21 that X-axis drive units XD2 and XD1 have outside of X-axis drive units XD2 and XD1 can be prevented.

In X-axis drive unit XD2, as shown in FIG. 24, only one guide device XG3 is provided, configured of one X-axis linear guide XGR3 and two sliders XGS3 that engage with X-axis linear guide XGR3 as in guide devices XG1 and XG2. In X-axis drive unit XD2, a linear encoder EX2 configured of a head EXh2 and a scale EXs2 is provided, as in linear encoder EX1 previously described. Linear encoder EX2 measures positional information in the X-axis direction of movable member 84 with respect to base block 62b. The measurement results are transmitted to main controller 50 (refer to FIG. 25).

Furthermore, X-axis drive units XD1 and XD2 each have a fan 70A and a fan 70B at the edge on the −X side and the edge on the +X side, as shown in FIG. 23. Fan 70A is an air-supply fan which takes in outside air (air) into the inner space (the space in between base block (62a or 62b) and the pair of fixed members 63) of the X-axis drive unit, and fan 70B is an air exhaust fan which exhausts the air that passes through the inner space of the X-axis drive unit outside. By these fans 70A and 70B, the coil units inside the pair of movers XD11 and XD21 provided in the inner space of each of the X-axis drive units XD1 and XD2 can be cooled efficiently.

In this case, load (and an inertia force which accompanies the movement of the load) of X stage STX and Y stage STY supported thereon and the like is applied to X-axis drive units XD1 and XD2. Further, in linear motors XDM1 and XDM2 included in X-axis drive units XD1 and XD2, a magnetic attractive force which is several times the drive force is generated between each of the movers and stators. In this case, the magnetic attractive force acting on the mover with respect to the stator acts as a floatation force (a force in a direction of anti-gravitational force) to movable member 84. X-axis drive units XD1 and XD2 substantially cancel out the load described above using the magnetic attractive force (floatation force), and support and drive X stage STX without a large load (and an inertia force) being applied to guide devices XG1 to XG3. Incidentally, the offset (balance) in X-axis drive unit XD1 (XD2) between the load such as the X stage STX and the magnetic attractive force (floatation force) from linear motors XDM1 and XDM2 will be described in detail later on.

On X stage STX, as shown in FIG. 23, Y stage STY is supported via a guide device YG which configures a part of Y-axis drive unit YD. Substrate P is held on Y stage STY.

As shown in FIG. 23, Y-axis drive unit YD includes linear motor YDM which generates a drive force in the Y-axis direction, guide device YG which limits the movement of Y stage STY in directions other than the Y-axis direction, and linear encoder EY (refer to FIG. 25) which measures the position of Y stage STY in the Y-axis direction with respect to X stage STX.

Linear motor YDM includes a mover YD1 and a stator YD2, as shown in FIG. 23. Stator YD2 is provided extending in the Y-axis direction, in the center of the X-axis direction on the upper surface of X stage STX. Mover YD1 is fixed in the center in the X-axis direction on the bottom surface of Y stage STY, facing stator YD2 and the Z-axis direction.

Guide device YG includes a pair of Y-axis linear guides (rails) YGR and four sliders YGS (partially not illustrated in FIG. 23). Each of the pair of Y linear guides YGR is provided extending in the Y-axis direction, parallel to each other in the vicinity of an edge on the −X side and the +X side on the upper surface of X stage STX. The four sliders YGS are each fixed in the vicinity of the four corners on the lower surface of Y stage STY. In this case, the four sliders YGS have an XZ sectional surface which is an inverted U-shape, and of the four sliders, two sliders YGS located on the −X side engage with Y-axis linear guide YGR on the −X side on X stage STX, and two sliders YGS located on the +X side engage (refer to FIG. 24) with Y-axis linear guide YGR on the +X side on X stage STX.

Linear encoder EY (refer to FIG. 25) is configured of a head and a scale. The scale (not illustrated) has a reflective diffraction grating whose periodic direction is in the Y-axis direction formed on its surface, and is provided extending parallel to the Y-axis linear guide YGR on X stage STX. The head (not illustrated) is provided on the lower surface (or on a side surface on the +Y side (or the −Y side)) of Y stage STY. The head faces the scale within the movement strokes in the Y axis direction of Y stage STY, and irradiates a measurement light on the scale, and by receiving the reflection diffraction light from the scale, measures positional information in the Y-axis direction of Y stage STY with respect to X stage STX. The measurement results are transmitted to main controller 50 (refer to FIG. 25).

The positional information (including yawing (rotation θz in the θz direction)) of substrate stage ST (Y stage STY) in the XY plane is constantly measured by encoder system 20 (refer to FIG. 25) configured of linear encoders EX1 and EX2 included in each of the X-axis drive units XD1 and XD2 described above, and linear encoder EY included in Y-axis drive unit YD.

Further, independently from encoder system 20, substrate interferometer system 92 measures the positional information (including θz) in the XY plane of Y stage STY (substrate stage ST) and information on the amount of inclination (pitching (rotational amount in the θx direction) and rolling (rotational amount in the θy direction)) with respect to the Z-axis, via a reflection surface (not illustrated) provided (or formed) in Y stage STY. Measurement results of substrate interferometer system 92 are supplied to main controller 50 (refer to FIG. 25).

Main controller 50 drives and controls substrate stage ST (Y stage STY and X stage STX) via substrate stage drive system PSD (refer to FIG. 25), or to be more precise, via linear motors XDM1, XDM2, and YDM that configure a part of X-axis drive units XD1, XD2, and Y-axis drive unit YD, respectively, based on the measurement results of encoder system 20 and/or substrate interferometer system 92.

FIG. 25 shows a block diagram showing an input/output relation of main controller 50, which centrally configures a control system of the exposure apparatus related to the fifth embodiment and has overall control over each part. Main controller 50 includes a workstation (or a microcomputer) and the like, and has overall control over each part of exposure apparatus.

Next, the balance in X-axis drive unit XD1 (XD2) between the load such as the X stage STX and the magnetic attractive force (floatation force) from linear motors XDM1 and XDM2 described above will be described. Incidentally, because the balance of the load and the floatation force described above is the same in X-axis drive unit XD1 and X-axis drive unit XD2, in the description below, X-axis drive unit XD1 will be described.

As shown in FIG. 26, in a state where X stage STX (refer to FIG. 24) is stationary, a load W which is half the gross weight of X stage STX, Y stage STY and the like acts downward (a direction shown by an outlined arrow) in a vertical direction on movable member 84 of X-axis drive unit XD1. At the same time, to movable member 84, a magnetic attractive force F1 which is generated between mover XD11 and stator XD12 configuring linear motor XDM1 acts in a direction forming an angle θ with respect to the Z-axis, and a magnetic attractive force F2 which is generated between mover XD21 and stator XD21 configuring linear motor XDM2 acts in a direction forming an angle −θ with respect to the Z-axis. Incidentally, for example, when Y stage STY is located in the center of its movable range, load W which is half the gross weight of X stage STX, acts approximately equally on movable member 84 of X-axis drive unit XD1 and X-axis drive unit XD2, or, to be more exact, the load in a direction downward of a vertical direction acting on movable member 84 varies according to the position of Y stage STY.

Now, supposing that magnetic attractive forces F1 and F2 generated in each of the linear motors XDM1 and XDM2 are equal (in other words, F1=F2=F) to each other. Then, a resultant force P=Fz1+Fz2 (=2F cos θ) of the vertical direction component of magnetic attractive forces F1 and F2 by linear motors XDM1 and XDM2 acts on movable member 84 in an upward vertical direction (a direction shown by a black arrow). Angle θ is set so that resultant force P becomes approximately equal with load W. Accordingly, a load (remaining force) |W−P| much smaller than load W will act on guide devices XG1 and XG2. Incidentally, in the horizontal direction (the Y-axis direction), because horizontal direction components Fy1 and Fy2 of magnetic attractive forces F1 and F2 are cancelled out, the resultant force does not act (a null resultant force acts) on movable member 84. Incidentally, because relative movement of fixed member 63 and movable member 84 is restricted in the Z-axis direction (the +Z direction, and the −Z direction) by guide devices XG1 and XG2, the relation between resultant force P and load W described above can be P<W, or P>W.

In X-axis drive unit XD1 (XD2) described above, by appropriately setting the inclination (angle of inclination θ) of the side surfaces of movable member 84 and fixed member 63 that face each other according to the load capacity of guide devices XG1 and XG2, load W acting in the vertical direction can be cancelled without providing a force in the horizontal direction to movable member 84, using magnetic attractive forces F1 and F2 of linear motors XDM1 and XDM2.

Meanwhile, a magnetic attractive force (−F1) generated by linear motor XDM1 in a e direction with respect to the Z-axis acts on fixed member 63 fixed to the −Y side of base block 62a. This attractive force provides a shear force and a bending moment to fixed member 63. Similarly, a magnetic attractive force (−F2) generated by linear motor XDM2 in a −θ direction with respect to the Z-axis acts on fixed member 63 fixed to the +Y side of base block 62a. This attractive force provides a shear force and a bending moment to fixed member 63. Accordingly, both fixed members 63 bend inwardly to the fixed end with base block 62a, and as a result, the size of a gap between the side surfaces of fixed member 63 and movable member 84 that face each other can vary.

The variation of the size of the gap due to the bending of fixed member 63 can be suppressed by optimizing the thickness (the width in the Y-axis direction) of fixed member 63.

For example, in the case the drive force (thrust) of X stage STX is small and load W with respect to magnetic attractive forces F1 and F2 (to be precise, a vertically upward resultant force P=2F cos θ) is large (W>P), angle of inclination θ is to be se small. This increases resultant force P, namely the floating force applied to movable member 84, which reduces the load (remaining force) |W−P| acting on guide devices XG1 and XG2. In this case, because the magnetic attractive force is small, the shear force and bending moment acting on fixed member 63 also become small. Therefore, the thickness of fixed member 63 can be set small.

On the contrary, in the case the drive force (thrust) of X stage STX is large and load W with respect to magnetic attractive forces F1 and F2 (a vertically upward resultant force P=2F cos θ) is small (W<P), angle of inclination θ is to be set large. This balances resultant force P and load W. In this case, because the magnetic attractive force is large with respect to a large angle of inclination θ, the shear force and bending moment acting on fixed member 63 become large. Therefore, the thickness of fixed member 63 needs to be set large.

Figure 27:
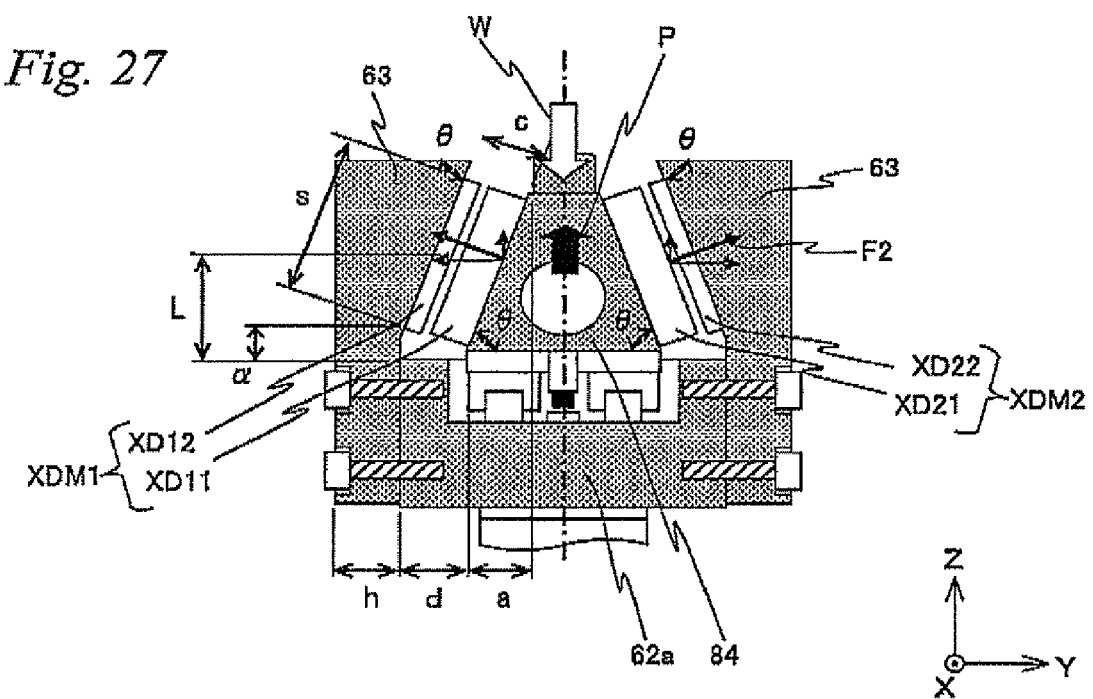
FIG. 27 is a view used to explain a balance of forces acting on each part of the single axis drive unit.
Figure 28:
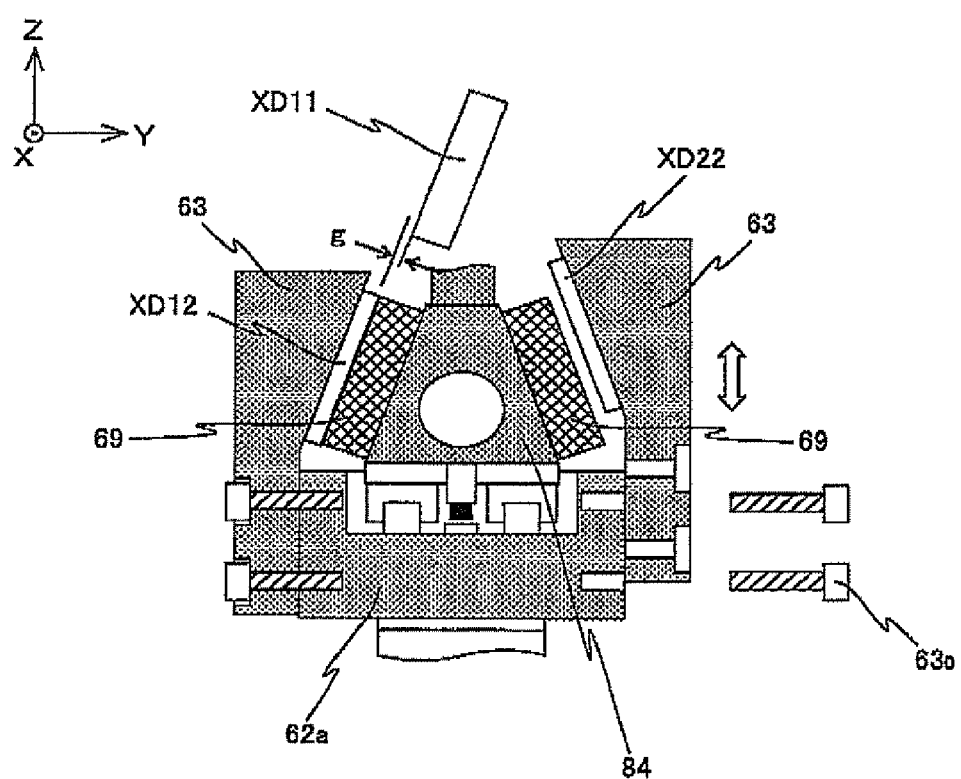
FIG. 28 is a view used to explain an assembling method of the single axis drive unit.

Next, the way to obtain the thickness (the width in the Y-axis direction) h of fixed member 63 will be described, referring to FIG. 27. As shown in FIG. 27, width of movers XD11 and XD21 and stators XD12 and XD22 will be expressed as s (projection length in the Y-axis direction a=s cos θ), the size of the gap between the side surfaces of fixed member 63 and movable member 84 that face each other will be expressed as c (projection length in the Y-axis direction d=c sin θ), length in the X-axis direction of fixed member 63 will be expressed as b, and height (the distance in the Z-axis direction) from the fixed end of fixed member 63 to the center (the center of stators XD12 and XD22) of the inner side surface will be expressed as L=(s/2) sin θ+α. However, a is an allowance dimension. Further, the magnetic attractive force is F1=F2=F, namely the floating force acting on movable member 84 is assumed to be P=2 (F cos θ). When Young's modulus (modulus of longitudinal elasticity) and flexure of fixed member 63 are expressed as E and w, respectively, thickness h of fixed member 63 can be obtained as in the following formula (1), using a relation expression of flexure in the case a normal-force acts on the tip of a simple cantilever.

$$h = \sqrt[3]{\frac{4F \cdot \sin\theta L^3}{w \cdot E \cdot b}} \quad (1)$$

Incidentally, in order to reduce the size of X-axis drive unit XD1 (more particularly, to shorten the width dimension in the Y-axis direction of X-axis drive unit XD1), the angle of inclination e should be set so that a+d+h becomes small.

However, as is previously described, in between fixed member 63 and movable member 84, guide devices XG1 and XG2 are provided so as to suppress a straightness error (a Y translation error and a Z translation error) and a rotation/tilt error of movable member 84, and a reaction force and the like that accompanies the movement of Y stage STY. Accordingly, load W which is applied to movable member 84 does not have to be completely cancelled out only by flotation force P from linear motors XDM1 and XDM2.

For example, relation between θ, a, d, h, a+d+h, and flotation force P (=2F cos θ) when s=100 mm, b=500 mm, c=50 mm, E=16000 kgf/mm2, α=100 mm, F=2000 kgf, w=0.1 mm, and W=800 kgf can be obtained as is described in table 1 below.

TABLE 1

| θ (degree) | a (mm) | d (mm) | h (mm) | a + d + h (mm) | 2Fcosθ (kgf) |
|---|---|---|---|---|---|
| 10 | 98.5 | 8.7 | 13.1 | 120.3 | 3939.2 |
| 20 | 94.0 | 17.1 | 17.6 | 128.7 | 3758.8 |
| 30 | 86.6 | 25.0 | 21.4 | 133.0 | 3464.1 |
| 40 | 76.6 | 32.1 | 24.6 | 133.3 | 3064.2 |
| 50 | 64.3 | 38.3 | 27.3 | 129.9 | 2571.2 |
| 60 | 50.0 | 43.3 | 29.4 | 122.7 | 2000.0 |
| 70 | 34.2 | 47.0 | 31.0 | 112.2 | 1368.1 |
| 80 | 17.4 | 49.2 | 32.0 | 98.6 | 694.6 |
| 85 | 8.7 | 49.8 | 32.2 | 90.7 | 348.6 |
| 88 | 3.5 | 50.0 | 32.3 | 85.8 | 139.6 |

From table 1 above, angle θ should be set to θ=70-85 degrees. To load W=800 kgf, flotation force P=1368.1 to 348.6 kgf, or in other words, the remaining force acting on guide devices XG1 and XG2 is −568.1 to +451.4 kgf, which can substantially cancel off load W. Further, because the remaining force can be adjusted extremely small, the size of guide devices XG1 and XG2 can be reduced. This reduces the frictional resistance between the X-axis linear guides and the sliders that configure guide devices XG1 and XG2. In other words, the thrust required to drive movable member 84 (X stage STX) becomes small, which allows, for example, movable member 84 to be moved manually, and the working efficiency such as the maintenance of X stage STX can also be improved. Further, by setting the angle of inclination e large, the size of fixed member 63, namely X-axis drive unit XD1, can be reduced.

Further, in X-axis drive units XD1 and XD2 that have the configuration described above, the gap between movers XD11 and XD21 and stators XD12 and XD22 can be adjusted easily, without using adjustment plates such as spacers and the like. An adjustment procedure is described below, based on FIG. 28. Firstly, in the adjustment, the worker fixes movable member 84 to base block 62a using a suitable fixture. Next, the worker attaches a non-magnetic material block 69 which has a thickness larger by a suitable gap amount g than movers XD11 and XD21 to both of the side surfaces of movable member 84. Next, the worker fixes fixed member 63 to base block 62a using a fixture (bolt) $63_0$, in a state where stators XD12 and XD22 fixed to the inner side surface of fixed member 63 are in contact with non-magnetic material block 69. In this case, because the fixed surface (a surface parallel to the XZ plane) is not parallel to the inner side surface (the surface tilted by an angle of ±θ with respect to the Z-axis) of fixed member 63, by adjusting the fixed position (height) by sliding fixed member 63 in the vertical direction shown by an outlined arrow in FIG. 28, the size of the gap can be adjusted. In this case, to make such an adjustment possible, in fixed member 63, an elongated slot is formed whose XZ section is longer in the Z-axis direction than a circle in which fixture (bolt) $63_0$ can slide vertically.

Subsequently, the worker similarly fixes all fixed members 63 (except for fixed members 63 closest to the +X edge and the −X edge) to base block 62a, while changing the X position of movable member 84. Finally, after the worker has exchanged non-magnetic material block 69 to movers XD11 and XD21 in a state where movable member 84 is withdrawn to the +X edge (or −X edge), fixed members 63 on the ±X ends are fixed to base block 62*a*.

This allows stator XD12 and XD22 to be fixed strongly in a wide range on the inner side surface of fixed member 63, and also allows the gap formed with movers XD11 and XD21 to be adjusted easily. Further, because the processing accuracy in the structure of X-axis drive units XD1 and XD2 becomes low, the arrangement is economical. As a result, it becomes possible to configure substrate stage device PSTe having a high drive accuracy at a relatively low cost. Further, because stators XD12 and XD22 (magnet units) are fixed to the inner side (the inner side surface of fixed member 63) of X-axis drive units XD1 and XD2, the stators are not drawn even if a magnetic body nears the outer surface of fixed member 63.

In the exposure apparatus related to the fifth embodiment that is configured in the manner described above, although a detailed description will be omitted, lot processing is performed in a procedure similar to the exposure apparatus 10 related to the first embodiment previously described.

As described above, according to the exposure apparatus related to the fifth embodiment, by using a resultant force P of an drawing force Fz1 acting between the first mover XD11 and the first stator XD12 equipped in the pair of X-axis drive units XD1 and XD2 that drive substrate stage ST (X stage STX) in the X-axis direction, and a perpendicular component of force Fz2 acting between the second mover XD21 and the second stator XD22 as a levitation force, the load acting on base blocks 62*a* and 62*b* including the self-weight of the substrate stage can be reduced, and drive control of substrate stage ST (X stage STX) with high precision becomes possible, without disturbing the drive performance.

Further, according to the exposure apparatus related to the fifth embodiment, because substrate stage ST (to be more precise, X stage STX which holds substrate P via Y stage STY) holding substrate P can be driven with high precision at the time of scanning exposure of substrate P, exposure with high precision of substrate P becomes possible.

Incidentally, in the fifth embodiment described above, while X-axis drive unit XD1 (XD2) was configured, using movable member 84 whose sectional plane is an isosceles trapezoidal shape, instead of this, it is possible to configure X-axis drive unit XD1 (XD2), using movable member 84 that has a sectional plane which is not an isosceles trapezoidal shape, as in the first and the second modified examples described below.

Figure 29:
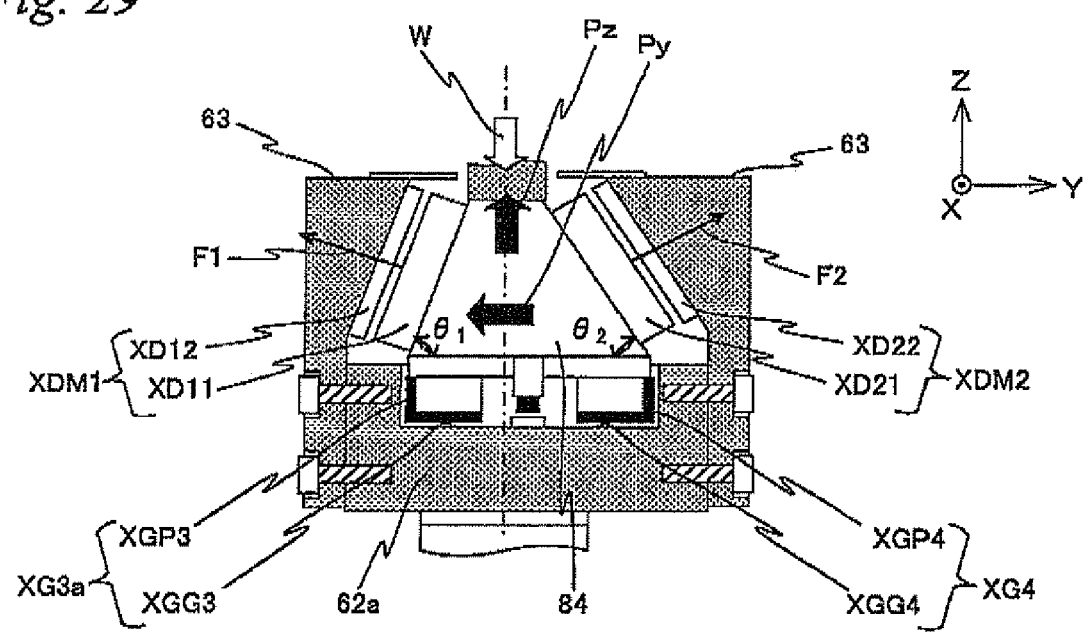
FIG. 29 is a view showing a modified example (No. 1) of the single axis drive unit.

FIG. 29 shows a configuration of an X-axis drive unit XD1 (XD2) related to a first modified example (however, as for base block 62*a*, fixed member, and movable member 84, the same reference numerals are used as in the fifth embodiment described above for the sake of convenience). In the configuration in FIG. 29, the angle of inclination of the ±Y side surfaces of movable member 84 differ from each other (θ1>θ2). Therefore, horizontal components of magnetic attractive forces F1 and F2 of linear motors XDM1 and XDM2 are not canceled, and a resultant force Py in the −Y direction acts on movable member 84.

In the configuration of X-axis drive unit XD1 (XD2) in FIG. 29, a thrust type static gas bearing devices XG3*a* and XG4 are used as the guide device. On the inner bottom surface and both of the side surfaces of the groove in base block 62*a*, guide surfaces XGG3 and XGG4 with high flatness are formed (guide surfaces XGG3 and XGG4 each have two guide surfaces which are the bottom surface orthogonal to the side surface of the groove). To the bottom surface of movable member 84, air pads XGP3 and XGP4 are attached which are a plurality of static gas bearings that have bearing surfaces facing guide surfaces XGG3 and XGG4, respectively. Air pad XGP3 and XGP4 blow out high pressure air into a slight gap (bearing gap) between the bearing surfaces and guide surfaces XGG3 and XGG4, via a stop (a compensating element). In this case, air pads XGP3 and XGP4 each have two functions of an air pad, which are limiting the pitching movement and yawing movement of movable member 84.

In thrust type static gas bearing devices XG3*a* and XG4, by applying an external force to movable member 84 by pushing the bearing surface of air pads XGP3 and XGP4 against guide surfaces XGG3 and XGG4, the rigidity of an air film (air pad) within the gap can be increased. Accordingly, by appropriately setting the angle of inclination $\theta_1$ and $\theta_2$ of the ±Y side surfaces of movable member 84, adjusting a resultant force Pz of a vertical direction component and a resultant force Py of a horizontal direction component of magnetic attractive forces F1 and F2 of linear motors XDM1 and XDM2, and adjusting the load in the vertical direction and the load in the horizontal direction that are applied to air pads XGP3 and XGP4, the rigidity of each air pad can be optionally adjusted.

Further, by adjusting resultant force Py appropriately setting the angle of inclination θ1 and θ2 of the ±Y side surfaces of movable member 84, and adjusting the load in the horizontal direction that are applied to air pads XGP3 and XGP4, the rigidity of one of the air pads of air pads XGP3 and XGP4 can be made higher than the other air pad. This allows movable member 84 to move along one of the guide surfaces. Accordingly, in the case the parallelism of guide surfaces XGG3 and XGG4 formed by both of the side surfaces of the groove is poor, movable member 84 can be made to move along the guide surface where the air pad that has high rigidity faces. Further, in the case the straightness of one of the guide surfaces XGG3 and XGG4 formed by both of the side surfaces of the groove is poor, by increasing the rigidity of the air pad facing the other guide surface of the guide surfaces XGG3 and XGG4, movable member 84 can be made to move along the guide surface whose straightness is good facing the air pad with high rigidity.

Figure 30:
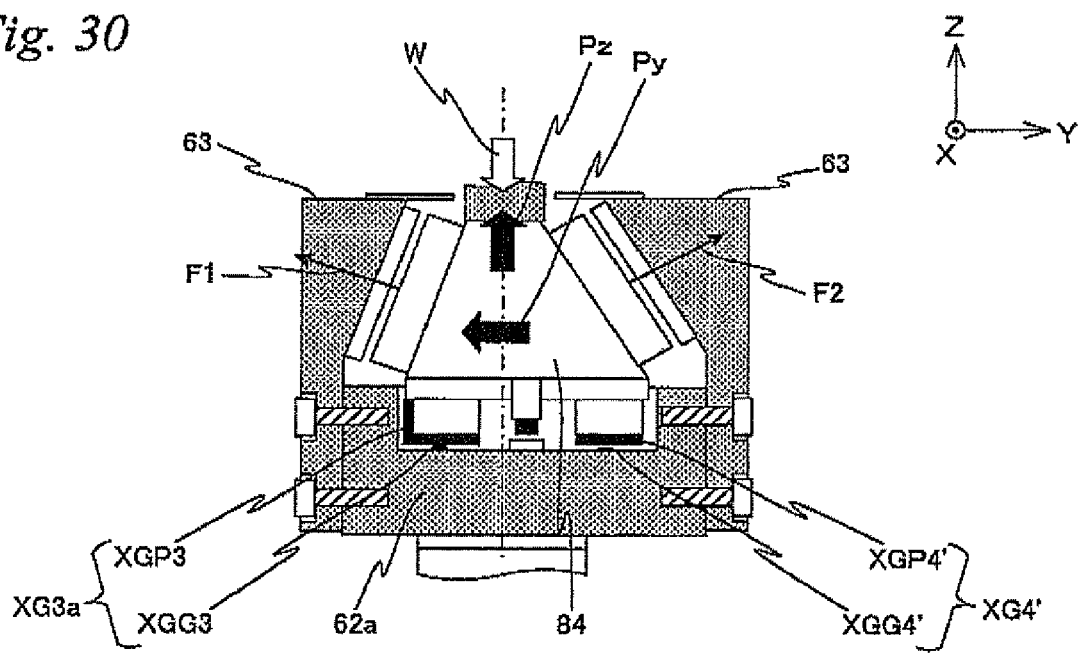
FIG. 30 is a view showing a modified example (No. 2) of the single axis drive unit.

FIG. 30 shows a configuration of an X-axis drive unit XD1 (XD2) of a second modified example (however, as for base block 62*a*, fixed member, and movable member 84, the same reference numerals are used as in the fifth embodiment described above for the sake of convenience). In the configuration in FIG. 30, while guide surface XGG3 previously described is formed at the −Y side of the groove on the bottom surface and the side surface, at the +Y side of the groove, a guide surface XGG4' is formed only on the bottom surface. And, air pads XGP3 and XGP4' that have bearing surfaces that face these guide surfaces XGG3 and XGG4', respectively, are attached to the bottom surface of movable member 84. In this case as well, movable member 84 can be moved along guide surface XGG3 to which air pad XGP3 faces, as in the first modified example described above.

Incidentally, because it is difficult in general to form guide surfaces that have high flatness on both side surfaces of the groove of base block 62*a*, a guide surface can be provided on both side surfaces of the groove with base block 62*a* being configured using a plurality of dividing members.

Incidentally, in the fifth embodiment described above, the case has been described where a magnetic attractive force acts between stators (XD11, XD21) and movers (XD12, XD22) in each of the linear motors XDM1 and XDM2 equipped in the two X-axis drive units XD1 and XDM2, and the vertical direction component of the attractive force is in a direction pulling up the mover from the stator side. However, as well as this, for example, a configuration can be employed where the position of the stators (XD11, XD21) and the movers (XD12, XD22) in each of the linear motors XDM1 and XDM2 in the fifth embodiment is switched. In this case, at the time when X stage STX is driven in the X-axis direction, a magnetic repulsive force (repulsion) should act between the stator (XD11, XD21) and the mover (XD12, XD22), and the vertical direction component of the repulsive force (repulsion) should be in a direction where mover is pushed up from the stator side. Even in such a case, the resultant force of the vertical direction component of the force acting in between the stator (XD11, XD21) and the mover (XD12, XD22) can be utilized as a levitation force, and an equal effect as in the fifth embodiment can be obtained. Besides this, in addition to or instead of the magnetic force between the stator (XD11, XD21) and the mover (XD12, XD22), other attractive forces (e.g., vacuum suction force) or a repulsive force (e.g., static pressure of gas) may at least work at the time when X stage STX is driven in the X-axis direction. Even in such a case, the vertical direction component of the suction force or the repulsion can be utilized as a levitation force.

Incidentally, in the fifth embodiment described above, while substrate P was mounted on Y stage STY, as in the stage device which is disclosed in, for example, U.S. Patent Application Publication No. 2010/0018950, a fine movement stage which is driven in directions of six degrees of freedom with respect to Y stage STY can be provided, and substrate P can be mounted on the fine movement stage. In this case, a weight cancellation device, as disclosed in U.S. Patent Application Publication No. 2010/0018950 described above, can be provided and can support the fine movement stage described above from below.

Incidentally, in the exposure apparatus related to each of the embodiments described above, the illumination light can be ultraviolet light, such as ArF excimer laser light (with a wavelength of 193 nm) and KrF excimer laser light (with a wavelength of 248 nm), or vacuum ultraviolet light such as $F_2$ laser light (with a wavelength of 157 nm). Further, as the illumination light, a harmonic wave, which is obtained by amplifying a single-wavelength laser light in the infrared or visible range emitted by a DFB semiconductor laser or fiber laser with a fiber amplifier doped with, for example, erbium (or both erbium and ytterbium), and by converting the wavelength into ultraviolet light using a nonlinear optical crystal, can also be used. Further, solid state laser (with a wavelength of 355 nm, 266 nm) or the like can also be used.

Further, while, in each of the embodiments described above, the case has been described where projection optical system PL is the projection optical system by a multi-lens method that is equipped with a plurality of projection optical units, the number of the projection optical units is not limited thereto, but there should be one or more projection optical units. Further, the projection optical system is not limited to the projection optical system by a multi-lens method, but can be a projection optical system using, for example, a large mirror of the Offner type, or the like.

Further, in the exposure apparatus related to each of the embodiments described above, the projection optical system is not limited to an equal magnifying system, and can also be a reduction system or a magnifying system, and can also be a catadioptric system, a catoptric system, or a dioptric system. Further, the projected image may be either an inverted image or an upright image.

Incidentally, in the embodiment described above, alight transmissive type mask is used, which is obtained by form-ing a predetermined light-shielding pattern (or a phase pattern or a light-attenuation pattern) on a light transmissive mask substrate. Instead of this mask, however, as disclosed in, for example, U.S. Pat. No. 6,778,257, an electron mask (a variable shaped mask) on which a light-transmitting pattern, a reflection pattern, or an emission pattern is formed according to electronic data of the pattern that is to be exposed, for example, a variable shaped mask that uses a DMD (Digital Micromirror Device) that is a type of a non-emission type image display element (which is also called a spatial light modulator) can also be used.

Incidentally, it is particularly effective to apply the exposure apparatus related to each of the embodiments described above to an exposure apparatus which exposes a substrate whose size (including at least one of the external diameter, diagonal line, and one side) is 500 mm or more, such as, for example, a large substrate of a flat panel display (FPD) such as the liquid crystal display and the like.

Further, each of the embodiments described above can also be applied to an exposure apparatus by a step-and-stitch method. Further, especially the fifth embodiment described above can be applied, for example, to a static type exposure apparatus.

Further, the application of the exposure apparatus is not limited to the exposure apparatus for liquid crystal display elements in which a liquid crystal display element pattern is transferred onto a rectangular glass plate, but each of the embodiments above can also be widely applied, for example, to an exposure apparatus for manufacturing semiconductors, and an exposure apparatus for producing thin-film magnetic heads, micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or a reticle used in a light exposure apparatus, an EUV exposure apparatus, an X-ray exposure apparatus, an electron-beam exposure apparatus, and the like. Incidentally, an object that is subject to exposure is not limited to a glass plate, but for example, can be another object such as a wafer, a ceramic substrate, a film member or a mask blank. Further, in the case where an exposure subject is a substrate for flat-panel display, the thickness of the substrate is not limited in particular, and for example, a film like member (a sheet like member having flexibility) is also included.

Incidentally, the above disclosures of all the publications, the PCT International Publications descriptions, and the U.S. Patent Application Publications descriptions, and the U.S. Patents descriptions that are cited in the description above and related to exposure apparatuses and the like are each incorporated herein by reference.

Device Manufacturing Method

A manufacturing method of a microdevice that uses the exposure apparatus related to each of the embodiments above in a lithography process is described next. In the exposure apparatus concerning each embodiment described above, liquid crystal display as the micro device can be obtained by forming a predetermined pattern (a circuit pattern, an electrode pattern) on a plate (a glass substrate).

Pattern Forming Process

First of all, a so-called optical lithography process in which a pattern image is formed on a photosensitive substrate (such as a glass substrate coated with a resist) is executed using the exposure apparatus related to each of the embodiments described above. In this optical lithography process, a predetermined pattern that includes many electrodes and the like is formed on the photosensitive substrate. After that, the exposed substrate undergoes the respective processes such as a development process, an etching process and a resist removing process, and thereby the predetermined pattern is formed on the substrate.

Color Filter Forming Process

Next, a color filter in which many sets of three dots corresponding to R (Red), G (Green) and B (blue) are disposed in a matrix shape, or a color filter in which a plurality of sets of filters of three stripes of R, G and B are disposed in horizontal scanning line directions is formed.

Cell Assembling Process

Next, a liquid crystal panel (a liquid crystal cell) is assembled using the substrate having the predetermined pattern obtained in the pattern forming process, the color filter obtained in the color filter forming process, and the like. For example, a liquid crystal panel (a liquid crystal cell) is manufacture by injecting liquid crystal between the substrate having the predetermined pattern obtained in the pattern forming process and the color filter obtained in the color filter forming process.

Module Assembling Process

After that, a liquid crystal display element is completed by attaching respective components such as an electric circuit that causes a display operation of the assembled liquid crystal panel (liquid crystal cell) to be performed, and a backlight. In this case, since exposure of the substrate is performed with high throughput and high precision using the exposure apparatus related to each of the embodiments described above in the pattern forming process, the productivity of liquid crystal display elements can be improved as a consequence.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that performs scanning exposure of an object while moving the object with respect to an energy beam, the apparatus comprising:
   a holding section that holds the object;
   a first support section that supports the holding section in a state of being fixed to the holding section;
   a second support section that supports the first support section in a noncontact manner;
   a first base that supports the second support section;
   a drive section that relatively moves the first support section with respect to the second support section in a state where the first support section supports the holding section from below; and
   a second base that is disposed spaced apart from the first base and supports the drive section.

2. The exposure apparatus according to claim 1, wherein the first support section supports the holding section to be tiltable.

3. The exposure apparatus according to claim 1, wherein the drive section has a first drive system to relatively move the first support section with respect to the second support section in a first direction, and a second drive system to move the first support section in a second direction intersecting the first direction, and the second drive system supports the first drive system.

4. The exposure apparatus according to claim 3, wherein the drive section is provided on both sides of the second support section in the second direction.

5. The exposure apparatus according to claim 1, wherein the first base has a first support member and a second support member that respectively support different parts of the second support section in a first direction in which the object is moved in the scanning exposure.

6. The exposure apparatus according to claim 5, wherein the second base has a third support member provided between the first support member and the second support member in the first direction, the third support member supporting the drive section.

7. The exposure apparatus according to claim 1, further comprising
   a drive device that is provided between the drive section and the holding section, and relatively moves the holding section with respect to the first base.

8. The exposure apparatus according to claim 1, wherein the object is a substrate used for flat-panel display.

9. The exposure apparatus according to claim 8, wherein at least a length of one side or a diagonal line of the substrate is 500 mm or more.

10. A flat-panel display manufacturing method comprising:
    exposing the object with the exposure apparatus according to claim 8; and
    developing the object that has been exposed.

11. A device manufacturing method comprising:
    exposing the object with the exposure apparatus according to claim 1; and
    developing the object that has been exposed.

12. An exposure method of performing scanning exposure of an object while moving the object with respect to an energy beam, the method comprising:
    supporting a holding section that holds the object, with a first support section fixed to the holding section;
    supporting the first support section in a noncontact manner, with a second support section supported by a first base; and
    relatively moving the first support section with respect to the second support section, with a drive section supported by a second base that is disposed spaced apart from the first base.

13. The exposure method according to claim 12, wherein in the supporting the holding section, the holding section is tiltably supported by the first support section.

14. The exposure method according to claim 13, further comprising
    supporting a first drive system with a second drive system, the first drive system relatively moving the first support section with respect to the second support section in a first direction, the second drive system moving the first support section in a second direction intersecting the first direction.

15. The exposure method according to claim 14, further comprising
    disposing the second drive system on both sides of the second support section in the second direction.

16. The exposure method according to claim 12, wherein different parts of the second support section in a first direction are supported by a first support member and a second support member, respectively, the first base having the first support member and the second support member, the object being moved in the first direction in the scanning exposure.

17. The exposure method according to claim 16, further comprising
supporting the drive section, with a third support member provided between the first support member and the second support member in the first direction, the second base having the third support member.

18. The exposure method according to claim 12, wherein the object is a substrate used for flat-panel display.

19. The exposure method according to claim 18, wherein at least a length of one side or a diagonal line of the substrate is 500 mm or more.

\* \* \* \* \*